United States Patent
Inoue et al.

(10) Patent No.: US 9,312,498 B2
(45) Date of Patent: Apr. 12, 2016

(54) ORGANIC COMPOUND, LIGHT-EMITTING ELEMENT, DISPLAY MODULE, LIGHTING MODULE, LIGHT-EMITTING DEVICE, DISPLAY DEVICE, ELECTRONIC APPLIANCE, AND LIGHTING DEVICE

(71) Applicant: Semiconductor Energy Laboratory Co., Ltd., Kanagawa-ken (JP)

(72) Inventors: Hideko Inoue, Kanagawa (JP); Hiroki Suzuki, Kanagawa (JP); Hiromi Seo, Kanagawa (JP); Tatsuyoshi Takahashi, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/483,743

(22) Filed: Sep. 11, 2014

(65) Prior Publication Data

US 2015/0073147 A1    Mar. 12, 2015

(30) Foreign Application Priority Data

Sep. 12, 2013 (JP) .................. 2013-189491

(51) Int. Cl.
*H01L 51/00* (2006.01)
*H01L 51/50* (2006.01)

(52) U.S. Cl.
CPC ........ *H01L 51/0072* (2013.01); *H01L 51/0074* (2013.01); *H01L 51/5016* (2013.01)

(58) Field of Classification Search
CPC .. H01L 51/00; H01L 51/0072; H01L 51/0074
See application file for complete search history.

(56) References Cited

U.S. PATENT DOCUMENTS

| | | |
|---|---|---|
| 2011/0210316 A1 | 9/2011 | Kadoma et al. |
| 2012/0193613 A1 | 8/2012 | Kadoma et al. |
| 2012/0197020 A1 | 8/2012 | Osaka et al. |
| 2013/0060033 A1 | 3/2013 | Seo et al. |
| 2013/0082591 A1 | 4/2013 | Seo et al. |
| 2013/0112954 A1 | 5/2013 | Osaka et al. |

FOREIGN PATENT DOCUMENTS

| | | |
|---|---|---|
| JP | 2013-60459 | 4/2013 |
| JP | 2013-69905 | 4/2013 |
| JP | 2013-110262 | 6/2013 |
| KR | 10-2012-0129733 | 11/2012 |

*Primary Examiner* — Noble Jarrell
*Assistant Examiner* — John S Kenyon
(74) *Attorney, Agent, or Firm* — Husch Blackwell LLP

(57) ABSTRACT

A novel organic compound is provided. In addition, a novel organic compound with high heat resistance is provided. In the organic compound, a dibenzoquinoxaline skeleton and a 4,4-bidibenzofuran skeleton or a 4,4'-bidibezothiophene skeleton are connected to each other through an arylene group.

21 Claims, 35 Drawing Sheets

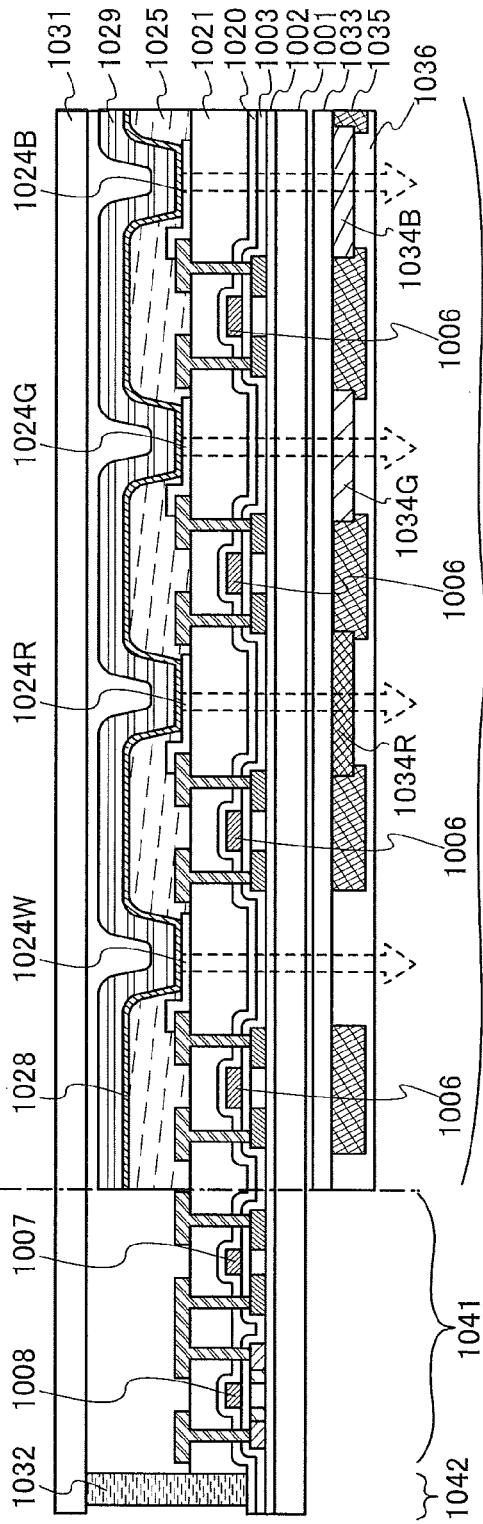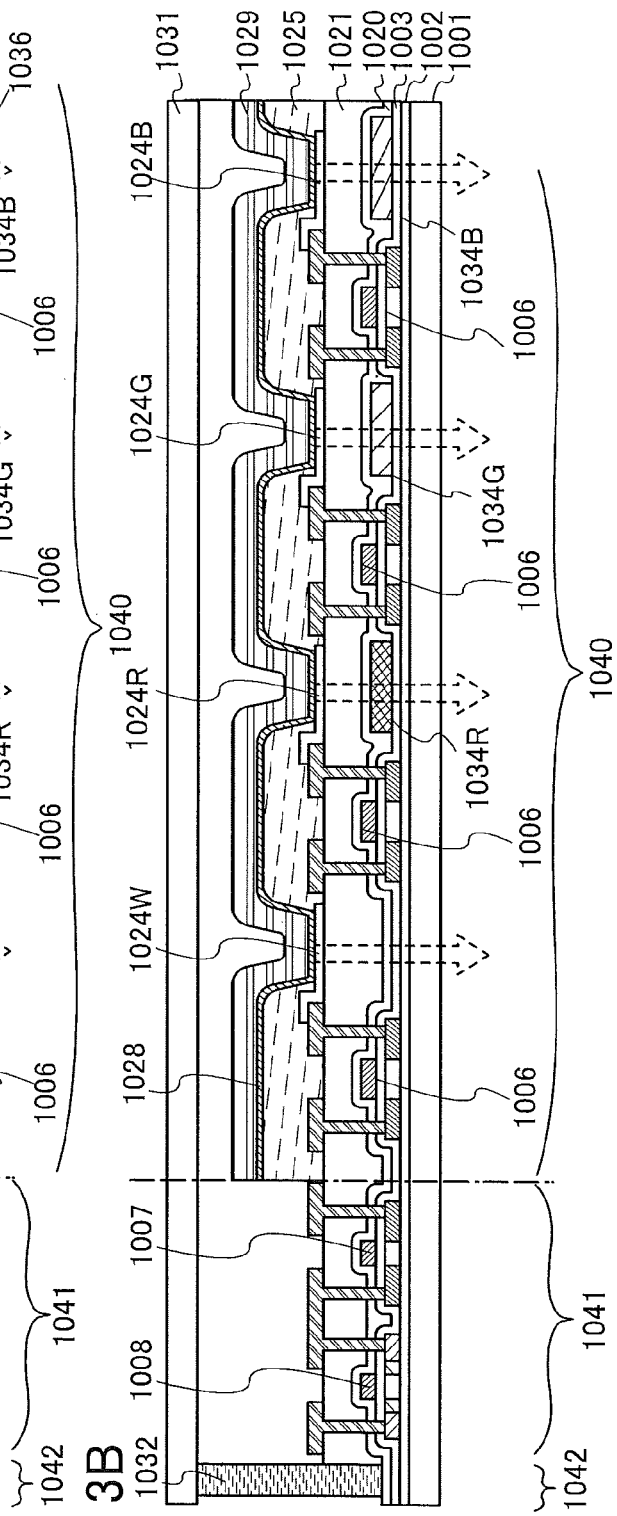

FIG. 7A
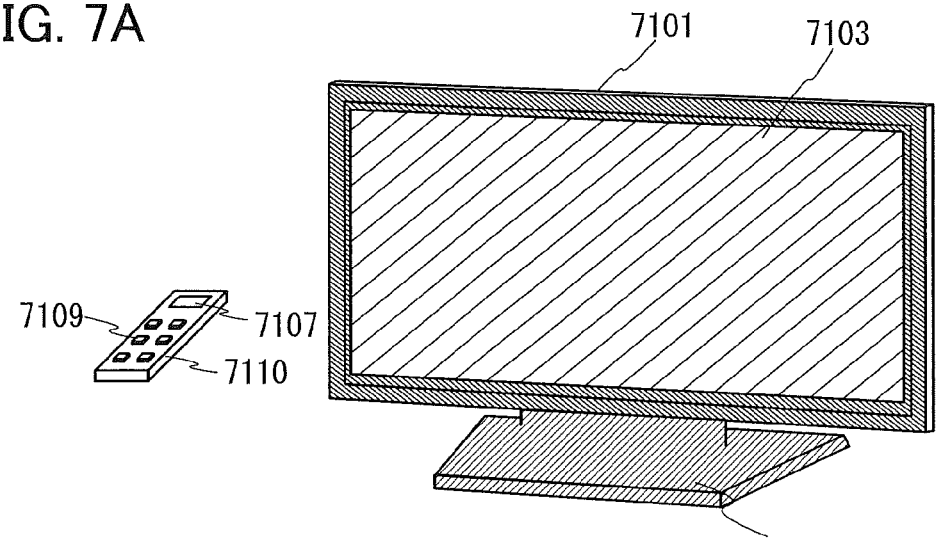
FIG. 7B1
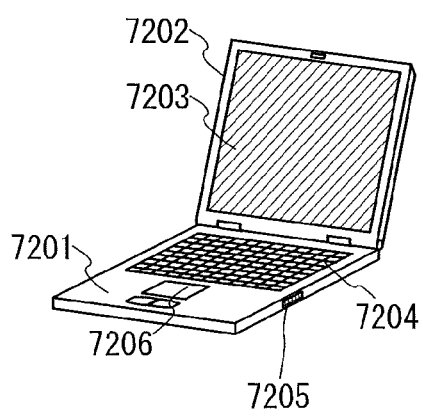
FIG. 7B2
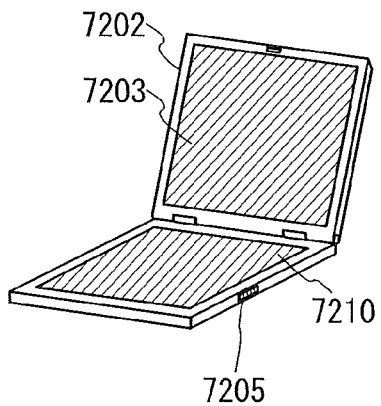
FIG. 7C
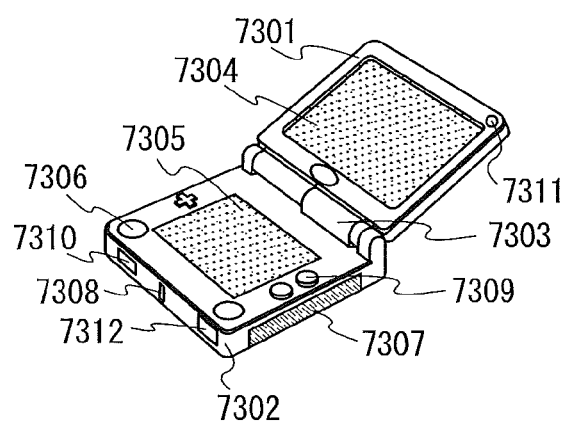
FIG. 7D
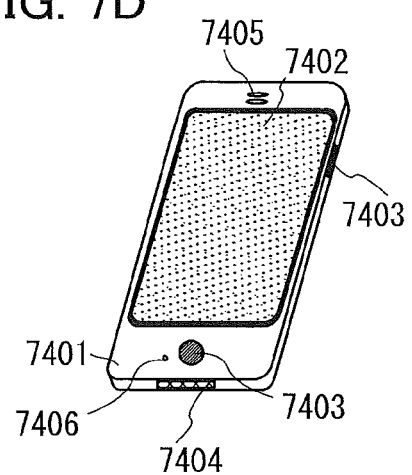

ORGANIC COMPOUND, LIGHT-EMITTING ELEMENT, DISPLAY MODULE, LIGHTING MODULE, LIGHT-EMITTING DEVICE, DISPLAY DEVICE, ELECTRONIC APPLIANCE, AND LIGHTING DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a driving method thereof, and a manufacturing method thereof. In particular, one embodiment of the present invention relates to an organic compound, and a light-emitting element, a display module, a lighting module, a display device, a light-emitting device, an electronic appliance, and a lighting device in each of which the organic compound is used.

2. Description of the Related Art

In recent years, research and development of a light-emitting element (organic EL element) that uses an organic compound and utilizes electroluminescence (EL) have been actively promoted. In a basic structure of such a light-emitting element, an organic compound layer containing a light-emitting substance (an EL layer) is interposed between a pair of electrodes. By applying voltage to the element, light can be emitted from the light-emitting substance.

The light-emitting element is a self-luminous element and thus has advantages over liquid crystal displays, such as high visibility and no need for backlight when used as a pixel of a display, and is suitable as a flat panel display element. In addition, it is also a great advantage that a display including the light-emitting element can be fabricated as a thin and lightweight display and has very fast response speed.

In such a light-emitting element, light-emitting layers can be successively formed two-dimensionally, so that planar light emission can be obtained. Thus, a large-area light source can be easily formed. This feature is difficult to obtain with point light sources typified by incandescent lamps and LEDs or linear light sources typified by fluorescent lamps. Thus, the light-emitting element also has great potential as a planar light source which can be applied to a lighting device and the like.

Although displays or lighting devices including light-emitting elements can be suitably used for a variety of electronic appliances as described above, their performance and cost competitiveness have plenty of room to improve. In order to achieve this, materials that have good characteristics and are easily handled are required.

Patent Document 1 discloses a substance that has excellent characteristics as a host material of a phosphorescent element.

REFERENCE

Patent Document 1: Japanese Published Patent Application No. 2013-060459

SUMMARY OF THE INVENTION

An object of one embodiment of the present invention is to provide a novel organic compound. Another object of one embodiment of the present invention is to provide a novel organic compound with high heat resistance.

Another object of one embodiment of the present invention is to provide an organic compound with which a light-emitting element with good characteristics can be fabricated, particularly, an organic compound with which a light-emitting element with high heat resistance can be fabricated. Another object of one embodiment of the present invention is to provide a novel organic compound with which a light-emitting element with high heat resistance and other good characteristics can be fabricated. Another object of one embodiment of the present invention is to provide an organic compound with which a cost-effective light-emitting element can be fabricated.

Another object of one embodiment of the present invention is to provide a light-emitting element, a display module, a lighting module, a light-emitting device, a display device, an electronic appliance, and a lighting device that have excellent heat resistance with the use of any of the above-described organic compounds.

Another object of one embodiment of the present invention is to provide, without losing advantages of a light-emitting element such as thinness, lightness, and low power consumption, a light-emitting element, a display module, a lighting module, a light-emitting device, a display device, an electronic appliance, and a lighting device that have excellent heat resistance with the use of any of the above-described organic compounds.

It is only necessary that at least one of the above-described objects be achieved in the present invention.

One embodiment of the present invention provides an organic compound in which a dibenzoquinoxaline skeleton and a 4,4'-bidibenzofuran skeleton or a 4,4'-bidibenzothiophene skeleton are bonded to each other through an arylene group.

That is, one embodiment of the present invention is an organic compound represented by General Formula (G1).

(G1)

In General Formula (G1), A represents a substituted or unsubstituted dibenzoquinoxaline skeleton, B represents a substituted or unsubstituted 4,4'-bidibenzofuran skeleton or 4,4'-bidibenzothiophene skeleton, Ar represents an arylene group having 6 to 13 carbon atoms, and n is an integer of 0 to 2.

Another embodiment of the present invention is an organic compound represented by General Formula (G2).

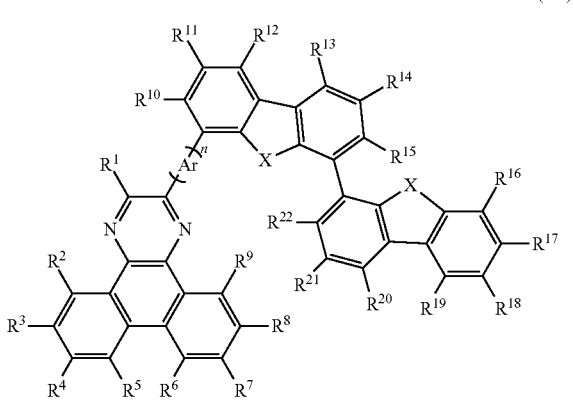

(G2)

In General Formula (G2), Ar represents an arylene group having 6 to 13 carbon atoms; n is an integer of 0 to 2, $R^1$ to $R^{22}$ separately represent hydrogen or an alkyl group having 1 to 6 carbon atoms, and X represents an oxygen atom or a sulfur atom.

Another embodiment of the present invention is organic compounds represented by General Formula (g1) and General Formula (g2).

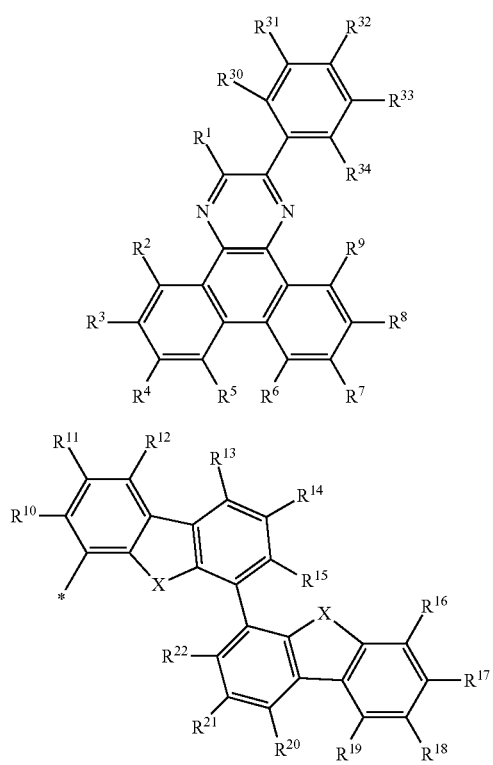

In General Formula (g1) and General Formula (g2), $R^1$ to $R^{22}$ separately represent hydrogen or an alkyl group having 1 to 6 carbon atoms, X represents an oxygen atom or a sulfur atom, one of $R^{30}$ to $R^{34}$ represents a group represented by General Formula (g2) and is bonded at the position represented by *, and the others separately represent hydrogen or an alkyl group having 1 to 6 carbon atoms.

Another embodiment of the present invention is an organic compound represented by General Formula (G3).

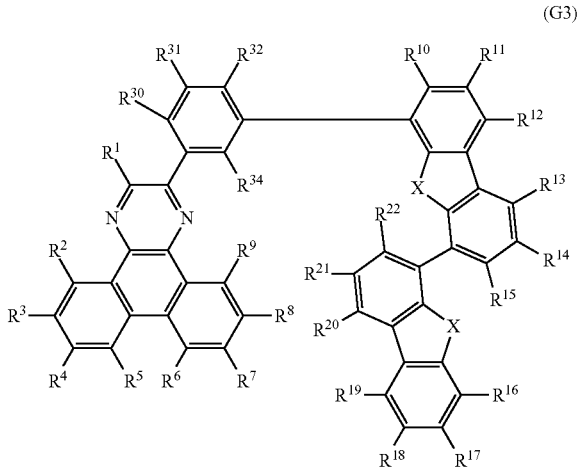

In General Formula (G3), $R^1$ to $R^{22}$, $R^{30}$ to $R^{32}$, and $R^{34}$ separately represent hydrogen or an alkyl group having 1 to 6 carbon atoms, and X represents an oxygen atom or a sulfur atom.

Another embodiment of the present invention is an organic compound represented by General Formula (G4).

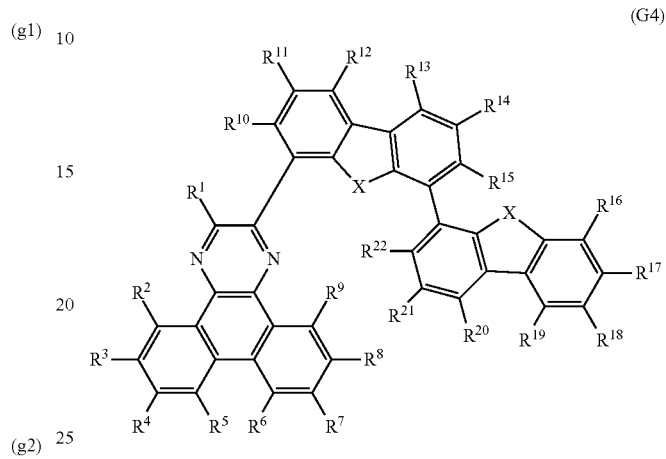

In General Formula (G4), $R^1$ to $R^{22}$ separately represent hydrogen or an alkyl group having 1 to 6 carbon atoms, and X represents an oxygen atom or a sulfur atom.

Another embodiment of the present invention is any of the above-described organic compounds in which $R^1$ to $R^{22}$ and $R^{30}$ to $R^{34}$ all represent hydrogen.

Another embodiment of the present invention is any of the above-described organic compounds in which X represents a sulfur atom.

Another embodiment of the present invention is any of the above-described organic compounds in which X represents an oxygen atom.

Another embodiment of the present invention is a light-emitting element that contains any of the above-described organic compounds.

Another embodiment of the present invention is a display module that includes the above-described light-emitting element.

Another embodiment of the present invention is a lighting module that includes the above-described light-emitting element.

Another embodiment of the present invention is a light-emitting device that includes the above-described light-emitting element and a unit for controlling the light-emitting element.

Another embodiment of the present invention is a display device that includes the above-described light-emitting element in a display portion and a unit for controlling the light-emitting element.

Another embodiment of the present invention is a lighting device that includes the above-described light-emitting element in a lighting portion and a unit for controlling the light-emitting element.

Another embodiment of the present invention is an electronic appliance that includes the above-described light-emitting element.

Note that the light-emitting device in this specification includes an image display device including a light-emitting element. The category of the light-emitting device in this specification includes a module in which a light-emitting element is provided with a connector such as an anisotropic conductive film or a tape carrier package (TCP); a module in which a printed wiring board is provided at the end of a TCP; and a module in which an integrated circuit (IC) is directly mounted on a light-emitting element by a chip on glass (COG) method. The category also includes a light-emitting device which is used in lighting equipment or the like.

One embodiment of the present invention can provide an organic compound with which a light-emitting element with good characteristics can be fabricated.

Another embodiment of the present invention can provide a light-emitting element with good characteristics.

Another embodiment of the present invention can provide a light-emitting element that has good characteristics and improved heat resistance.

Another embodiment of the present invention can provide a light-emitting element that has good characteristics and is inexpensive.

Another embodiment of the present invention can provide a display module, a lighting module, a light-emitting device, a display device, an electronic appliance, and a lighting device that have excellent heat resistance with the use of any of the above-described light-emitting elements.

Another embodiment of the present invention can provide a display module, a lighting module, a light-emitting device, a display device, an electronic appliance, and a lighting device that are inexpensive with the use of any of the above-described light-emitting elements.

Another embodiment of the present invention can provide, without losing advantages of a light-emitting element such as thinness, lightness, and low power consumption, a display module, a lighting module, a light-emitting device, a display device, an electronic appliance, and a lighting device that have excellent heat resistance with the use of any of the above-described light-emitting elements.

Another embodiment of the present invention can provide, without losing advantages of a light-emitting element such as thinness, lightness, and low power consumption, a display module, a lighting module, a light-emitting device, a display device, an electronic appliance, and a lighting device that are inexpensive with the use of any of the above-described light-emitting elements. Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above-described effects.

BRIEF DESCRIPTION OF THE DRAWINGS

FIGS. 3A and 3B are conceptual diagrams of active matrix light-emitting devices.

FIGS. 7A, 7B1, 7B2, 7C, and 7D illustrate electronic appliances.

DETAILED DESCRIPTION OF THE INVENTION

Figure 1A:
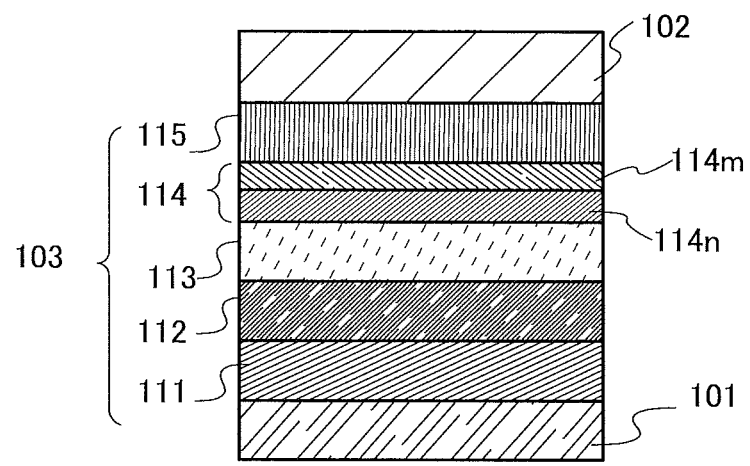
FIGS. 1A and 1B are conceptual diagrams of light-emitting elements.

Hereinafter, embodiments of the present invention will be described with reference to the drawings. Note that the present invention is not limited to the description below, and it is easily understood by those skilled in the art that various changes and modifications can be made without departing from the spirit and scope of the present invention. Therefore, the invention should not be construed as being limited to the description in the following embodiments.

Embodiment 1

One embodiment of the present invention is an organic compound in which a dibenzoquinoxaline skeleton and a 4,4'-bidibenzofuran skeleton or a 4,4'-bidibenzothiophene skeleton are bonded to each other through an arylene group.

The dibenzoquinoxaline skeleton, the 4,4'-bidibenzofuran skeleton, the 4,4'-bidibenzothiophene skeleton, and the arylene group may have a substituent such as an alkyl group having 1 to 6 carbon atoms.

The organic compound having such a structure has a favorable carrier-transport property, a high triplet excitation level, and high heat resistance, and in addition, high productivity owing to its short synthesis process and easy purification by sublimation.

The organic compound can also be represented by General Formula (G1).

(G1)

In General Formula (G1), A represents a substituted or unsubstituted dibenzoquinoxaline skeleton, B represents a substituted or unsubstituted 4,4'-bidibenzofuran skeleton or a substituted or unsubstituted 4,4'-bidibenzothiophene skeleton, Ar represents an arylene group having 6 to 13 carbon atoms, and n is an integer of 0 to 2. Note that Ar may have a substituent the carbon number of which is not included in the carbon number of the arylene group. Specific examples of the arylene group having 6 to 13 carbon atoms include a phenylene group, a naphthalenediyl group, a biphenyldiyl group, and a fluorenediyl group. In particular, a phenylene group, a biphenyldiyl group, and a fluorenediyl group are preferable to give a high triplet level.

In the case where A, B, and Ar have substituents, an alkyl group having 1 to 6 carbon atoms can be given as the substituents. Specific examples of the alkyl group having 1 to 6 carbon atoms include a methyl group, an ethyl group, an n-propyl group, an iso-propyl group, an n-butyl group, an iso-butyl group, a sec-butyl group, a tert-butyl group, a pentyl group, a hexyl group, and a cyclohexyl group.

The organic compound represented by General Formula (G1) can also be represented by General Formula (G2).

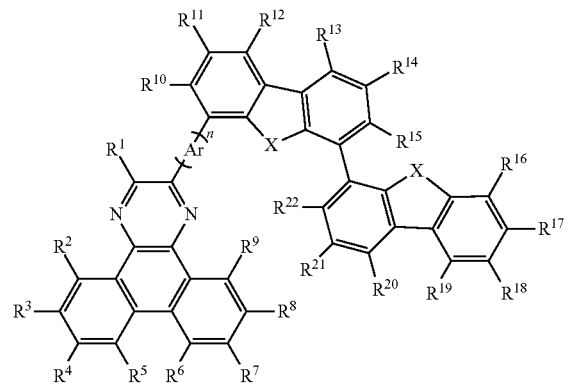

(G2)

In General Formula (G2), Ar represents an arylene group having 6 to 13 carbon atoms, and n is an integer of 0 to 2. Note that Ar may have a substituent the carbon number of which is not included in the carbon number of the arylene group. Specific examples of the arylene group having 6 to 13 carbon atoms include a phenylene group, a naphthalenediyl group, a biphenyldiyl group, and a fluorenediyl group. In particular, a phenylene group, a biphenyldiyl group, and a fluorenediyl group are preferable to give a high triplet level.

In the case where Ar has a substituent, an alkyl group having 1 to 6 carbon atoms can be given as the substituent. Specific examples of the alkyl group having 1 to 6 carbon atoms include a methyl group, an ethyl group, an n-propyl group, an iso-propyl group, an n-butyl group, an iso-butyl group, a sec-butyl group, a tert-butyl group, a pentyl group, a hexyl group, and a cyclohexyl group.

In addition, $R^1$ to $R^{22}$ separately represent hydrogen or an alkyl group having 1 to 6 carbon atoms, and X represents an oxygen atom or a sulfur atom. Specific examples of the alkyl group having 1 to 6 carbon atoms include a methyl group, an ethyl group, an n-propyl group, an iso-propyl group, an n-butyl group, an iso-butyl group, a sec-butyl group, a tert-butyl group, a pentyl group, a hexyl group, and a cyclohexyl group.

Note that in the organic compound represented by General Formula (G2), Ar is preferably a phenyl group and n is preferably 1, in which case a carrier-transport property can be improved and a light-emitting element with high emission efficiency can be easily obtained.

That is, the organic compound of one embodiment of the present invention is an organic compound represented by General Formula (g1) and General Formula (g2).

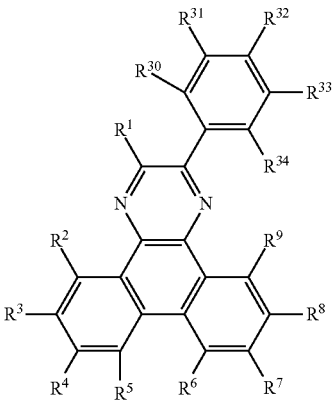

(g1)

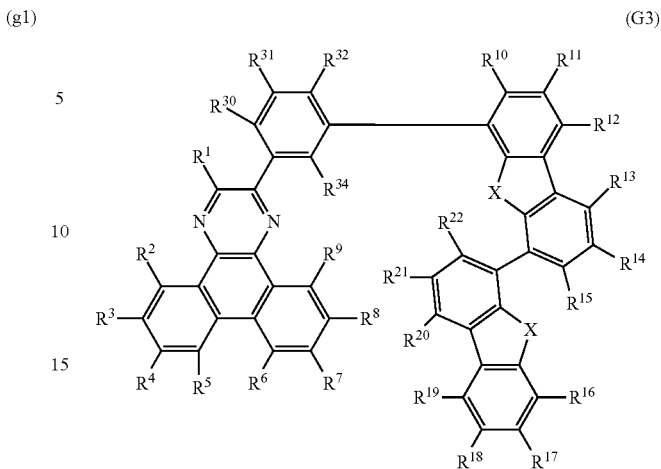

(G3)

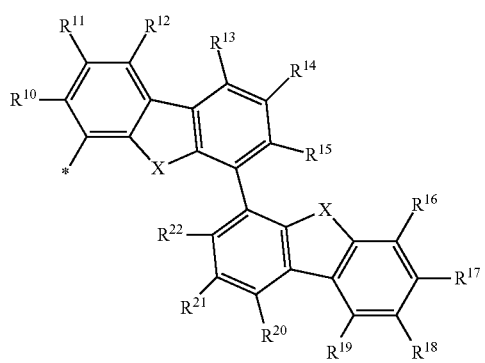

(g2)

In General Formula (g1) and General Formula (g2), $R^1$ to $R^{22}$ separately represent hydrogen or an alkyl group having 1 to 6 carbon atoms, and X represents an oxygen atom or a sulfur atom. Specific examples of the alkyl group having 1 to 6 carbon atoms include a methyl group, an ethyl group, an n-propyl group, an iso-propyl group, an n-butyl group, an iso-butyl group, a sec-butyl group, a tert-butyl group, a pentyl group, a hexyl group, and a cyclohexyl group.

In addition, one of $R^{30}$ to $R^{34}$ is a group represented by General Formula (g2), and the others separately represent hydrogen or an alkyl group having 1 to 6 carbon atoms. The group represented by General Formula (g2) is bonded to any of $R^{30}$ to $R^{34}$ at the position represented by *. Specific examples of the alkyl group having 1 to 6 carbon atoms include a methyl group, an ethyl group, an n-propyl group, an iso-propyl group, an n-butyl group, an iso-butyl group, a sec-butyl group, a tert-butyl group, a pentyl group, a hexyl group, and a cyclohexyl group.

In the organic compound represented by General Formulae (g1) and (g2), the group represented by (g2) is preferably bonded at the meta-position of a phenyl group in the skeleton represented by (g1), in which case a triplet excitation level can be kept high.

That is, the organic compound of one embodiment of the present invention is preferably an organic compound represented by General Formula (G3).

In General Formula (G3), $R^1$ to $R^{22}$, $R^{30}$ to $R^{32}$, and $R^{34}$ separately represent hydrogen or an alkyl group having 1 to 6 carbon atoms, and X represents an oxygen atom or a sulfur atom. Specific examples of the alkyl group having 1 to 6 carbon atoms include a methyl group, an ethyl group, an n-propyl group, an iso-propyl group, an n-butyl group, an iso-butyl group, a sec-butyl group, a tert-butyl group, a pentyl group, a hexyl group, and a cyclohexyl group.

The organic compound of one embodiment of the present invention can also be represented by General Formula (G4).

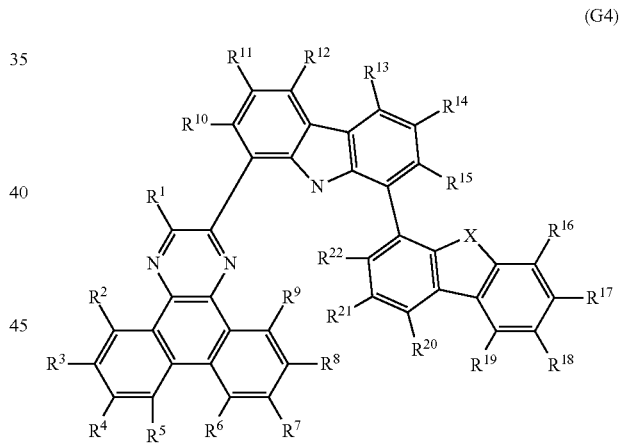

(G4)

In General Formula (G4), $R^1$ to $R^{22}$ separately represent hydrogen or an alkyl group having 1 to 6 carbon atoms, and X represents an oxygen atom or a sulfur atom. Specific examples of the alkyl group having 1 to 6 carbon atoms include a methyl group, an ethyl group, an n-propyl group, an iso-propyl group, an n-butyl group, an iso-butyl group, a sec-butyl group, a tert-butyl group, a pentyl group, a hexyl group, and a cyclohexyl group.

Note that each of $R^1$ to $R^{22}$ is preferably hydrogen for availability of a raw material, an easy and simple synthesis, and a favorable carrier-transport property.

The organic compound having such a structure has a favorable carrier-transport property, a high triplet excitation level, and high heat resistance, and in addition, high productivity owing to its short synthesis process and easy purification by sublimation.

Specific examples of the organic compound having the above-described structure include organic compounds listed below.
(100)
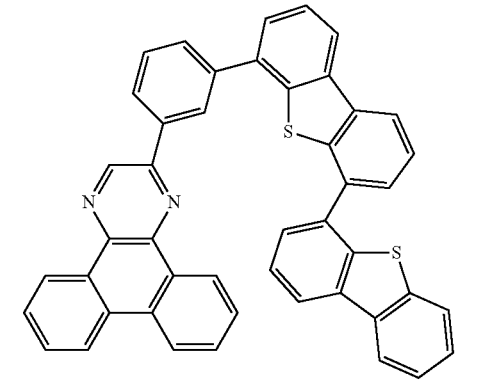
(101)
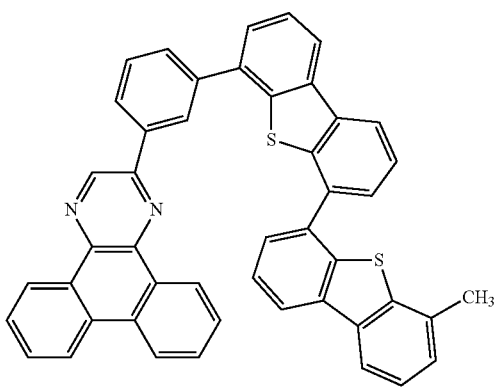
(102)
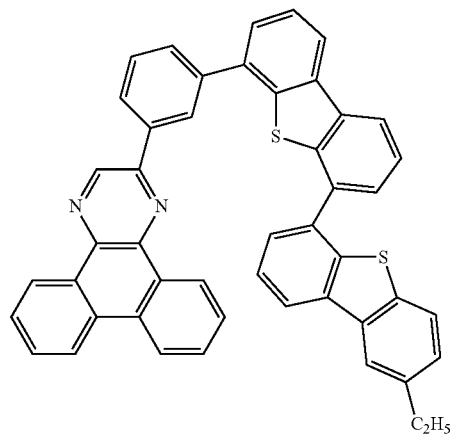
(103)
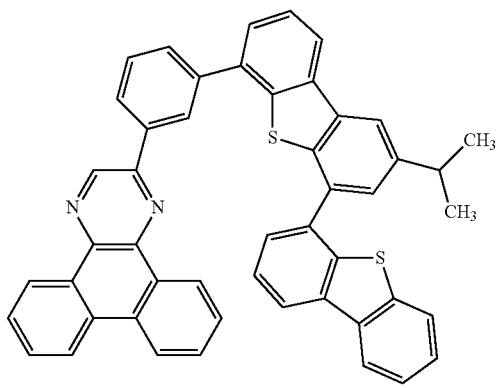
(104)
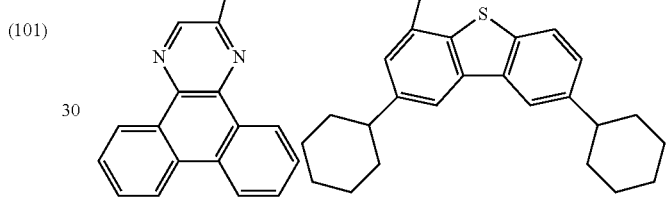
(105)
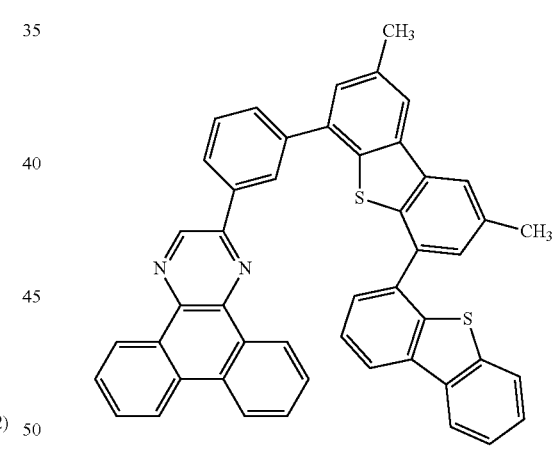
(106)
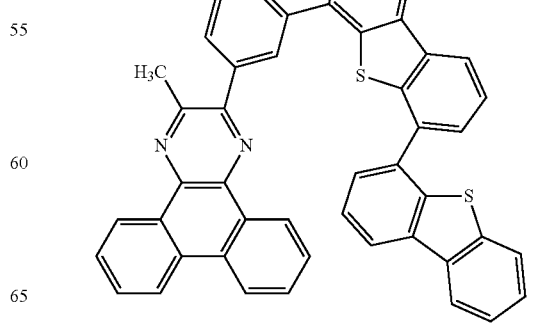

(107)
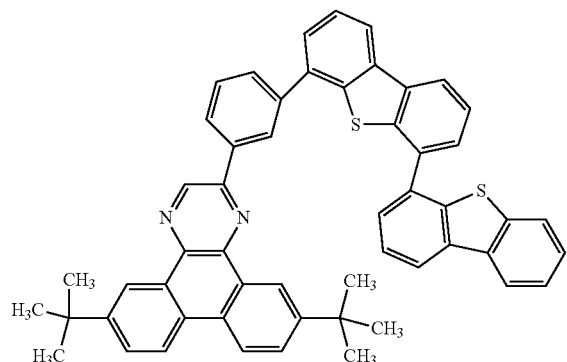
(108)
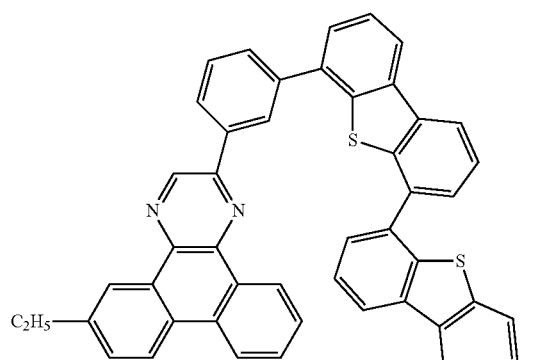
(109)
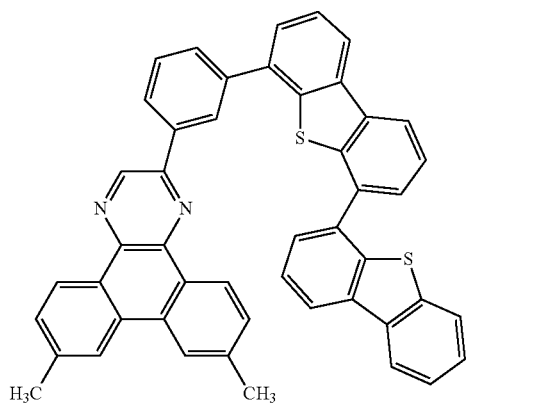
(110)
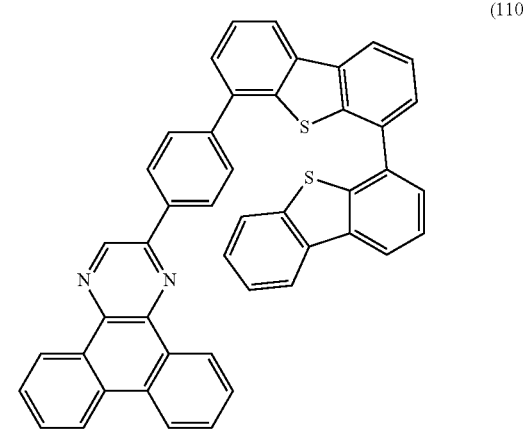
(111)
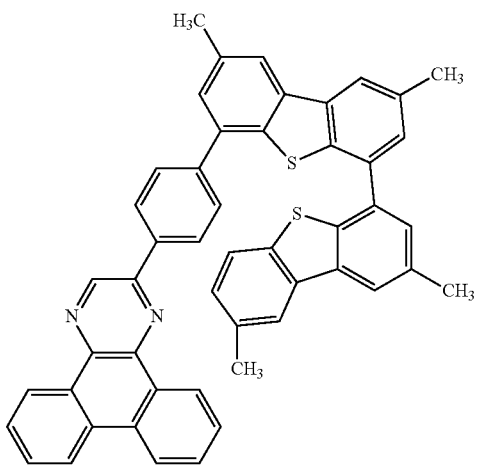
(112)
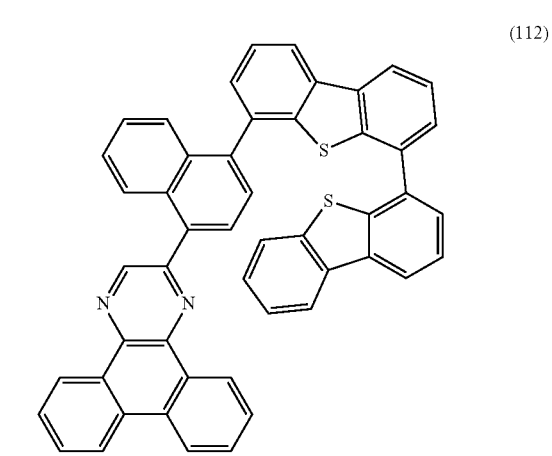
(113)

(114)
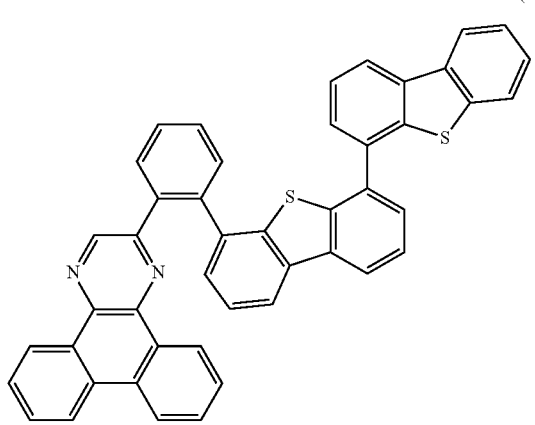
(115)
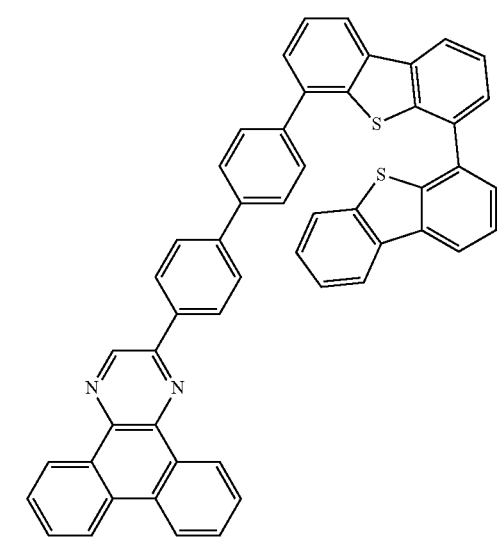
(116)
(117)
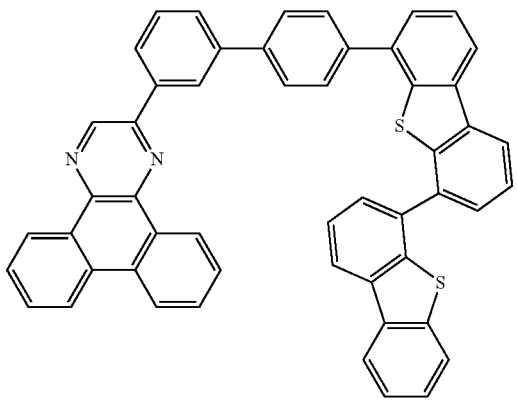
(118)
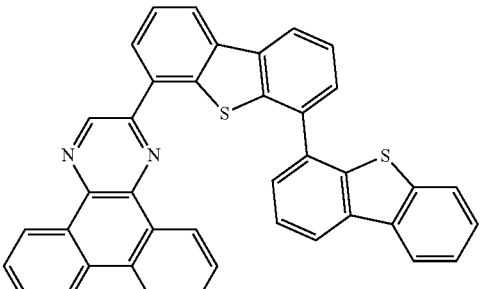
(119)
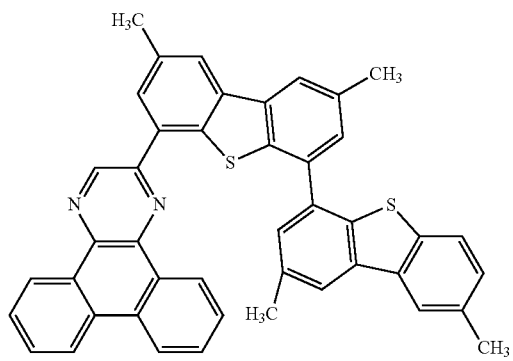
(120)
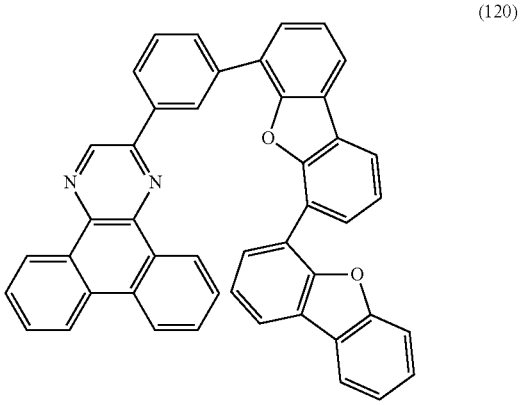

-continued
(121)
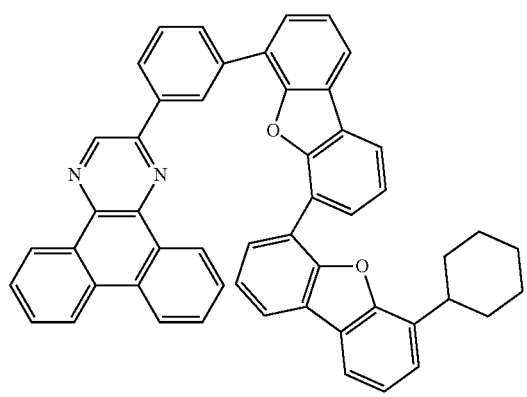
(122)
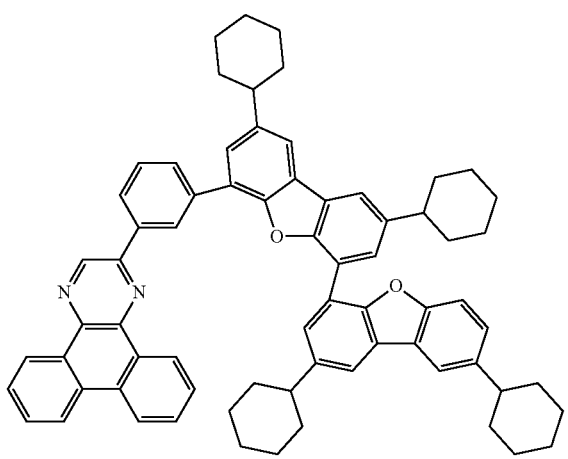
(123)
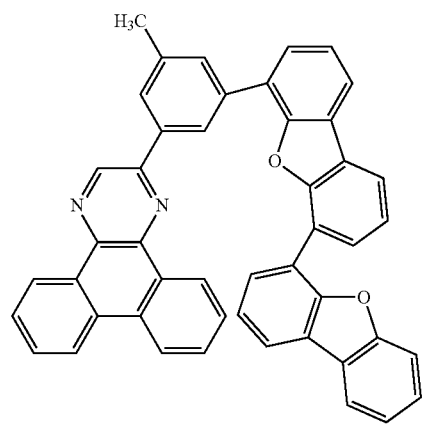
-continued
(124)
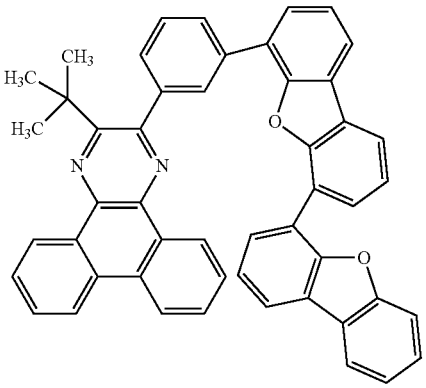
(125)
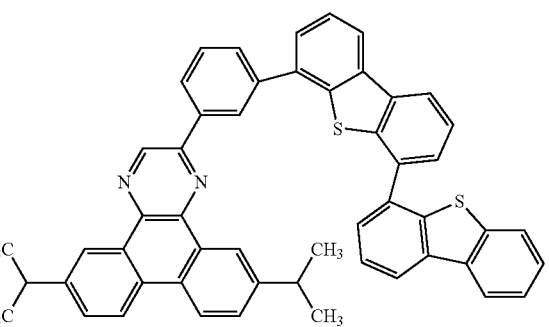
(126)
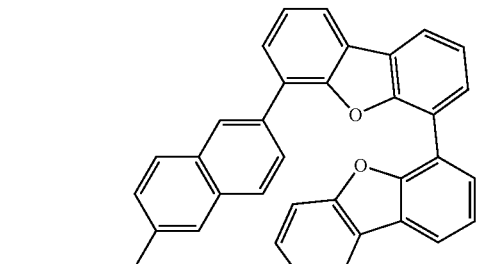
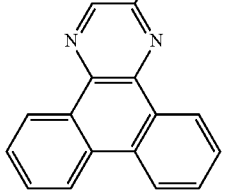
(127)
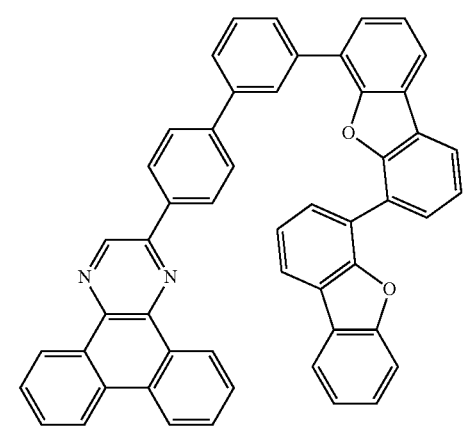

-continued (128)

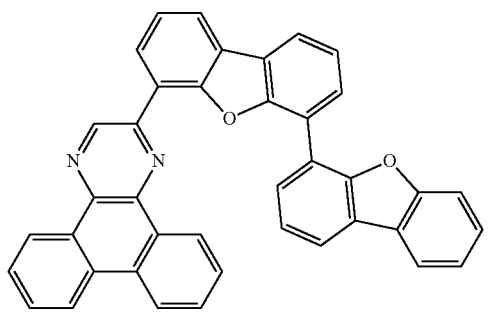

(129)

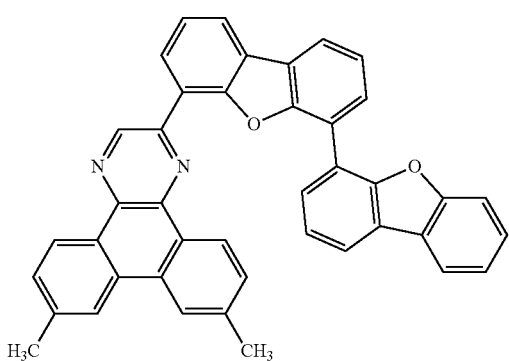

A variety of reactions can be employed as a method of synthesizing any of the organic compounds of embodiments of the present invention described above. For example, synthesis reactions described below enable synthesis of the organic compound represented by General Formula (G2). Note that the method of synthesizing any of the organic compounds of one embodiment of the present invention is not limited to the synthesis methods described below.

<Step 1: Method of Synthesizing Boronic Acid or Organoboron Compound of 4,4'-bidibenzofuran Derivative or 4,4'-bidibenzothiophene Derivative>

First, a boronic acid or an organoboron compound of a 4,4'-bidibenzofuran derivative or a 4,4'-bidibenzothiophene derivative is synthesized. A boronic acid or an organoboron compound (a2) of a 4,4'-bidibenzofuran derivative or a 4,4'-bidibenzothiophene derivative can be synthesized as shown in Synthesis Scheme (A-1): the 4,4'-bidibenzofuran derivative or the 4,4'-bidibenzothiophene derivative (a1) is converted into boronic acid or organoboron with the use of an alkyllithium reagent and a boron reagent, whereby a boronic acid or an organoboron compound (a2) of the 4,4'-bidibenzofuran derivative or the 4,4'-bidibenzothiophene derivative can be obtained.

-continued

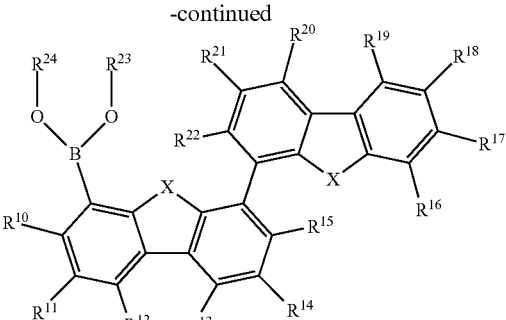

(a2)

In Synthesis Scheme (A-1), $R^{10}$ to $R^{22}$ separately represent hydrogen or an alkyl group having 1 to 6 carbon atoms, and X represents an oxygen atom or a sulfur atom. In the case where the compound (a2) is a boronic acid, $R^{23}$ and $R^{24}$ each represent hydrogen. The boronic acid of the compound (a2) may be protected by ethylene glycol or the like, and in this case, $R^{23}$ and $R^{24}$ in the compound (a2) each represent an alkyl group having 1 to 6 carbon atoms. In the case where the compound (a2) is an organoboron compound, $R^{23}$ and $R^{24}$ may be the same or different and bonded to each other to form a ring.

In Synthesis Scheme (A-1), an ether-based solvent such as diethyl ether, tetrahydrofuran (THF), or cyclopentyl methyl ether can be used. The alkyllithium reagent may be n-butyllithium, sec-butyl lithium, tert-butyl lithium, or the like. Furthermore, addition of a coordinating additive to such an alkyllithium reagent can enhance reactivity. The coordinating additive that can be used may be tetramethylethylenediamine (TMEDA) or the like. In addition, the boron reagent may be trimethyl borate, triisopropyl borate, or the like. Note that a solvent, a reagent, and the like that can be used are not limited to those described above.

<Step 2: Method of Synthesizing Organic Compound Represented by General Formula (G2)>

Next, the organic compound represented by General Formula (G2) can be synthesized as shown in Synthesis Scheme (A-2). That is, a halide of a dibenzo[f,h]quinoxaline derivative or a compound (a3) in which a dibenzo[f,h]quinoxaline derivative has a triflate group is coupled with the boronic acid or the organoboron compound (a2) of the 4,4'-bidibenzofuran derivative or the 4,4'-bidibenzothiophene derivative by the Suzuki-Miyaura reaction using a palladium catalyst, whereby the organic compound (G2) of one embodiment of the present invention can be obtained.

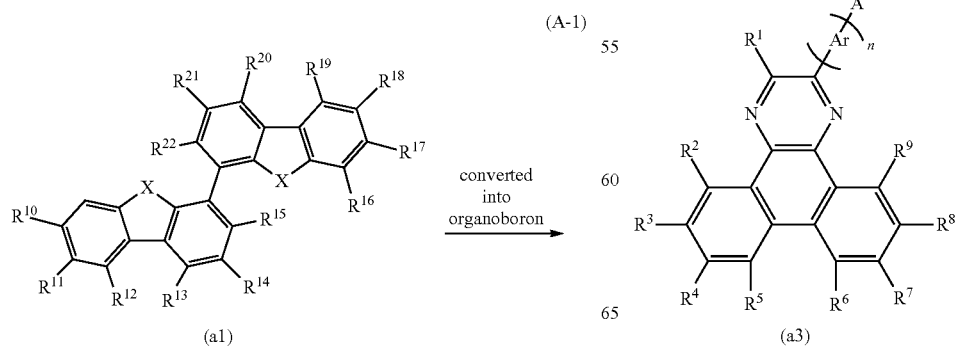

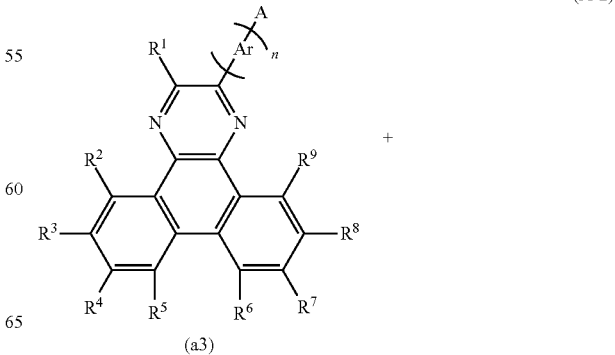

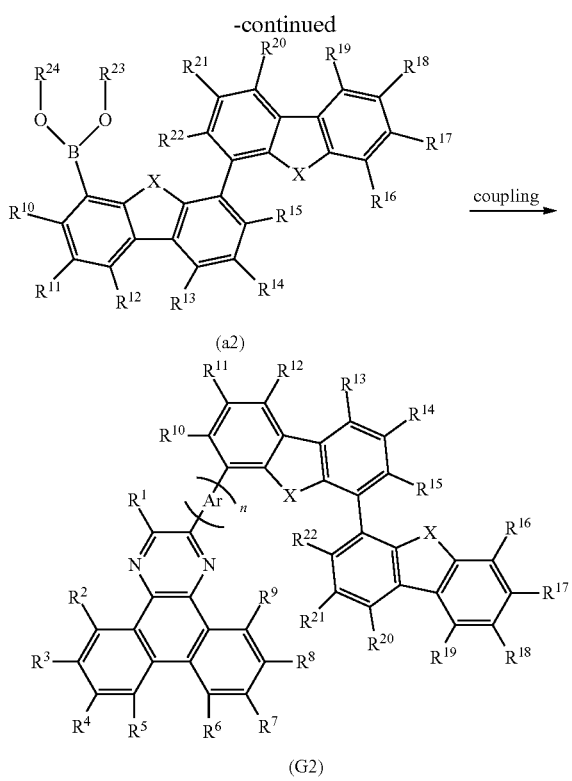

(a2)

(G2)

In Synthesis Scheme (A-2), $R^1$ to $R^9$ separately represent any of hydrogen and an alkyl group having 1 to 6 carbon atoms, Ar represents an arylene group having 6 to 13 carbon atoms, and n is an integer of 0 to 2. In addition, A represents a halogen or a triflate group. When A represents a halogen, chlorine, bromine, or iodine is particularly preferable as the halogen.

In the reaction in Synthesis Scheme (A-2), a palladium catalysts, a base, a solvent, and the like are used. Examples of the palladium catalyst include palladium(II) acetate and tetrakis(triphenylphosphine)palladium(0). Examples of a ligand of the palladium catalyst include tri(ortho-tolyl)phosphine, triphenylphosphine, and tricyclohexylphosphine. Examples of the base include organic bases such as sodium tert-butoxide and inorganic bases such as a potassium carbonate and sodium carbonate. Examples of the solvent include toluene; xylene; alcohol such as ethanol; a mixed solvent of toluene and alcohol such as ethanol; a mixed solvent of xylene and alcohol such as ethanol; a mixed solvent of toluene and water; a mixed solvent of toluene, alcohol such as ethanol, and water; a mixed solvent of xylene and water; a mixed solvent of xylene, alcohol such as ethanol, and water; a mixed solvent of benzene and water; a mixed solvent of benzene, alcohol such as ethanol, and water; and a mixed solvent of an ether such as 1,2-dimethoxyethane and water. The mixed solvent of toluene and water or the mixed solvent of toluene, ethanol, and water is preferable. The use of the boronic acid or the organoboron compound (a2) of the 4,4'-bidibenzothiophene derivative as described above can easily increase the molecular weight; thus, an organic compound with high heat resistance can be obtained by simple synthesis.

Alternatively, a compound in which A in the dibenzo[f,h]quinoxaline derivative (a3) is an organoboron compound or a boronic acid may be coupled with a halide in which carbon bonded to boron of a 4,4'-bidibenzofuran derivative or a 4,4'-bidibenzothiophene derivative is halogenated or a compound in which carbon bonded to boron of a 4,4'-bidibenzofuran derivative or a 4,4'-bidibenzothiophene derivative has a triflate group, by the Suzuki-Miyaura reaction.

The organic compound of one embodiment of the present invention can be synthesized in the above-described manner.

Embodiment 2

In this embodiment, a detailed example of a structure of a light-emitting element in which any of the organic compounds described in Embodiment 1 is used is described below with reference to FIG. 1A.

The light-emitting element in this embodiment includes, between a pair of electrodes, an EL layer including a plurality of layers. Any of the plurality of layers contain any of the organic compounds described in Embodiment 1. In this embodiment, the light-emitting element includes the first electrode 101, the second electrode 102, and the EL layer 103 that is provided between the first electrode 101 and the second electrode 102. Note that in this embodiment, the first electrode 101 functions as an anode and the second electrode 102 functions as a cathode. In other words, when voltage is applied between the first electrode 101 and the second electrode 102 so that the potential of the first electrode 101 is higher than that of the second electrode 102, light emission can be obtained.

Since the first electrode 101 functions as the anode, the first electrode 101 is preferably formed using any of metals, alloys, electrically conductive compounds with a high work function (specifically, a work function of 4.0 eV or more), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. For example, indium oxide-zinc oxide is deposited by a sputtering method using a target obtained by adding 1 wt % to 20 wt % of zinc oxide to indium oxide. A film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used. Graphene can also be used. Note that when a composite material described later is used for a layer that is in contact with the first electrode 101 in the EL layer 103, an electrode material can be selected regardless of its work function.

There is no particular limitation on the stacked-layer structure of the EL layer 103 as long as any of the organic compounds described in Embodiment 1 is contained in any of the stacked layers. For example, the EL layer 103 can be formed by combining a hole-injection layer, a hole-transport layer, the light-emitting layer, an electron-transport layer, an electron-injection layer, a carrier-blocking layer, an intermediate layer, and the like as appropriate. In this embodiment, the EL layer 103 has a structure in which the hole-injection layer 111, the hole-transport layer 112, the light-emitting layer 113, the electron-transport layer 114, and the electron-injection layer 115 are stacked in this order over the first electrode 101. Among the layers, the light-emitting layer contains any of the organic compounds described in Embodiment 1 as a host material; however, one embodiment of the present invention is not limited thereto. Materials for forming each layer are specifically described below.

The hole-injection layer 111 is a layer containing a substance having a high hole-injection property. Molybdenum oxide, vanadium oxide, ruthenium oxide, tungsten oxide, manganese oxide, or the like can be used. Alternatively, the hole-injection layer 111 can be formed using a phthalocyanine-based compound such as phthalocyanine (abbreviation: H$_2$Pc) or copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), a high molecular compound such as poly(3,4-ethylenedioxythiophene)/poly(styrenesulfonic acid) (PEDOT/PSS), or the like.

Alternatively, a composite material in which a substance having a hole-transport property contains a substance having an acceptor property can be used for the hole-injection layer 111. Note that the use of such a substance having a hole-transport property which contains a substance having an acceptor property enables selection of a material used to form an electrode regardless of its work function. In other words, besides a material having a high work function, a material having a low work function can be used for the first electrode 101. As the acceptor substance, 7,7,8,8-tetracyano-2,3,5,6-tetrafluoroquinodimethane (abbreviation: F$_4$-TCNQ), chloranil, and the like can be given. In addition, transition metal oxides can be given. Moreover, oxides of metals belonging to Groups 4 to 8 of the periodic table can be used. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable because it is stable in the air, has a low hygroscopic property, and is easily handled.

As the substance having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably an organic compound having a high hole-transport property. Specifically, a substance having a hole mobility of $10^{-6}$ cm$^2$/Vs or higher is preferably used. Specific examples of the organic compound that can be used as a substance having a hole-transport property in the composite material are given below.

Examples of the aromatic amine compounds are N,N'-di (p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B)

Specific examples of the carbazole derivatives that can be used for the composite material are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples of the carbazole derivatives that can be used for the composite material are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon that can be used for the composite material are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di (2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples are pentacene and coronene. The aromatic hydrocarbon that has a hole mobility of $1\times10^{-6}$ cm$^2$/Vs or higher and has 14 to 42 carbon atoms is particularly preferable.

Note that the aromatic hydrocarbons that can be used for the composite material may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: poly-TPD).

By providing a hole-injection layer, a high hole-injection property can be obtained to allow a light-emitting element to be driven at a low voltage.

The hole-transport layer 112 is a layer containing a substance having a hole-transport property. Examples of the substance having a hole-transport property are aromatic amine compounds such as 4,4'-bis[N-(1-naphthyl)-N-phenylamino] biphenyl (abbreviation: NPB), N,N'-bis(3-methylphenyl)-N, N'-diphenyl-[1,1'-biphenyl]-4,4'-diamine (abbreviation: TPD), 4,4',4"-tris(N,N'-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and 4-phenyl-4'-(9-phenylfluoren-9-yl)triphenylamine (abbreviation: BPAFLP). The substances listed here have high hole-transport properties and are mainly ones that have a hole mobility of $10^{-6}$ cm$^2$/Vs or higher. An organic compound given as an example of the substance having a hole-transport property in the composite material described above can also be used for the hole-transport layer 112. Moreover, a high molecular compound such as poly(N-vinylcarbazole) (abbreviation: PVK) and poly(4-vinyltriphenylamine) (abbreviation: PVTPA) can also be used. Note that the layer that contains a substance having a hole-transport property is not limited to a single layer, and may be a stack of two or more layers including any of the above substances.

The light-emitting layer 113 may be a layer that contains a fluorescent substance and emits fluorescence, a layer that contains a phosphorescent substance and emits phosphorescence, or a layer that contains a substance emitting thermally activated delayed fluorescence (TADF) and emits TADF. Furthermore, the light-emitting layer 113 may be a single layer or include a plurality of layers containing different light-emitting substances.

Examples of a material that can be used as the fluorescent substance in the light-emitting layer 113 are given below. Fluorescent substances other than those given below can also be used.

Examples of the fluorescent substance are 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9-phenyl-9H-fluoren-9-yl)phenyl]-N,N'-diphenyl-pyrene-1,6-diamine (abbreviation: 1,6FLPAPrn), N,N'-bis(3-methylphenyl)-N,N'-bis[3-(9-phenyl-9H-fluoren-9-yl)phenyl]-pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl) triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). Condensed aromatic diamine compounds typified by pyrenediamine compounds such as 1,6FLPAPrn and 1,6mMemFLPAPrn are particularly preferable because of their high hole-trapping properties, high emission efficiency, and high reliability.

Examples of a material that can be used as a phosphorescent substance in the light-emitting layer 113 are given below.

Examples of the phosphorescent substance are an organometallic iridium complex having a 4H-triazole skeleton, such as tris{2-[5-(2-methylphenyl)-4-(2,6-dimethylphenyl)-4H-1,2,4-triazol-3-yl-kN2]phenyl-kC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), or tris [4-(3-biphenyl)-5-isopropyl-3-phenyl-4H-1,2,4-triazolato] iridium(III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) or tris(1-methyl-5-phenyl-3-propyl-1H-1,2,4-triazolato)iridium(III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole]iridium(III) (abbreviation: [Ir(iPrpmi)$_3$]), or tris[3-(2,6-dimethylphenyl)-7-methylimidazo[1,2-f]phenanthridinato]iridium(III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,C$^{2'}$] iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), or bis[2-(4',6'-difluorophenyl)pyridinato-N,C$^{2'}$]iridium(III) acetylacetonate (abbreviation: FIr(acac). These are compounds emitting blue phosphorescence and have an emission peak at 440 nm to 520 nm.

Other examples are organometallic iridium complexes having pyrimidine skeletons, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato)bis(4,6-diphenylpyrimidinato)iridium(III) (abbreviation: [Ir(dppm)$_2$(acac)]); organometallic iridium complexes having pyrazine skeletons, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having pyridine skeletons, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$acac]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$) iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); and a rare earth metal complex such as tris (acetylacetonato) (monophenanthroline)terbium(III) (abbreviation: [Tb(acac)$_3$(Phen)]). These are mainly compounds emitting green phosphorescence and have an emission peak at 500 nm to 600 nm. Note that an organometallic iridium complex having a pyrimidine skeleton has distinctively high reliability and emission efficiency and is thus especially preferable.

Other examples are (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and bis[4,6-di(naphthalen-1-yl) pyrimidinato](dipivaloylmethanato)iridium(III) (abbreviation: [Ir(d1npm)$_2$(dpm)]); organometallic iridium complexes having pyrazine skeletons, such as (acetylacetonato)bis(2,3,5-triphenylpyrazinato)iridium(III) (abbreviation: [Ir(tppr)$_2$(acac)]), bis(2,3,5-triphenylpyrazinato) (dipivaloylmethanato)iridium(III) (abbreviation: [Ir(tppr)$_2$(dpm)]), or (acetylacetonato)bis[2,3-bis(4-fluorophenyl)quinoxalinato]iridium(III) (abbreviation: [Ir(Fdpq)$_2$(acac)]); organometallic iridium complexes having pyridine skeletons, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III)acetylacetonate (abbreviation: [Ir(piq)$_2$(acac)]); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]). These are compounds emitting red phosphorescence and have an emission peak at 600 nm to 700 nm. The organometallic iridium complex having a pyrazine skeleton can provide red light emission with favorable chromaticity.

A variety of phosphorescent materials other than those given above may also be used.

Materials given below can be used as a TADF material.

A fullerene, a derivative thereof, an acridine derivative such as proflavine, and eosin can be given. A metal-containing porphyrin such as a porphyrin containing magnesium (Mg), zinc (Zn), cadmium (Cd), tin (Sn), platinum (Pt), indium (In), or palladium (Pd) can be used. Examples of the metal-containing porphyrin are a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$(OEP)), which are represented by Structural Formulae below.

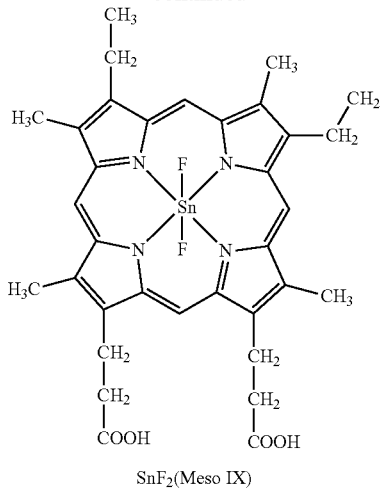

SnF$_2$(Meso IX)

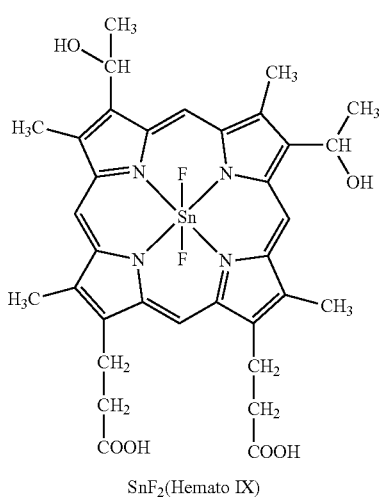

SnF$_2$(Hemato IX)

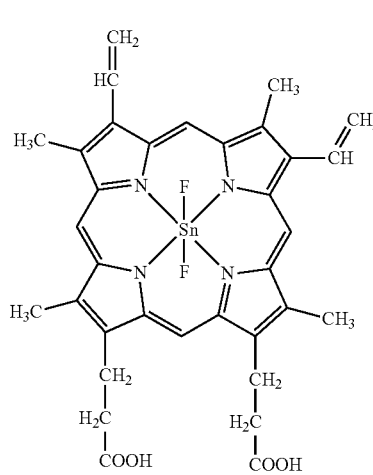

SnF$_2$(Proto IX)

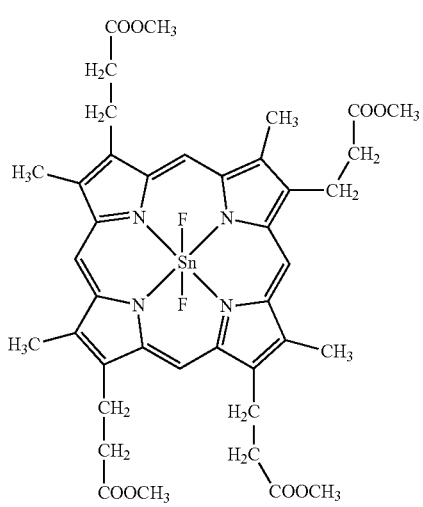

SnF$_2$(Copro III-4Me)

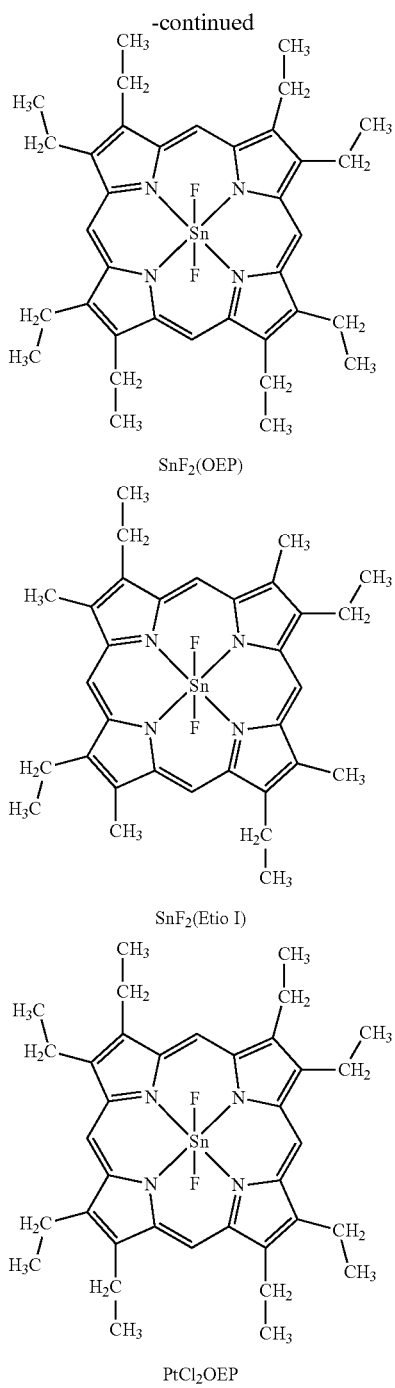

SnF₂(OEP)

SnF₂(Etio I)

PtCl₂OEP

Alternatively, a heterocyclic compound including a π-electron rich heteroaromatic ring and a π-electron deficient heteroaromatic ring can be used, such as 2-(biphenyl-4-yl)-4,6-bis(12-phenylindolo[2,3-a]carbazol-11-yl)-1,3,5-triazine (abbreviation: PIC-TRZ), which is represented by Structural Formula given below. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the energy difference between the $S_1$ level and the $T_1$ level becomes small.

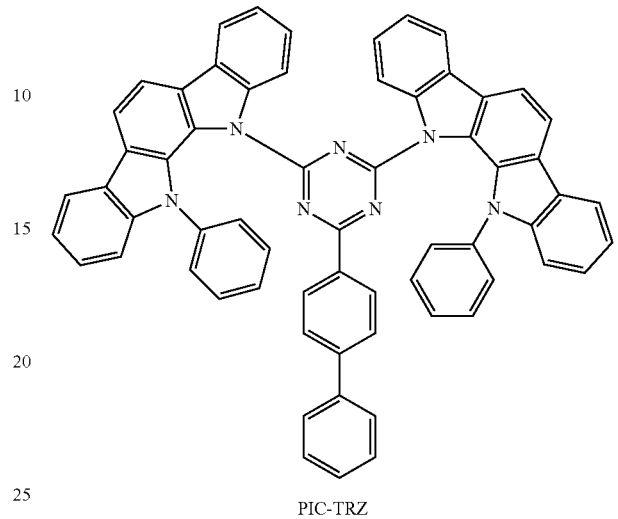

PIC-TRZ

In the light-emitting element of this embodiment, the organic compound of one embodiment of the present invention in which a dibenzoquinoxaline skeleton and a 4,4'-bidibenzofuran skeleton or a 4,4'-bidibenzothiophene skeleton are bonded to each other through an arylene group, which is described in Embodiment 1, is preferably used as a host material of the light-emitting layer. The organic compound of one embodiment of the present invention, which is described in Embodiment 1, can be represented by, for example, General Formula (G1).

$$A-(Ar)_n-B \quad (G1)$$

In General Formula (G1), A represents a substituted or unsubstituted dibenzoquinoxaline skeleton, B represents a substituted or unsubstituted 4,4'-bidibenzofuran skeleton or a substituted or unsubstituted 4,4'-bidibenzothiophene skeleton, Ar represents an arylene group having 6 to 13 carbon atoms, and n is an integer of 1 to 2. Note that Ar may have a substituent the carbon number of which is not included in the carbon number of the arylene group. Specific examples of the arylene group having 6 to 13 carbon atoms include a phenylene group, a naphthalenediyl group, a biphenyldiyl group, and a fluorenediyl group. In particular, a phenylene group, a biphenyldiyl group, and a fluorenediyl group are preferable to give a high triplet level.

In the case where A, B, and Ar have substituents, an alkyl group having 1 to 6 carbon atoms can be given as the substituents. Specific examples of the alkyl group having 1 to 6 carbon atoms include a methyl group, an ethyl group, an n-propyl group, an iso-propyl group, an n-butyl group, an iso-butyl group, a sec-butyl group, a tert-butyl group, a pentyl group, a hexyl group, and a cyclohexyl group.

Since the organic compound having such a structure, which is described in Embodiment 1, has a favorable carrier-transport property, the organic compound enables a light-emitting element with low drive voltage to be obtained easily.

Since the organic compound has a high triplet excitation level, the organic compound is preferably used especially as a light-emitting substance in a light-emitting element containing a phosphorescent substance or a TADF material, in which case the triplet excitation energy can be effectively converted into luminescence. The organic compound is preferably used especially for a light-emitting element emitting phosphorescence in the red to green wavelength range.

In addition, since the organic compound has high heat resistance, the organic compound enables a light-emitting element with high heat resistance to be fabricated.

Furthermore, since the organic compound is synthesized in a short process and easily purified by sublimation, the productivity of the organic compound is high. This results in reduced costs of the light-emitting element.

Note that the light-emitting layer may contain an organic compound other than the light-emitting material and any of the organic compounds described in Embodiment 1.

There is no particular limitation on the organic compound, and a substance having a hole-transport property is preferably used, in which case the transport property of the light-emitting layer can be controlled easily. Examples of the substance having a hole-transport property are a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-W); and a compound having a furan skeleton, such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in drive voltage.

Hole-transport materials can be selected from a variety of substances as well as from the hole-transport materials given above. Note that the host material may be a mixture of a plurality of kinds of substances as described above, and in the case of using a mixed host material, it is preferable to mix a material with an electron-transport property with a material with a hole-transport property. By mixing the material having an electron-transport property with the material with a hole-transport property, the transport property of the light-emitting layer 113 can be easily adjusted and a recombination region can be easily controlled. The ratio of the contained amount of the material having a hole-transport property to the contained amount of the material having an electron-transport property may be 1:9 to 9:1. An exciplex may be formed by these mixed materials. It is preferable that the combination of these materials be selected so as to form an exciplex that exhibits light emission whose wavelength overlaps a wavelength of a lowest-energy-side absorption band of the phosphorescent substance or the TADF material, in which case energy is transferred smoothly, light emission can be obtained efficiently, and the drive voltage is reduced.

In the case where the organic compound described in Embodiment 1 is not used for the light-emitting layer, a variety of carrier-transport materials can be used instead of the organic compound. As the carrier-transport material, any of materials having electron-transport properties can be used in addition to the materials having hole-transport properties listed above.

Examples of the material having an electron-transport property are a heterocyclic compound having a polyazole skeleton, such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton, such as 2-[3'-(dibenzothiophen-4-yl)biphenyl-3-yl]dibenzo[f,h]quinoline (abbreviation: 2mDBTBPDBQu-II), 3,5-bis[3-(9H-carbazol-9-yl)phenyl]pyridine (abbreviation: 35DCzPPy), or 1,3,5-tri[3-(3-pyridyl)phenyl]benzene (abbreviation: TmPyPB). Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in drive voltage.

The light-emitting layer 113 having the above-described structure can be formed by co-evaporation by a vacuum evaporation method, or an inkjet method, a spin coating method, a dip coating method, or the like using a mixed solution.

The electron-transport layer 114 is a layer containing a substance having an electron-transport property. As the substance having an electron-transport property, it is possible to use any of the above-listed substances having electron-transport properties that can be used as a host material.

A layer for controlling transport of electron carriers may be provided between the electron-transport layer and the light-emitting layer. This is a layer formed by addition of a small amount of a substance having a high electron-trapping property to the aforementioned materials having a high electron-transport property, and the layer is capable of adjusting carrier balance by retarding transport of electron carriers. Such a structure is very effective in preventing a problem (e.g., a reduction in element lifetime) caused when electrons pass through the light-emitting layer.

An electron-injection layer 115 may be provided in contact with the second electrode 102 between the electron-transport layer 114 and the second electrode 102. For the electron-injection layer 115, an alkali metal, an alkaline earth metal, or a compound thereof, such as lithium fluoride (LiF), cesium fluoride (CsF), or calcium fluoride ($CaF_2$), can be used. For example, a layer that is formed using a substance having an electron-transport property and contains an alkali metal, an alkaline earth metal, or a compound thereof can be used. An electride may also be used for the electron-injection layer 115. Examples of the electride include a substance in which electrons are added at high concentration to calcium oxide-aluminum oxide ($12CaO.7Al_2O_3$ (C12A7)). Note that a layer that is formed using a substance having an electron-transport property and contains an alkali metal or an alkaline earth metal is preferably used as the electron-injection layer 115, in which case electron injection from the second electrode 102 is efficiently performed.

For the second electrode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), and alloys thereof. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. These conductive materials can be deposited by a sputtering method, an ink-jet method, a spin coating method, or the like.

Any of a variety of methods can be used to form the EL layer 103 regardless whether it is a dry process or a wet process. For example, a vacuum evaporation method, an ink-jet method, or a spin coating method may be employed. Different formation methods may be used for the electrodes or the layers.

The electrode may be formed by a wet method using a sol-gel method, or by a wet method using paste of a metal material. Alternatively, the electrode may be formed by a dry method such as a sputtering method or a vacuum evaporation method.

In the light-emitting element having the above-described structure, current flows because of a potential difference between the first electrode 101 and the second electrode 102, and holes and electrons recombine in the light-emitting layer 113 that contains a substance having a high light-emitting property, so that light is emitted. In other words, a light-emitting region is formed in the light-emitting layer 113.

Light emission is extracted out through one or both of the first electrode 101 and the second electrode 102. Therefore, one or both of the first electrode 101 and the second electrode 102 are light-transmitting electrodes. In the case where only the first electrode 101 is a light-transmitting electrode, light is extracted through the first electrode 101. In contrast, in the case where only the second electrode 102 is a light-transmitting electrode, light is extracted through the second electrode 102. In the case where both the first electrode 101 and the second electrode 102 are light-transmitting electrodes, light is extracted through the first electrode 101 and the second electrode 102.

The structure of the layers provided between the first electrode 101 and the second electrode 102 is not limited to the above-described structure. Preferably, a light-emitting region where holes and electrons recombine is positioned away from the first electrode 101 and the second electrode 102 so that quenching due to the proximity of the light-emitting region and a metal used for electrodes and carrier-injection layers can be prevented.

In order that transfer of energy from an exciton generated in the light-emitting layer can be suppressed, preferably, the hole-transport layer and the electron-transport layer that are in contact with the light-emitting layer 113, particularly a carrier-transport layer in contact with a side closer to the light-emitting region in the light-emitting layer 113, are formed using a substance having a wider band gap than the light-emitting substance of the light-emitting layer or the emission center substance included in the light-emitting layer.

A light-emitting element in this embodiment is preferably fabricated over a substrate of glass, plastic, or the like. As the way of stacking layers over the substrate, layers may be sequentially stacked from the first electrode 101 side or sequentially stacked from the second electrode 102 side. In a light-emitting device, although one light-emitting element may be fabricated over one substrate, a plurality of light-emitting elements may be formed over one substrate. With a plurality of light-emitting elements as described above fabricated over one substrate, a lighting device in which elements are separated or a passive-matrix light-emitting device can be fabricated. A light-emitting element may be fabricated over an electrode electrically connected to a transistor (FET), for example, that is formed over a substrate of glass, plastic, or the like, so that an active matrix light-emitting device in which the FET controls the drive of the light-emitting element can be fabricated. Note that the structure of the FET is not particularly limited. In addition, the kind and crystallinity of a semiconductor used for the FET is not particularly limited either; an amorphous semiconductor or a crystalline semiconductor may be used. In addition, a driver circuit formed in an FET substrate may be formed with an n-type FET and a p-type FET, or with either an n-type FET or a p-type FET.

Examples of a semiconductor that is used for the FET include Group IV semiconductors (e.g., silicon), Group III semiconductors (e.g., gallium), compound semiconductors, oxide semiconductors, and organic semiconductors. Oxide semiconductors are particularly preferable. Examples of the oxide semiconductor include an In—Ga oxide and an In-M-Zn oxide (M is Al, Ga, Y, Zr, La, Ce, or Nd). Note that an oxide semiconductor that has an energy gap of 2 eV or more, preferably 2.5 eV or more, further preferably 3 eV or more is preferably used for a transistor, in which case the off-state current of the transistors can be reduced.

Note that this embodiment can be combined with any of the other embodiments as appropriate.

Next, one mode a light-emitting element with a structure in which a plurality of light-emitting units are stacked (hereinafter also referred to as a stacked-type element) is described with reference to FIG. 1B. In this light-emitting element, a plurality of light-emitting units are provided between a first electrode and a second electrode. Each light-emitting unit has a structure similar to that of the EL layer 103, which is illustrated in FIG. 1A. In other words, the light-emitting element illustrated in FIG. 1A includes a single light-emitting unit; the light-emitting element in this embodiment includes a plurality of light-emitting units.

Figure 1B:
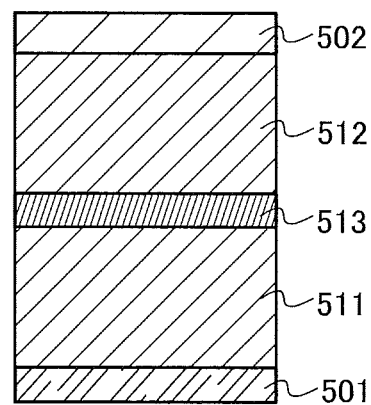

In FIG. 1B, a first light-emitting unit 511 and a second light-emitting unit 512 are stacked between a first electrode 501 and a second electrode 502, and a charge-generation layer 513 is provided between the first light-emitting unit 511 and the second light-emitting unit 512. The first electrode 501 and the second electrode 502 correspond, respectively, to the first electrode 101 and the second electrode 102 illustrated in FIG. 1A, and the materials given in the description for FIG. 1A can be used. Furthermore, the first light-emitting unit 511 and the second light-emitting unit 512 may have the same structure or different structures.

The charge-generation layer 513 contains a composite material of an organic compound and a metal oxide. As the composite material of the organic compound and the metal oxide, the composite material which can be used for the hole-injection layer 111 illustrated in FIG. 1A can be used. As the organic compound, any of a variety of compounds such as aromatic amine compounds, bipyridine compounds, aromatic hydrocarbons, and high molecular compounds (e.g., oligomers, dendrimers, and polymers) can be used. An organic compound having a hole mobility of $1 \times 10^{-6}$ cm$^2$/Vs or higher is preferably used. Note that any other substance may be used as long as the substance has a hole-transport property higher than an electron-transport property. The composite material of the organic compound and the metal oxide can achieve low-voltage driving and low-current driving because of the excellent carrier-injection property and carrier-transport property. Note that when a surface of a light-emitting unit on the anode side is in contact with a charge generation layer, the charge generation layer can also serve as a hole-transport layer of the light-emitting unit; thus, a hole-transport layer does not need to be formed in the light-emitting unit.

The charge generation layer 513 may have a stacked-layer structure of a layer containing the composite material of an organic compound and a metal oxide and a layer containing another material. For example, a layer containing a composite material of the organic compound and the metal oxide may be combined with a layer containing a compound of a substance selected from substances with an electron-donating property and a compound with a high electron-transport property. Moreover, a layer containing a composite material of the organic compound and the metal oxide may be combined with a transparent conductive film.

An electron-injection buffer layer may be provided between the charge-generation layer 513 and the light-emitting unit on the anode side of the charge-generation layer. The electron-injection buffer layer is a stack of a very thin film of an alkali metal and an electron-relay layer containing a substance having an electron-transport property. The very thin film of the alkali metal corresponds to the electron-injection layer 115 and has a function of lowering an electron injection barrier. The electron-relay layer has a function of preventing an interaction between the film of the alkali metal and the charge-generation layer and smoothly transferring electrons. The LUMO level of the substance having an electron-transport property contained in the electron-relay layer is set to be between the LUMO level of an acceptor substance in the charge-generation layer 513 and the LUMO level of a substance contained in a layer in contact with the electron-injection buffer layer in the light-emitting unit on the anode side. As a specific value of the energy level, the LUMO level of the substance having an electron-transport property contained in the electron-relay region is preferably higher than or equal to −5.0 eV, more preferably higher than or equal to −5.0 eV and lower than or equal to −3.0 eV. Note that as the substance having an electron-transport property in an electron-injection buffer region, a phthalocyanine-based material or a metal complex having a metal-oxygen bond and an aromatic ligand is preferably used. In that case, the film of the alkali metal of the electron-injection buffer layer serves as the electron-injection layer in the light-emitting unit on the anode side; thus, the electron-injection layer does not need to be formed over the light-emitting unit.

The charge generation layer 513 interposed between the first light-emitting unit 511 and the second light-emitting unit 512 may have any structure as long as electrons can be injected to a light-emitting unit on one side and holes can be injected to a light-emitting unit on the other side when a voltage is applied between the first electrode 501 and the second electrode 502. For example, in FIG. 1B, any layer can be used as the charge generation layer 513 as long as the layer injects electrons into the first light-emitting unit 511 and holes into the second light-emitting unit 512 when a voltage is applied such that the potential of the first electrode is higher than that of the second electrode.

The light-emitting element having two light-emitting units is described with reference to FIG. 1B; however, the present invention can be similarly applied to a light-emitting element in which three or more light-emitting units are stacked. With a plurality of light-emitting units partitioned by the charge generation layer between a pair of electrodes as in the light-emitting element of this embodiment, it is possible to provide a light-emitting element which can emit light with high luminance with the current density kept low and has a long lifetime. Moreover, it is possible to achieve a light-emitting device which can be driven at low voltage and has low power consumption.

By making the light-emitting units emit light of different colors from each other, the light-emitting element can provide light emission of a desired color as a whole. For example, in a light-emitting element having two light-emitting units, the emission colors of the first light-emitting unit are red and green and the emission color of the second light-emitting unit is blue, so that the light-emitting element can emit white light as the whole element.

The above-described structure can be combined with any of the structures in this embodiment and the other embodiments.

The light-emitting element of this embodiment that has the above-described structure can have high heat resistance, high emission efficiency, and be cost-effective.

Embodiment 3

In this embodiment, a light-emitting device that includes a light-emitting element containing any of the organic compounds described in Embodiment 1 is described.

Figure 2A:
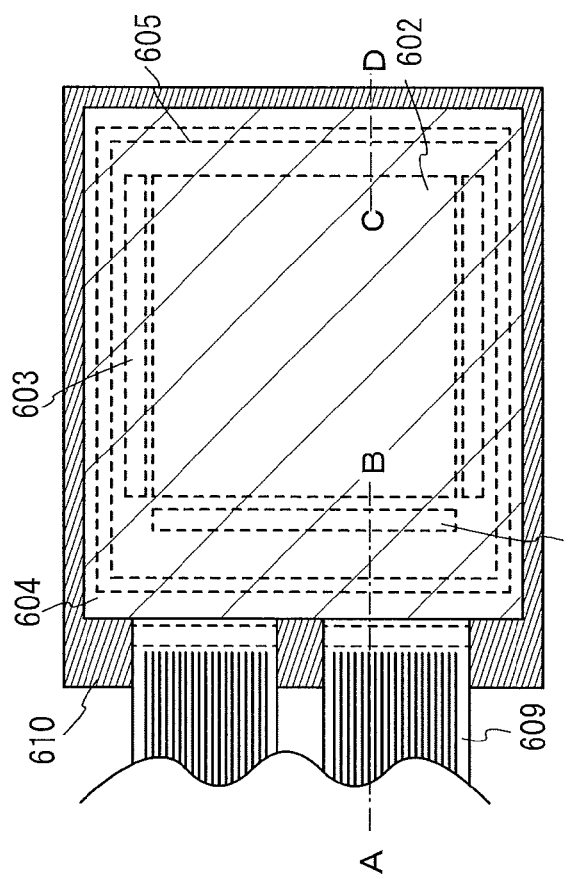
FIGS. 2A and 2B are conceptual diagrams of an active matrix light-emitting device.
Figure 2B:
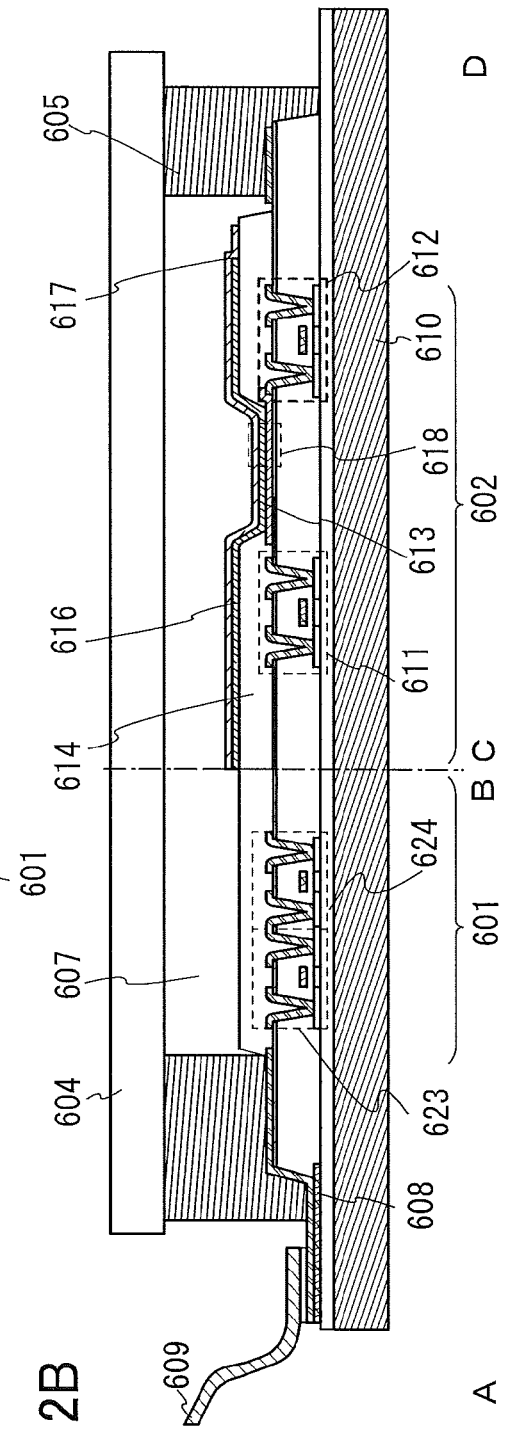

In this embodiment, the light-emitting device that includes the light-emitting element containing any of the organic compounds described in Embodiment 1 is described with reference to FIGS. 2A and 2B. Note that FIG. 2A is a top view illustrating the light-emitting device and FIG. 2B is a cross-sectional view taken along the lines A-B and C-D in FIG. 2A. This light-emitting device includes a driver circuit portion (source line driver circuit) 601, a pixel portion 602, and a driver circuit portion (gate line driver circuit) 603, which control light emission of the light-emitting element and denoted by dotted lines. A reference numeral 604 denotes a sealing substrate; 605, a sealant; and 607, a space surrounded by the sealant 605.

Note that a lead wiring 608 is a wiring for transmitting signals to be input to the source line driver circuit 601 and the gate line driver circuit 603 and for receiving a video signal, a clock signal, a start signal, a reset signal, and the like from an FPC (flexible printed circuit) 609 serving as an external input terminal. Reference numeral 608 denotes a wiring for transmitting signals to be input to the source line driver circuit 601 and the gate line driver circuit 603 and receiving signals such as a video signal, a clock signal, a start signal, and a reset signal from an FPC (flexible printed circuit) 609 serving as an external input terminal. Although only the FPC is illustrated here, the FPC may be provided with a printed wiring board (PWB). The light-emitting device in the present specification includes, in its category, not only the light-emitting device itself but also the light-emitting device provided with the FPC or the PWB.

Next, a cross-sectional structure is described with reference to FIG. 2B. The driver circuit portion and the pixel portion are formed over an element substrate 610. The source line driver circuit 601, which is a driver circuit portion, and one of the pixels in the pixel portion 602 are illustrated here.

In the source line driver circuit 601, a CMOS circuit is formed in which an n-channel FET 623 and a p-channel FET 624 are combined. In addition, the driver circuit may be formed with any of a variety of circuits such as a CMOS circuit, a PMOS circuit, and an NMOS circuit. Although a driver-integrated type in which a driver circuit is formed over a substrate is described in this embodiment, one embodiment of the present invention is not limited to this type, and the driver circuit can be formed outside the substrate.

The pixel portion 602 includes a plurality of pixels including a switching FET 611, a current controlling FET 612, and a first electrode 613 electrically connected to a drain of the current controlling FET 612. One embodiment of the present invention is not limited to the structure. The pixel portion 602 may include three or more FETs and a capacitor in combination.

An insulator 614 is formed to cover end portions of the first electrode 613. In this embodiment, the insulator 614 can be formed using a positive photosensitive acrylic resin film.

For favorable coverage, the insulator 614 is formed to have a curved surface with curvature at an upper end portion or a lower end portion thereof. For example, in the case of using positive type photosensitive acrylic as a material of the insulator 614, the insulator 614 is preferably formed to have a curved surface with a curvature radius (0.2 μm to 3 μm) only at the upper end portion. As the insulator 614, either a negative photosensitive resin or a positive photosensitive resin can be used.

An EL layer 616 and a second electrode 617 are formed over the first electrode 613. As a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack including a titanium nitride film and a film containing aluminum as its main component, a stack including three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has a structure similar to that described in Embodiment 2. As another material contained in the EL layer 616, any of low-molecular-weight compounds and high-molecular-weight compounds (including oligomers and dendrimers) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. In the case where light generated in the EL layer 616 passes through the second electrode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting element is formed with the first electrode 613, the EL layer 616, and the second electrode 617. The light-emitting element contains any of the organic compounds described in Embodiment 1. In the light-emitting device in this embodiment, the pixel portion, which includes a plurality of light-emitting elements, may include both the light-emitting element containing any of the organic compounds described in Embodiment 1 and a light-emitting element having a different structure.

The sealing substrate 604 is attached to the element substrate 610 with the sealant 605, so that the light-emitting element 618 is provided in the space 607 surrounded by the element substrate 610, the sealing substrate 604, and the sealant 605. The space 607 may be filled with filler, and may be filled with an inert gas (such as nitrogen or argon), or the sealant 605. It is preferable that the sealing substrate be provided with a recessed portion and the drying agent 625 be provided in the recessed portion, in which case deterioration due to influence of moisture can be suppressed.

An epoxy-based resin or glass frit is preferably used for the sealant 605. It is preferable that such a material not transmit moisture or oxygen as much as possible. As the sealing substrate 604, a glass substrate, a quartz substrate, or a plastic substrate formed of fiber reinforced plastic (FRP), poly(vinyl fluoride) (PVF), polyester, acrylic, or the like can be used.

In this manner, the light-emitting device fabricated using the light-emitting element containing any of the organic compounds described in Embodiment 1 can be obtained.

FIGS. 3A and 3B each illustrate an example of a light-emitting device in which full color display is achieved by forming a light-emitting element exhibiting white light emission and providing a coloring layer (a color filter) and the like. In FIG. 3A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition wall 1025, an EL layer 1028, a second electrode 1029 of the light-emitting elements, a sealing substrate 1031, a sealant 1032, and the like are illustrated.

In FIG. 3A, coloring layers (a red coloring layer 1034R, a green coloring layer 1034G, and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 3A, light emitted from part of the light-emitting layer does not pass through the coloring layers, while light emitted from the other part of the light-emitting layer passes through the coloring layers. Since light that does not pass through the coloring layers is white and light that passes through any one of the coloring layers is red, blue, or green, an image can be displayed using pixels of the four colors.

FIG. 3B illustrates an example in which the coloring layers (the red coloring layer 1034R, the green coloring layer 1034G, and the blue coloring layer 1034B) are provided between the gate insulating film 1003 and the first interlayer insulating film 1020. As shown in FIG. 3B, the coloring layers may be provided between the substrate 1001 and the sealing substrate 1031.

Figure 4:
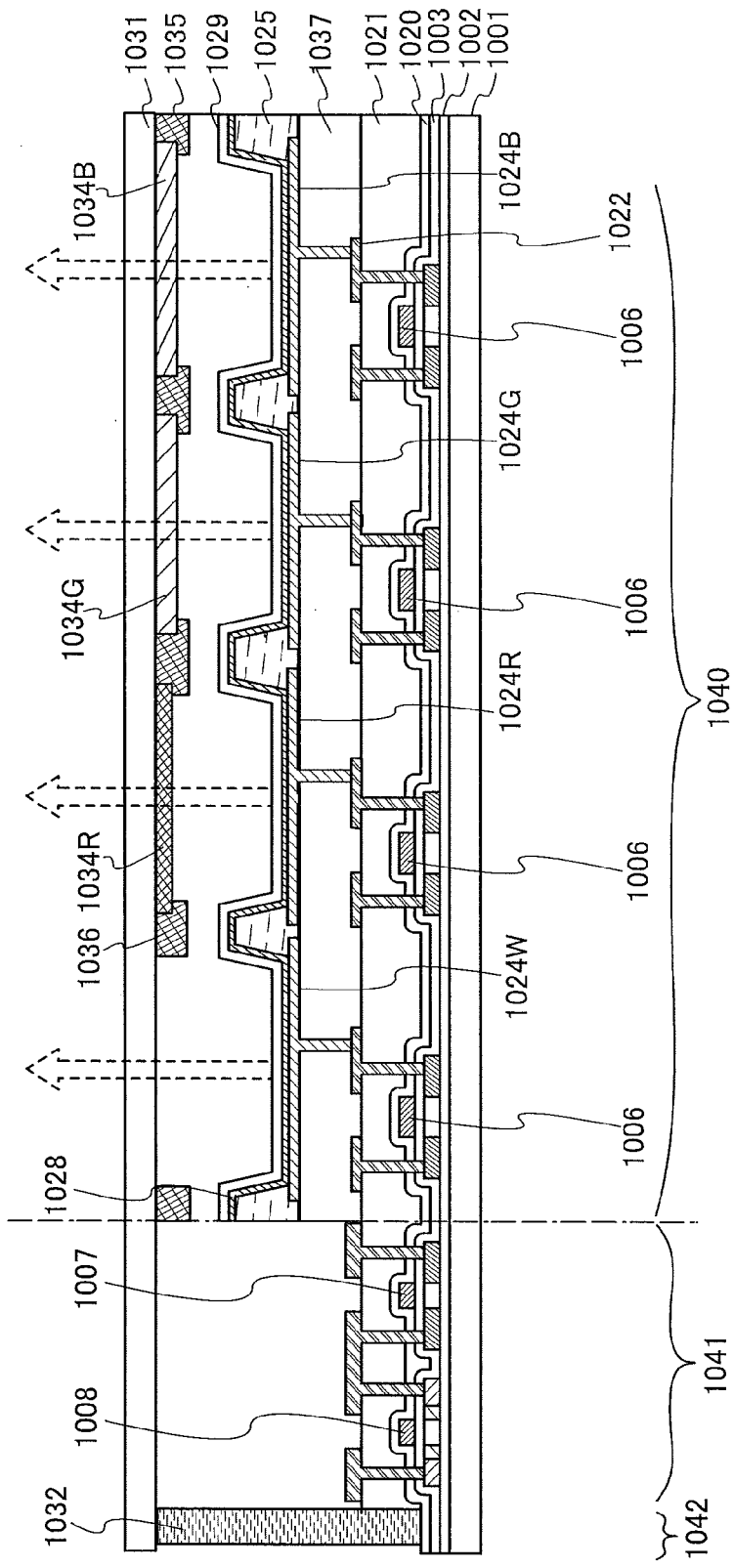
FIG. 4 is a conceptual diagram of an active matrix light-emitting device.

The above-described light-emitting device has a structure in which light is extracted from the substrate 1001 side where the FETs are formed (a bottom emission structure), but may have a structure in which light is extracted from the sealing substrate 1031 side (a top emission structure). FIG. 4 is a cross-sectional view of a light-emitting device having a top emission structure. In this case, a substrate that does not transmit light can be used as the substrate 1001. The process up to the step of forming of a connection electrode which connects the FET and the anode of the light-emitting element is performed in a manner similar to that of the light-emitting device having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any other materials.

The first electrodes 1024W, 1024R, 1024G, and 1024B of the light-emitting elements each serve as an anode here, but may serve as a cathode. In the case of a light-emitting device having a top emission structure as illustrated in FIG. 4, the first electrodes are preferably reflective electrodes. The EL layer 103 is formed to have a structure similar to the structure of the EL layer described in Embodiment 2, with which white light emission can be obtained.

In the case of a top emission structure as illustrated in FIG. 4, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (the black matrix) 1035 that is positioned between pixels. The coloring layers (the red coloring layer 1034R, the green coloring layer 1034G, and the blue coloring layer 1034B) and the black layer (the black matrix) may be covered with the overcoat layer. Note that a light-transmitting substrate is used as the sealing substrate 1031.

Although an example in which full color display is performed using four colors of red, green, blue, and white is shown here, there is no particular limitation and full color display using three colors of red, green, and blue may be performed.

Since the light-emitting device of this embodiment includes the light-emitting element containing any of the organic compounds described in Embodiment 1, the light-emitting device can have good characteristics. Specifically, since the light-emitting element containing any of the organic compounds described in Embodiment 1 has high heat resistance, the light-emitting device can have high heat resistance. In addition, since the light-emitting element is easily mass-produced, the light-emitting device can be provided at low cost.

Figure 5A:
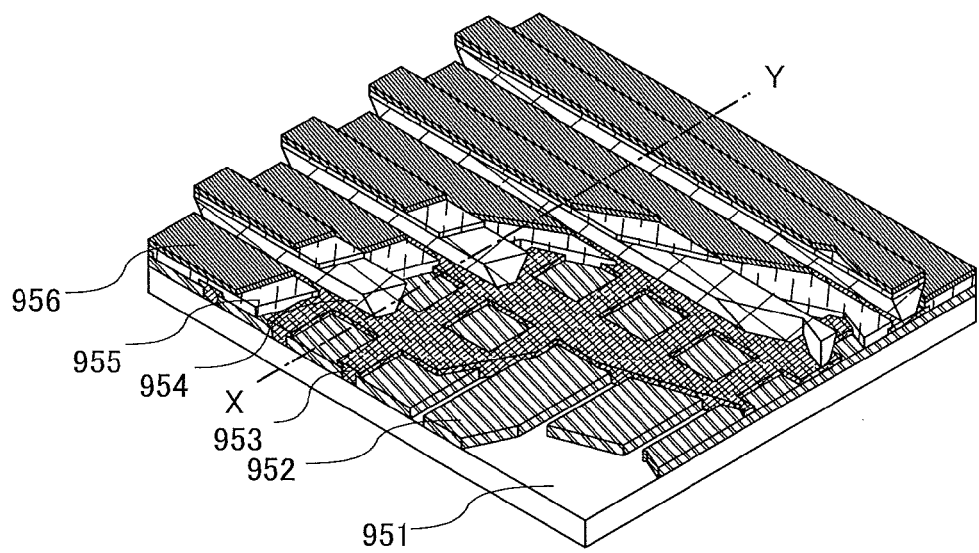
FIGS. 5A and 5B are conceptual diagrams of a passive matrix light-emitting device.
Figure 5B:
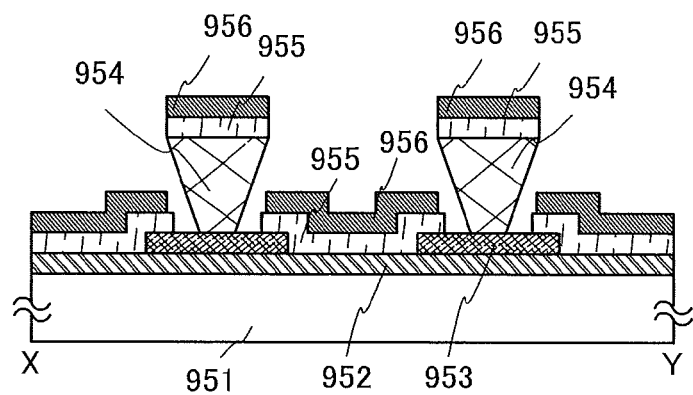

An active matrix light-emitting device is described above, whereas a passive matrix light-emitting device is described below. FIGS. 5A and 5B illustrate a passive matrix light-emitting device fabricated using the present invention. FIG. 5A is a perspective view of the light-emitting device, and FIG. 5B is a cross-sectional view taken along the line X-Y in FIG. 5A. In FIGS. 5A and 5B, an EL layer 955 is provided between an electrode 952 and an electrode 956 over a substrate 951. An end portion of the electrode 952 is covered with an insulating layer 953. In addition, a partition layer 954 is provided over the insulating layer 953. The sidewalls of the partition layer 954 slope so that the distance between one sidewall and the other sidewall gradually decreases toward the surface of the substrate. In other words, a cross section taken along the direction of the short side of the partition layer 954 is trapezoidal, and the base (a side which is in the same direction as a plane direction of the insulating layer 953 and in contact with the insulating layer 953) is shorter than the upper side (a side which is in the same direction as the plane direction of the insulating layer 953 and not in contact with the insulating layer 953). By providing the partition layer 954 in such a manner, a defect of the light-emitting element due to static electricity or the like can be prevented. The passive-matrix light-emitting device also includes the light-emitting element containing any of the organic compounds described in Embodiment 1, and thus can have high heat resistance.

Since many minute light-emitting elements arranged in a matrix in the light-emitting device described above can each be controlled, the light-emitting device can be suitably used as a display device for displaying images.

This embodiment can be freely combined with any of other embodiments.

Embodiment 4

Figure 6A:
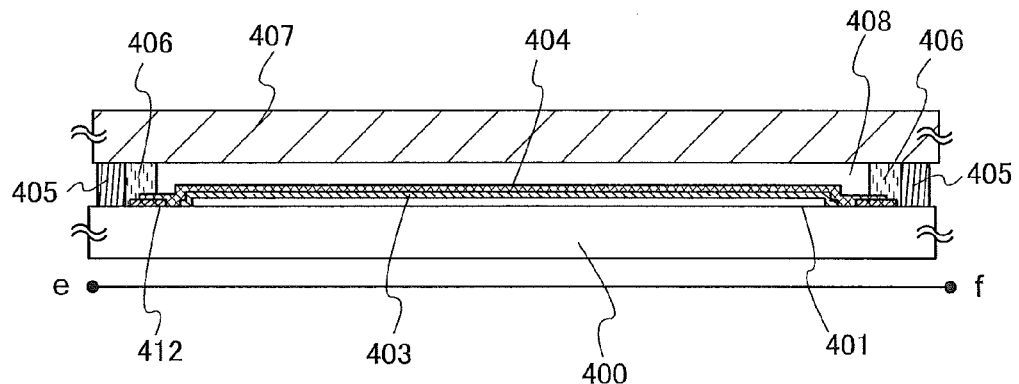
FIGS. 6A and 6B illustrate a lighting device.
Figure 6B:
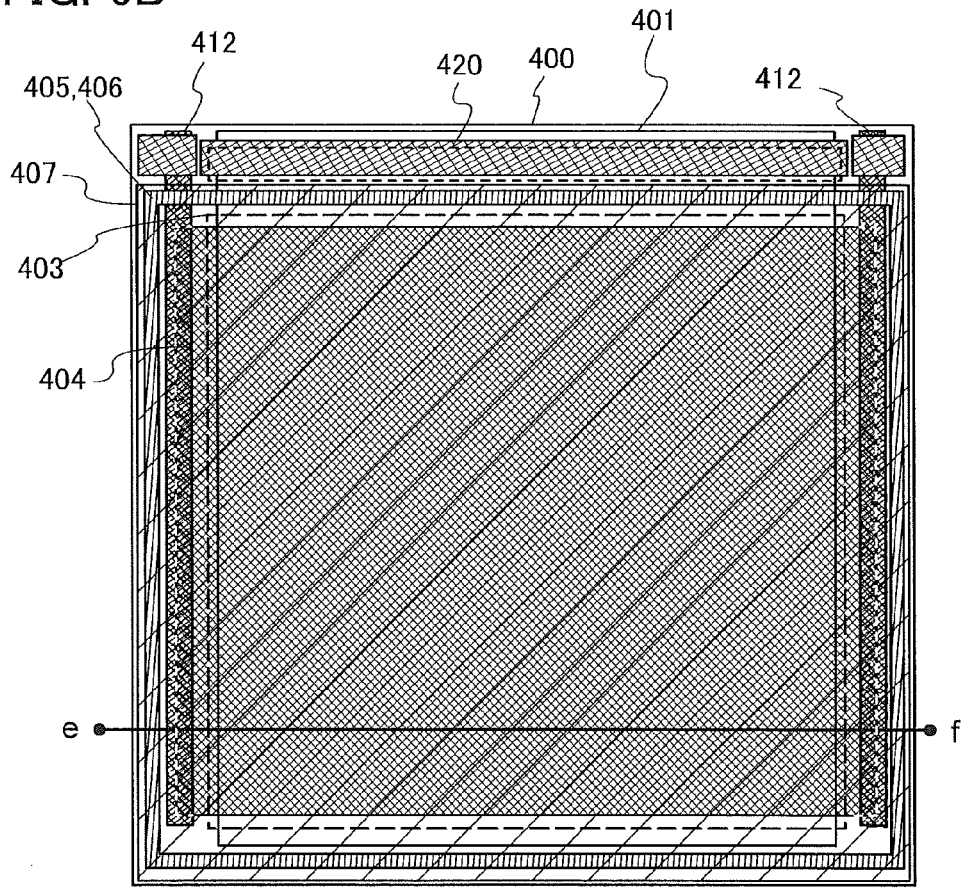

In this embodiment, an example in which a light-emitting element containing any of the organic compounds described in Embodiment 1 is used for a lighting device is described with reference to FIGS. 6A and 6B. FIG. 6B is a top view of the lighting device, and FIG. 6A is a cross-sectional view of taken along the line e-f in FIG. 6B.

In the lighting device in this embodiment, a first electrode 401 is formed over a substrate 400 which is a support and has a light-transmitting property. The first electrode 401 corresponds to the first electrode 101 in Embodiment 1. When light is extracted through the first electrode 401 side, the first electrode 401 is formed using a material having a light-transmitting property.

A pad 412 for applying voltage to a second electrode 404 is provided over the substrate 400.

An EL layer 403 is formed over the first electrode 401. The structure of the EL layer 403 corresponds to, for example, the structure of the EL layer 103 in Embodiment 1, or the structure in which the light-emitting units 511 and 512 and the charge-generation layer 513 are combined. For these structures, the description in Embodiment 1 can be referred to.

The second electrode 404 is formed to cover the EL layer 403. The second electrode 404 corresponds to the second electrode 102 in Embodiment 1. The second electrode 404 is formed using a material having high reflectance when light is extracted through the first electrode 401 side. The second electrode 404 is connected to the pad 412, whereby voltage is applied thereto.

As described above, the lighting device described in this embodiment includes a light-emitting element including the first electrode 401, the EL layer 403, and the second electrode 404. Since the light-emitting element has high emission efficiency, the lighting device in this embodiment can have low power consumption.

The light-emitting element having the above structure is fixed to a sealing substrate 407 with sealants 405 and 406 and sealing is performed, whereby the lighting device is completed. It is possible to use only either the sealant 405 or the sealant 406. In addition, the inner sealant 406 (not illustrated in FIG. 6B) can be mixed with a desiccant that enables moisture to be adsorbed, which results in improved reliability.

When parts of the pad 412 and the first electrode 401 are extended to the outside of the sealants 405 and 406, the extended parts can serve as external input terminals. An IC chip 420 mounted with a converter or the like may be provided over the external input terminals.

Since in the lighting device of this embodiment, the light-emitting element containing any of the organic compounds described in Embodiment 1 is used as the EL element as described above, the lighting device can have high heat resistance.

Embodiment 5

In this embodiment, examples of electronic appliances that include a light-emitting element containing any of the organic compounds described in Embodiment 1 are described. Since the light-emitting element containing any of the organic compounds described in Embodiment 1 has high heat resistance, the electronic appliances described in this embodiment each can include a light-emitting portion with high reliability.

Examples of the electronic appliance to which the above light-emitting element is applied include television devices (also referred to as TV or television receivers), monitors for computers and the like, cameras such as digital cameras and digital video cameras, digital photo frames, mobile phones (also referred to as cellular phones or cellular phone devices), portable game machines, portable information terminals, audio playback devices, and large game machines such as pachinko machines. Specific examples of these electronic appliances are given below.

FIG. 7A illustrates an example of a television device. In the television device, a display portion 7103 is incorporated in a housing 7101. In addition, here, the housing 7101 is supported by a stand 7105. Images can be displayed on the display portion 7103 where the light-emitting elements containing any of the organic compounds described in Embodiment 1 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the receiver, general television broadcasts can be received. Moreover, when the display device is connected to a communication network with or without wires via the modem, one-way (from a sender to a receiver) or two-way (between a sender and a receiver or between receivers) data communication can be performed.

FIG. 7B 1 illustrates a computer that includes a main body 7201, a housing 7202, a display portion 7203, a keyboard 7204, an external connection port 7205, a pointing device 7206, and the like. Note that this computer is manufactured by using light-emitting elements arranged in a matrix in the display portion 7203, which are the same as that described in Embodiment 2. The computer illustrated in FIG. 7B 1 may have a structure illustrated in FIG. 7B2. A computer illustrated in FIG. 7B2 is provided with a second display portion 7210 instead of the keyboard 7204 and the pointing device 7206. The second display portion 7210 is a touch screen, and input can be performed by operation of display for input on the second display portion 7210 with a finger or a dedicated pen. The second display portion 7210 can also display images other than the display for input. The display portion 7203 may also be a touchscreen. Connecting the two screens with a hinge can prevent troubles; for example, the screens can be prevented from being cracked or broken while the computer is being stored or carried.

FIG. 7C illustrates a portable game machine that includes two housings, a housing 7301 and a housing 7302, which are connected with a joint portion 7303 so that the portable game machine can be opened or folded. The housing 7301 incorporates a display portion 7304 including the light-emitting elements containing any of the organic compounds described in Embodiment 1 and arranged in a matrix, and the housing 7302 incorporates a display portion 7305. In addition, the portable game machine illustrated in FIG. 7C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. Needless to say, the structure of the portable game machine is not limited to the above structure as long as the display portion including the light-emitting elements that contain any of the organic compounds described in Embodiment 1 and are arranged in a matrix is used as at least either the display portion 7304 or the display portion 7305, or both, and the structure can include other accessories as appropriate. The portable game machine illustrated in FIG. 7C has a function of reading out a program or data stored in a storage medium to display it on the display portion, and a function of sharing information with another portable game machine by wireless communication. The portable game machine illustrated in FIG. 7C can have a variety of functions without limitation to the above functions.

FIG. 7D illustrates an example of a mobile phone. The mobile phone is provided with a display portion 7402 incorporated in a housing 7401, an operation button 7403, an external connection port 7404, a speaker 7405, a microphone 7406, and the like. Note that the mobile phone 7400 has the display portion 7402 including the light-emitting elements that contain any of the organic compounds described in Embodiment 1 and are arranged in a matrix.

When the display portion 7402 of the mobile phone illustrated in FIG. 7D is touched with a finger or the like, data can be input into the mobile phone. In this case, operations such as making a call and creating an e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input Mode in which two modes of the display mode and the input mode are combined.

For example, in the case of making a call or composing an e-mail, a text input mode mainly for inputting text is selected for the display portion 7402 so that text displayed on a screen can be inputted. In this case, it is preferable to display a keyboard or number buttons on almost the entire screen of the display portion 7402.

When a detection device which includes a sensor for detecting inclination, such as a gyroscope or an acceleration sensor, is provided inside the mobile phone, the direction of the mobile phone (whether the mobile phone is placed horizontally or vertically for a landscape mode or a portrait mode) is determined so that display on the screen of the display portion 7402 can be automatically switched.

The screen modes are switched by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. In addition, by providing a backlight or a sensing light source that emits a near-infrared light in the display portion, an image of a finger vein, a palm vein, or the like can be taken.

Note that the structure described in this embodiment can be combined with any of the structures described in Embodiments 1 to 4 as appropriate.

As described above, the application range of the light-emitting device that includes the light-emitting element containing any of the organic compounds described in Embodiment 1 is so wide that the light-emitting device can be used for electronic appliances in a variety of fields. The use of the light-emitting element containing any of the organic compounds described in Embodiment 1 enables an electronic appliance with high heat resistance to be provided.

Figure 8:
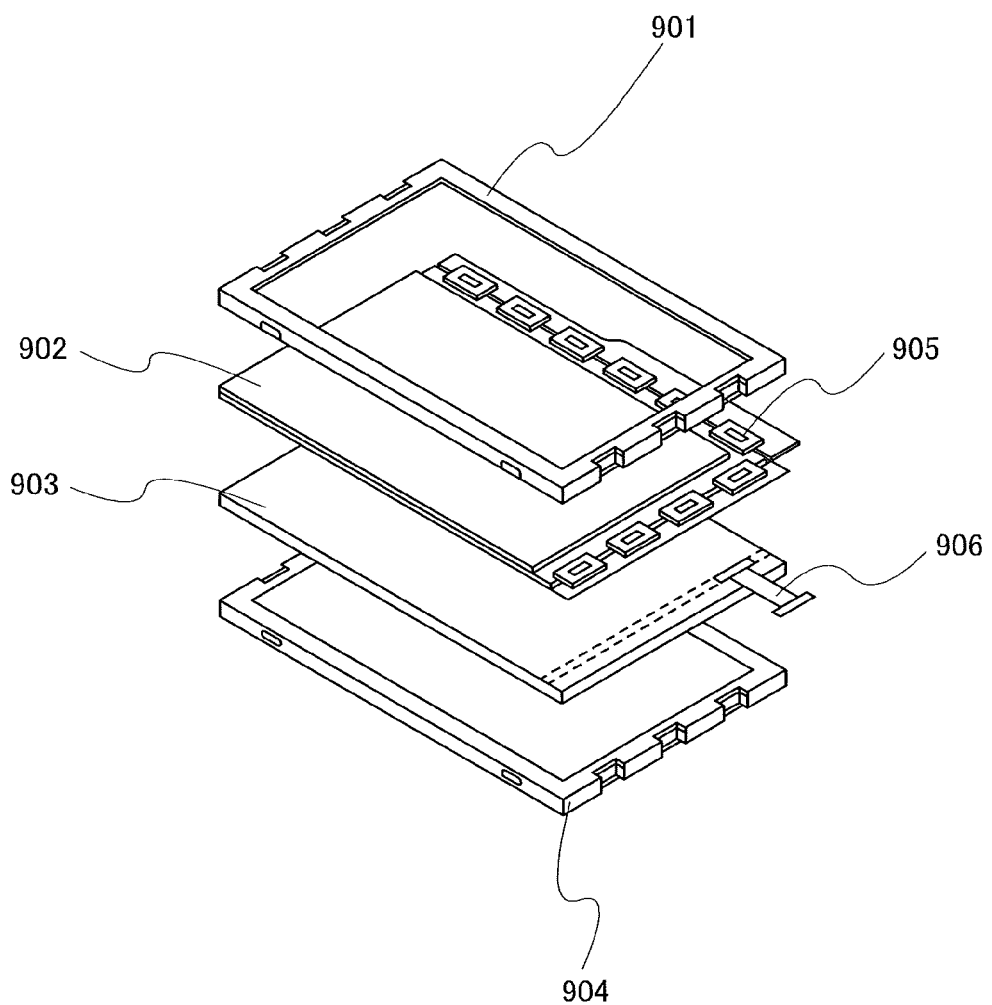
FIG. 8 illustrates a light source device.

FIG. 8 illustrates an example of a liquid crystal display device in which the light-emitting element containing any of the organic compounds described in Embodiment 1 is used for a backlight. The liquid crystal display device illustrated in FIG. 8 includes a housing 901, a liquid crystal layer 902, a backlight unit 903, and a housing 904. The liquid crystal layer 902 is connected to a driver IC 905. The light-emitting element containing any of the organic compounds described in Embodiment 1 is used for the backlight unit 903, to which current is supplied through a terminal 906.

The light-emitting element containing any of the organic compounds described in Embodiment 1 is used for the backlight of the liquid crystal display device, so that the backlight can have reduced power consumption. In addition, the use of the light-emitting element described in Embodiment 2 enables fabrication of a planar-emission lighting device and further a larger-area planar-emission lighting device; thus, the backlight can be a larger-area backlight, and the liquid crystal display device can also be a larger-area device. Furthermore, the light-emitting device that includes the light-emitting element described in Embodiment 2 can be thinner than a conventional one; accordingly, the display device can also be thinner.

Figure 9:
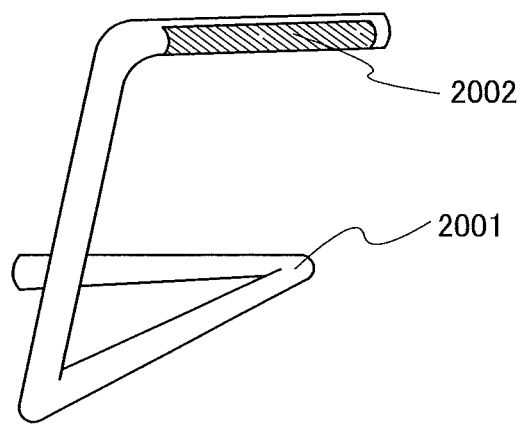
FIG. 9 illustrates a lighting device.

FIG. 9 illustrates an example in which the light-emitting element that contains any of the organic compounds described in Embodiment 1 is used for a table lamp that is a lighting device. The table lamp illustrated in FIG. 9 includes a housing 2001 and a light source 2002. The lighting device described in Embodiment 4 is used for the light source 2002.

Figure 10:
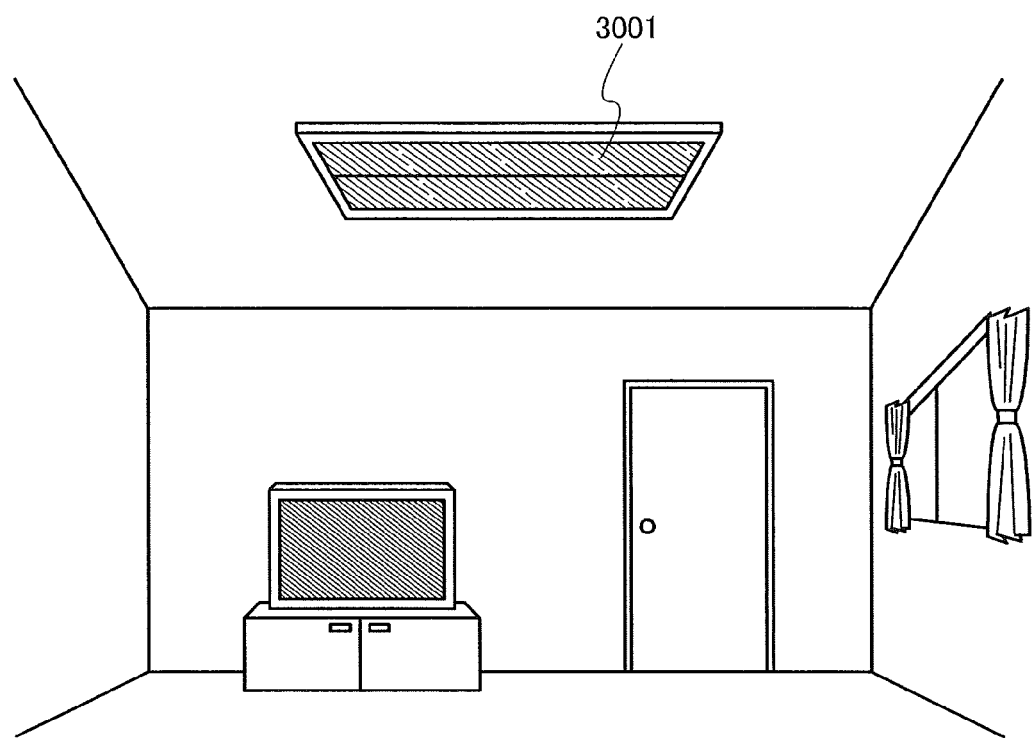
FIG. 10 illustrates a lighting device.

FIG. 10 illustrates an example in which the light-emitting element containing any of the organic compounds described in Embodiment 1 is used for an indoor lighting device 3001. Since the light-emitting element containing any of the organic compounds described in Embodiment 1 has high heat resistance, the lighting device can have high heat resistance. Since the light-emitting element containing any of the organic compounds described in Embodiment 1 can have a large area, the light-emitting element can be used for a large-area lighting device. In addition, since the light-emitting element containing any of the organic compounds described in Embodiment 1 is thin, the light-emitting element can be used for a lighting device having a reduced thickness.

Figure 11:
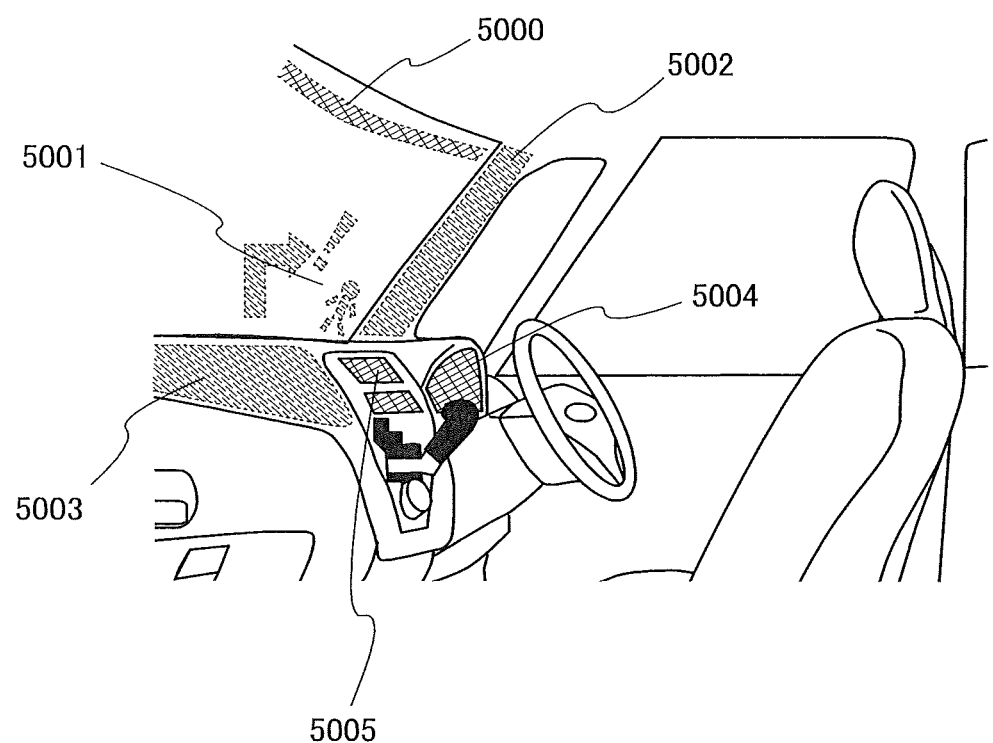
FIG. 11 illustrates in-vehicle display devices and lighting devices.

The light-emitting element containing any of the organic compounds described in Embodiment 1 can also be used for an automobile windshield or an automobile dashboard. FIG. 11 illustrates one mode in which the light-emitting element described in Embodiment 2 is used for an automobile windshield and an automobile dashboard. Display regions 5000 to 5005 each include the light-emitting element containing any of the organic compounds described in Embodiment 1.

The display region 5000 and the display region 5001 are provided in the automobile windshield in which the light-emitting elements containing any of the organic compounds described in Embodiment 1 are incorporated. The light-emitting element containing any of the organic compounds described in Embodiment 1 can be formed into what is called a see-through display device, through which the opposite side can be seen, by including a first electrode and a second electrode formed of electrodes having light-transmitting properties. Such a see-through display device does not hinder the vision and thus can be provided in the automobile windshield. Note that in the case where a transistor for driving or the like is provided, a transistor having a light-transmitting property, such as an organic transistor using an organic semiconductor material or a transistor using an oxide semiconductor, is preferably used.

A display region 5002 is a display device provided in a pillar portion in which the light-emitting element containing any of the organic compounds described in Embodiment 1 is incorporated. The display region 5002 can compensate for the view hindered by the pillar portion by showing an image taken by an imaging unit provided in the car body. Similarly, the display region 5003 provided in the dashboard can compensate for the view hindered by the car body by showing an image taken by an imaging unit provided in the outside of the car body, which leads to elimination of blind areas and enhancement of safety. Showing an image so as to compensate for the area that a driver cannot see, makes it possible for the driver to confirm safety easily and comfortably.

The display region 5004 and the display region 5005 can provide a variety of kinds of information such as navigation data, a speedometer, a tachometer, a mileage, a fuel meter, a gearshift indicator, and air-condition setting. The contents or layout of the display can be changed by a user as appropriate. Note that such information can also be shown by the display regions 5000 to 5003. The display regions 5000 to 5005 can also be used as lighting devices.

The light-emitting element containing any of the organic compounds described in Embodiment 1 can have high heat resistance. This enables the light-emitting element containing any of the organic compounds described in Embodiment 1 can be suitably used for an in-vehicle light-emitting device or lighting device that is likely to be placed in a very high-temperature environment in midsummer or the like.

Figure 12A:
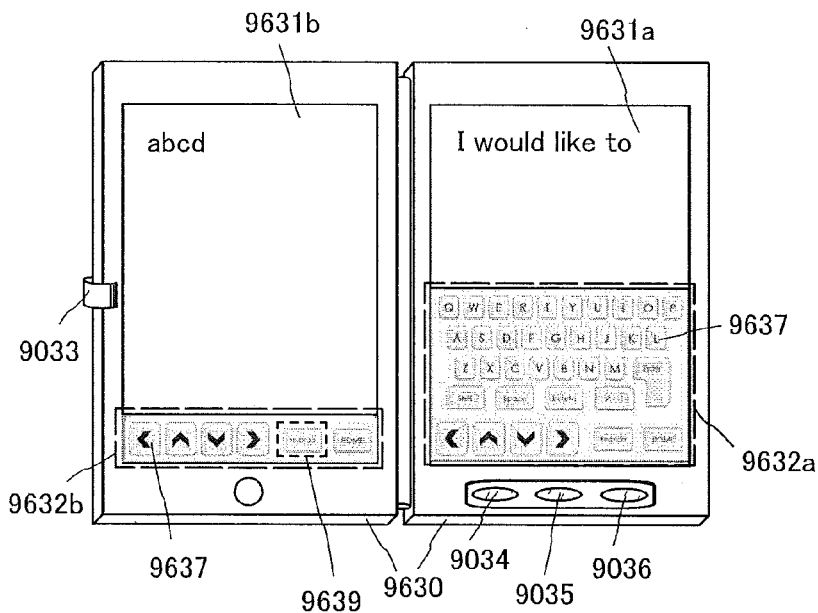
FIGS. 12A to 12C illustrate an electronic appliance.
Figure 12B:
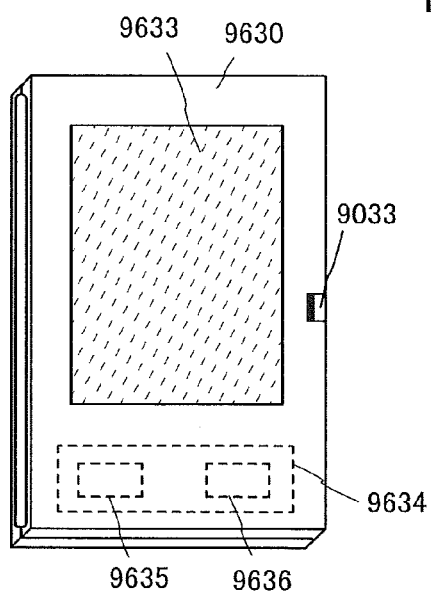

FIGS. 12A and 12B illustrate an example of a foldable tablet terminal. In FIG. 12A, the tablet terminal is opened and includes a housing 9630, a display portion 9631a, a display portion 9631b, a display-mode switching button 9034, a power button 9035, a power-saving-mode switching button 9036, a clip 9033, and an operation button 9038. Note that in the tablet terminal, one or both of the display portion 9631a and the display portion 9631b is/are formed using a light-emitting device that includes a light-emitting element containing any of the organic compounds described in Embodiment 1.

Part of the display portion 9631a can be a touchscreen region 9632a and data can be input when a displayed operation key 9637 is touched. Although a structure in which a half region in the display portion 9631a has only a display function and the other half region also has a touchscreen function is illustrated as an example, the structure of the display portion 9631a is not limited thereto. The whole area of the display portion 9631a may have a touchscreen function. For example, the whole area of the display portion 9631a can display keyboard buttons and serve as a touchscreen while the display portion 9631b can be used as a display screen.

Like the display portion 9631a, part of the display portion 9631b can be a touchscreen region 9632b. When a switching button 9639 for showing/hiding a keyboard on the touchscreen is touched with a finger, a stylus, or the like, the keyboard can be displayed on the display portion 9631b.

Touch input can be performed concurrently on the touchscreen regions 9632a and 9632b.

The display-mode switching button 9034 allows switching between a portrait mode and a landscape mode, and between monochrome display and color display, for example. With the power-saving-mode switching button 9036, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 12A, one embodiment of the present invention is not limited to this example. The display portion 9631a and the display portion 9631b may have different areas or different display quality. For example, one of them may be a display panel that can display higher-definition images than the other.

In FIG. 12B, the tablet terminal is folded and includes the housing 9630, a solar cell 9633, a charge and discharge control circuit 9634, a battery 9635, and a DC-to-DC converter 9636. Note that FIG. 12B illustrates an example in which the charge and discharge control circuit 9634 includes the battery 9635 and the DC-to-DC converter 9636.

Since the tablet terminal is foldable, the housing 9630 can be closed when the tablet terminal is not used. Thus, the display portions 9631a and 9631b can be protected, whereby a tablet terminal with high endurance and high reliability for long-term use can be provided.

The tablet terminal illustrated in FIGS. 12A and 12B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar cell 9633, which is attached on the surface of the tablet terminal, supplies electric power to a touchscreen, a display portion, an image signal processor, and the like. Note that the solar cell 9633 is preferably provided on one or two surfaces of the housing 9630, in which case the battery 9635 can be charged efficiently.

Figure 12C:
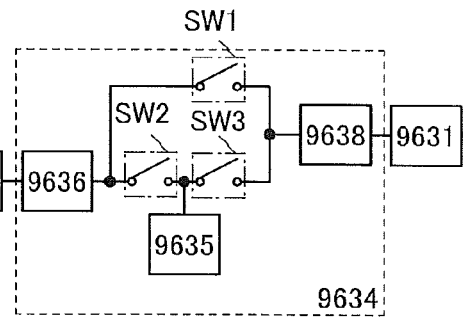

The structure and operation of the charge and discharge control circuit 9634 illustrated in FIG. 12B are described with reference to a block diagram of FIG. 12C. FIG. 12C illustrates the solar cell 9633, the battery 9635, the DC-to-DC converter 9636, a converter 9638, switches SW1 to SW3, and the display portion 9631. The battery 9635, the DC-to-DC converter 9636, the converter 9638, and the switches SW1 to SW3 correspond to the charge and discharge control circuit 9634 in FIG. 12B.

First, an example of operation in the case where power is generated by the solar cell 9633 using external light is described. The voltage of power generated by the solar cell is raised or lowered by the DC-to-DC converter 9636 so that the power has voltage for charging the battery 9635. Then, when power supplied from the battery 9635 charged by the solar cell 9633 is used for the operation of the display portion 9631, the switch SW1 is turned on and the voltage of the power is raised or lowered by the converter 9638 so as to be voltage needed for the display portion 9631. In addition, when display on the display portion 9631 is not performed, the switch SW1 is turned off and a switch SW2 is turned on so that charge of the battery 9635 may be performed.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module that is capable of charging by transmitting and receiving power by wireless (without contact), or another charge means used in combination, and the power generation means is not necessarily provided.

One embodiment of the present invention is not limited to the tablet terminal having the shape illustrated in FIGS. 12A to 12C as long as the display portion 9631 is included.

Example 1

In this example, a method of synthesizing 2-{3-[6-(dibenzothiophen-4-yl)dibenzothiophen-4-yl]phenyl}dibenzo[f,h]quinoxaline (abbreviation: 2m(DBt2)PDBq) that is the organic compound of one embodiment of the present invention described in Embodiment 1 is described in detail.

Step 1: Synthesis of 4,4'-bidibenzothiophene

Into a 500-mL three-neck flask were put 4.7 g (15 mmol) of 4-iododibenzothiophene, 3.6 g (16 mmol) of dibenzothiophene-4-boronic acid, and 91 mg (0.30 mmol) of tris(2-methylphenyl)phosphine, and the air in the flask was replaced with nitrogen. To this mixture were added 50 mL of toluene, 25 mL of ethanol, and 15 mL of an aqueous solution of potassium carbonate (2.0 mol/L). This mixture was degassed by being stirred while the pressure was reduced. To this mixture, 34 mg (0.15 mmol) of palladium(II) acetate was added. This mixture was stirred at 80° C. under a nitrogen stream for 3 hours to precipitate a solid. The precipitated solid was collected by suction filtration. The aqueous layer of the obtained filtrate was subjected to extraction with toluene, and the extracted solution and the organic layer were combined and washed with saturated brine. The organic layer was dried with magnesium sulfate, and this mixture was gravity-filtered. A solid obtained by concentrating the resulting filtrate and the solid collected by suction filtration were dissolved in approximately 100 mL of toluene. This solution was suction-filtered through Celite (Catalog No. 531-16855, produced by Wako Pure Chemical Industries, Ltd.), alumina, and Florisil (Catalog No. 540-00135, produced by Wako Pure Chemical Industries, Ltd). A solid obtained by concentrating the resulting filtrate was recrystallized from toluene/hexane to give 4.9 g of a white solid, which was an objective substance, in 90% yield. Synthesis Scheme (a-1) of Step 1 is shown below.

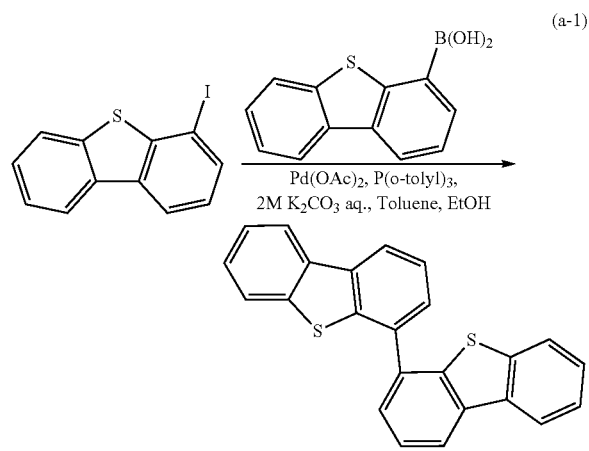

Step 2: Synthesis of 4,4'-bidibenzothiophene-6-boronic acid

Into a 500-mL three-neck flask was put 5.0 g (13 mmol) of 4,4'-bidibenzothiophene, and the air in the flask was replaced with nitrogen. Into this flask was put 100 mL of tetrahydrofuran (THF), and this solution was cooled down to −80° C. To this solution, 8.7 mL (14 mmol) of n-butyllithium (a 1.6 mol/L hexane solution) was dripped with a syringe. After the dripping, this solution was stirred for 2 hours while its temperature was returned to room temperature. After the stirring, this solution was cooled down to −80° C. To this solution, 1.9 mL (17 mmol) of trimethyl borate was added, and the mixture was stirred for 18 hours while its temperature was returned to room temperature. After the stirring, approximately 50 mL of dilute hydrochloric acid (1.0 mol/L) was added to this solution, followed by stirring for 1 hour. After the stirring, the aqueous layer of this mixture was extracted with ethyl acetate, and the extracted solution and the organic layer were combined and washed with a saturated aqueous solution of sodium hydrogen carbonate and saturated brine. The organic layer was dried with magnesium sulfate, and then this mixture was gravity-filtered. The resulting filtrate was concentrated to give a white solid. This solid was washed with 100 mL of hot toluene to give 2.6 g of white powder, which was an objective substance, in 50% yield. Synthesis Scheme (a-2) of Step 2 is shown below.

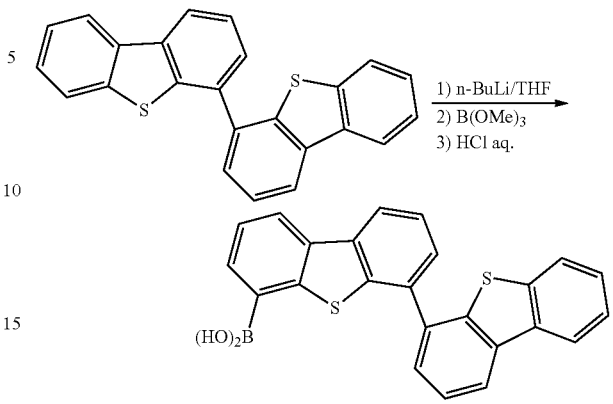

The obtained compound was analyzed by liquid chromatography mass spectrometry (LC/MS). The analysis by LC/MS was carried out with Acquity UPLC (manufactured by Waters Corporation), and Xevo G2 Tof MS (manufactured by Waters Corporation).

In the MS, ionization was carried out by an electrospray ionization (abbreviation: ESI) method. At this time, the capillary voltage and the sample cone voltage were set to 3.0 kV and 30 V, respectively, and detection was performed in a positive mode. A component that underwent the ionization under the above-described conditions was collided with an argon gas in a collision cell to dissociate into product ions. The energy (collision energy) for the collision with argon was 6.0 eV. The mass range for the measurement was m/z=100 to 1200.

Figure 13:
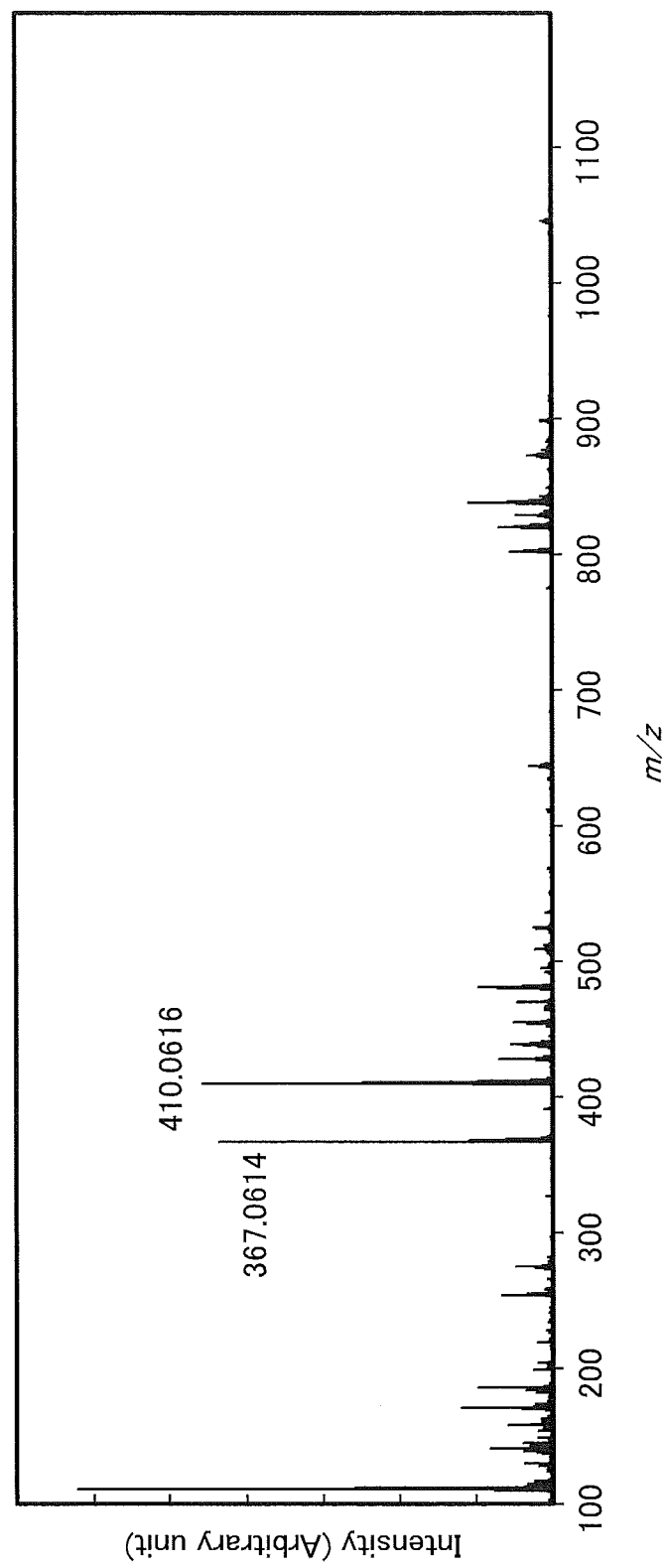
FIG. 13 shows results of LC/MS analysis of 4,4-bidibenzothiophene-6-boronic acid.

Measurement results are shown in FIG. 13. The results in FIG. 13 show that the product ions of 4,4'-bidibenzothiophene-6-boronic acid are detected mainly around m/z=410 and around m/z=367. Note that the product ion detected around m/z=367 can be presumed to be a product ion of a cation of a bidibenzothiophene ring.

Step 3: Synthesis of 3: 2-{3-[6-(dibenzothiophen-4-yl)dibenzothiophen-4-yl]phenyl}dibenzo[f,h]quinoxaline (Abbreviation: 2m(DBt2)PDBq)

Into a 200-mL three-neck flask were put 2.3 g (6.0 mmol) of 2-(3-bromophenyl)dibenzo[f,h]quinoxaline, 2.7 g (6.5 mmol) of 4,4'-bidibenzothiophene-6-boronic acid, and 0.18 g (0.60 mmol) of tris(2-methylphenyl)phosphine, and the air in the flask was replaced with nitrogen. To this mixture were added 22 mL of toluene, 8.0 mL of ethanol, and 6.0 mL of an aqueous solution of potassium carbonate (2.0 mol/L). This mixture was degassed by being stirred while the pressure was reduced. To this mixture was added 67 mg (0.30 mmol) of palladium(II) acetate. This mixture was stirred at 80° C. under a nitrogen stream for 6 hours to precipitate a solid. The precipitated solid was collected by suction filtration. The collected solid was dissolved in approximately 1.5 L of hot toluene, and this solution was suction-filtered through Celite, alumina, and Florisil. The obtained filtrate was concentrated to give a solid. The solid was purified by HPLC to give a white solid. The obtained white solid was washed with hot toluene to give 1.4 g of white powder, which was an objective substance, in 35% yield. Synthesis Scheme (a-3) of Step 3 is shown below.

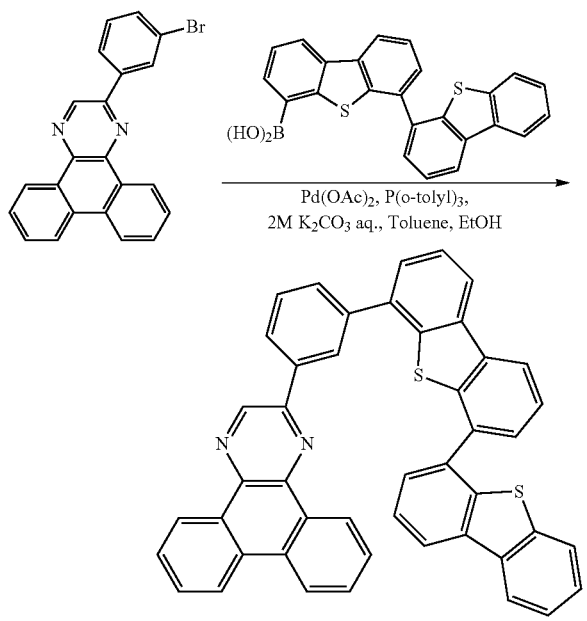

(a-3)

By a train sublimation method, 1.4 g of the obtained white powder was purified. In the purification by sublimation, 2m(DBt2)PDBq was heated at 330° C. under a pressure of 10 Pa with an argon flow rate of 5.0 mL/min to give 1.2 g of a light yellow glassy solid of 2m(DBt2)PDBq at a collection rate of 81%.

The obtained substance was measured by $^1$H NMR. Measurement results are as follows. $^1$H NMR (CDCl$_3$, 500 MHz): δ=7.39-7.74 (m, 2H), 7.48 (t, J$_1$=7.5 Hz, 1H), 7.55 (t, J$_1$=7.5 Hz, 1H), 7.62-7.69 (m, 5H), 7.71-7.81 (m, 6H), 8.10-8.13 (m, 2H), 8.29-8.33 (m, 3H), 8.58 (d, J$_1$=8.0 Hz, 1H), 8.61 (d, J$_1$=8.0 Hz, 1H), 8.67 (t, =1.5 Hz, 1H), 8.18 (dd, J$_1$=8.0 Hz, J$_2$=1.5 Hz, 1H), 9.30 (d, J$_1$=8.0 Hz, 1H), 9.36 (s, 1H).

Figure 14A:
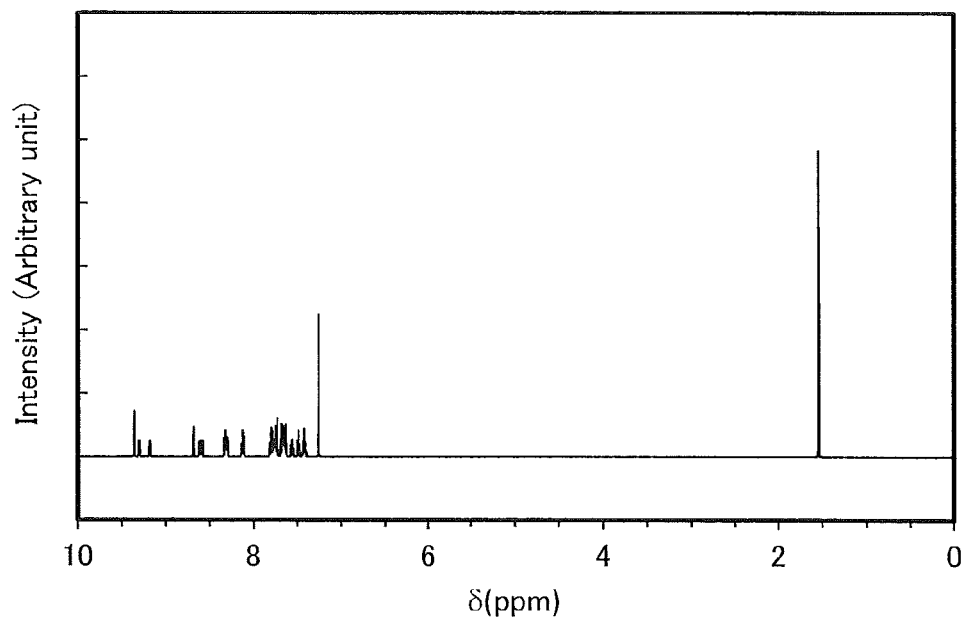
FIGS. 14A and 14B are $^1$H-NMR charts of 2m(DBt2)PDBq.
Figure 14B:
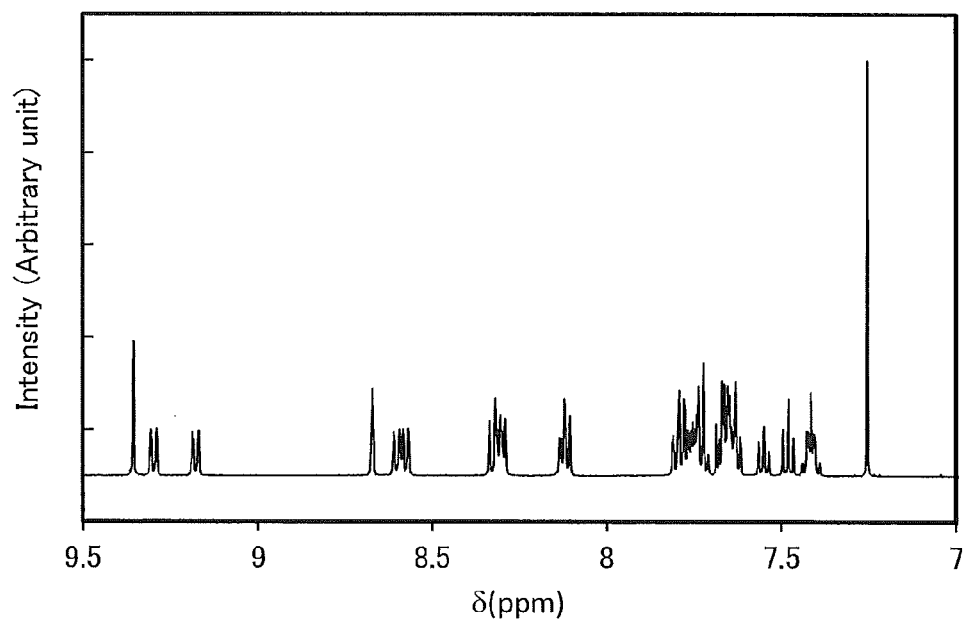

FIGS. 14A and 14B are $^1$H-NMR charts. Note that FIG. 14B is a chart where the range of from 7.00 ppm to 9.50 ppm in FIG. 14A is enlarged. The charts reveal that 2m(DBt2)PDBq represented by Structural Formula (100) that is a heterocyclic compound of one embodiment of the present invention was obtained.

In addition, 2m(DBt2)PDBq was analyzed by LC/MS in a manner similar to that described above. In this analysis, the energy (collision energy) for the collision with argon was 70 eV.

Figure 15:
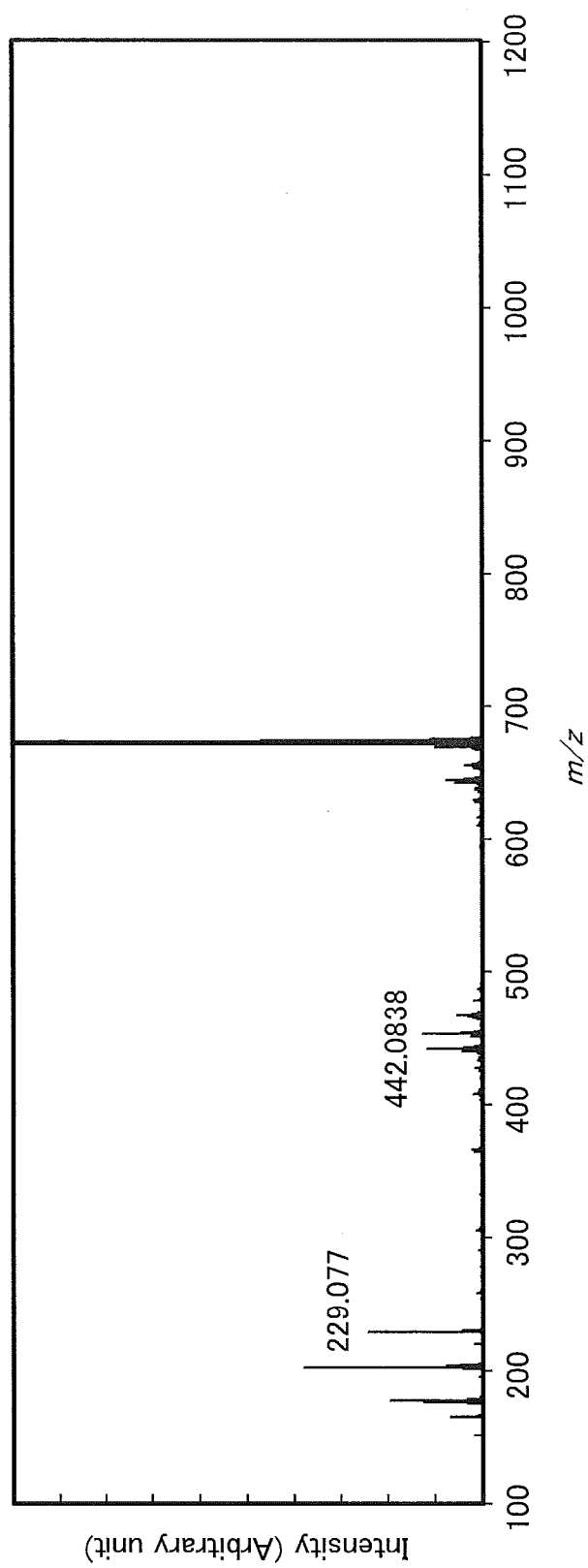
FIG. 15 shows results of LC/MS analysis of 2m(DBt2)PDBq.

Analysis results are shown in FIG. 15. The results in FIG. 15 show that the product ions of 2m(DBt2)PDBq are detected mainly around m/z=671, around m/z=442, and around m/z=229.

It is probable that a C—C bond between dibenzo[f,h]quinoxaline and a phenylene group is cut, electric charge remains on the dibenzo[f,h]quinoxaline side, and the data appearing around m/z=229 is thus data on a state where the C—C bond between dibenzo[f,h]quinoxaline and a phenylene group of a compound represented by Structural Formula (100) is cut; thus, the data is useful. In addition, the product ion around m/z=442 can be presumed to be a product ion including one bidibenzothiophene ring and one benzene ring; thus, it is suggested that 2m(DBt2)PDBq, which is the organic compound of one embodiment of the present invention, includes a dibenzothiophene ring and a benzene ring.

Thermogravimetry-differential thermal analysis (TG-DTA) was performed on 2m(DBt2)PDBq. The measurement was conducted by using a high vacuum differential type differential thermal balance (TG/DTA 2410SA, manufactured by Bruker AXS K.K.). The measurement was conducted under a nitrogen stream (flow rate: 200 mL/min) at normal pressure at a temperature rising rate of 10° C./min. It was found from the relationship between weight and temperature (thermogravimetry) that the 5% weight loss temperature was higher than or equal to 500° C. This indicates that 2m(DBt2)PDBq has high heat resistance.

Figure 16A:
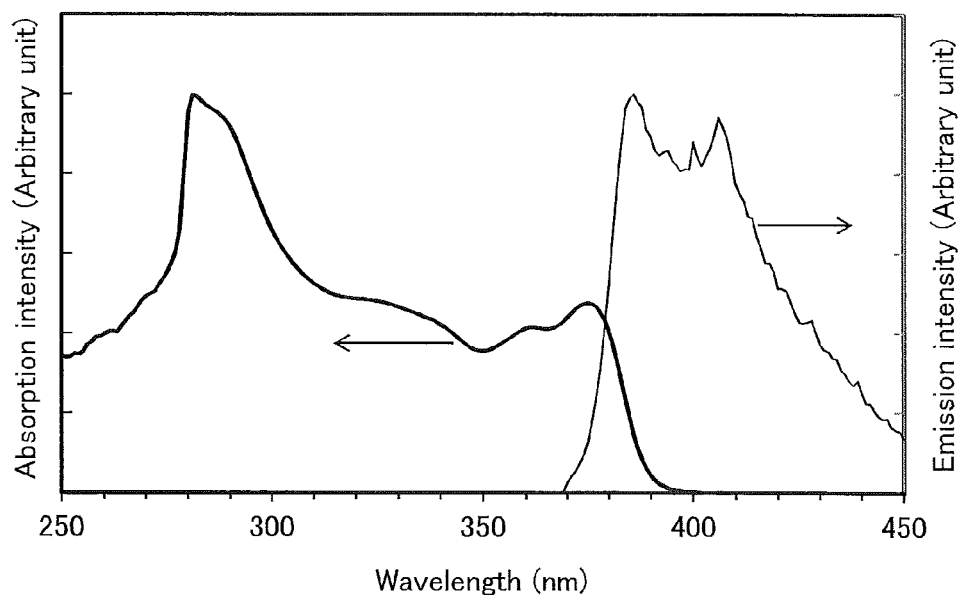
FIGS. 16A and 16B show absorption spectra and emission spectra of 2m(DBt2)PDBq in a toluene solution and a solid thin film.
Figure 16B:
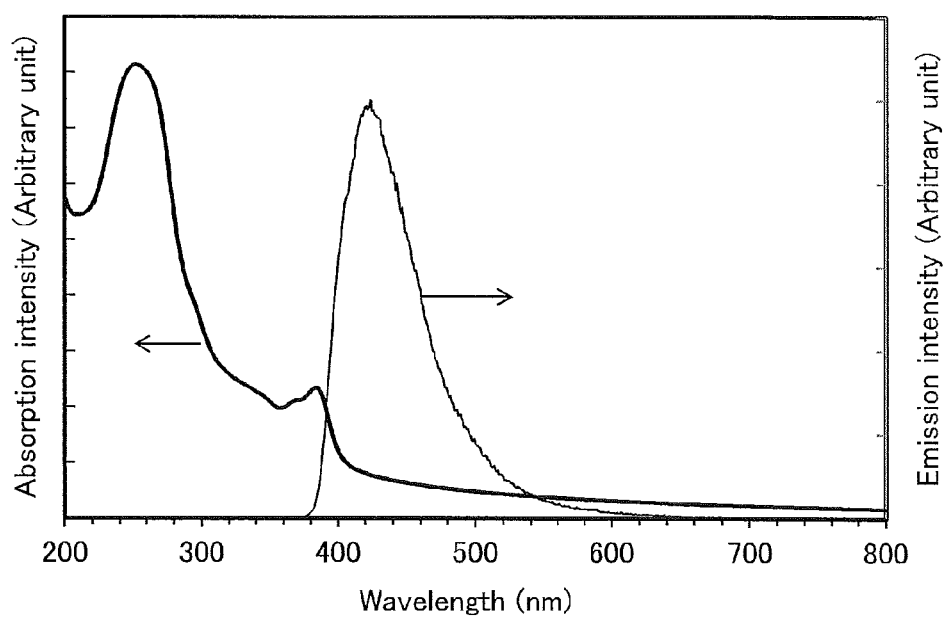

Next, ultraviolet-visible absorption spectra (hereinafter, simply referred to as "absorption spectra") and emission spectra of 2m(DBt2)PDBq in a toluene solution and in a solid thin film were measured. The solid thin film was formed over a quartz substrate by a vacuum evaporation method. The absorption spectra were measured with an ultraviolet-visible light spectrophotometer (V550 type manufactured by Japan Spectroscopy Corporation). The emission spectra were measured with a fluorescence spectrophotometer (FS920 manufactured by Hamamatsu Photonics Corporation). FIGS. 16A and 16B show the measured absorption spectra and emission spectra of 2m(DBt2)PDBq in the toluene solution and in the solid thin film. The horizontal axis represents wavelength and the vertical axes represent absorption intensity and emission intensity.

According to FIG. 16A, the absorption peaks of 2m(DBt2) PDBq in the toluene solution are observed around 281 nm, 362 nm, and 375 nm, and the emission wavelength peaks are observed at 386 nm and 406 nm. According to FIG. 16B, the absorption peaks of 2m(DBt2)PDBq in the thin film are observed around 252 nm, 262 nm, 295 nm, 340 nm, 369 nm, and 384 nm, and the emission wavelength peak is observed at 423 nm (excitation wavelength: 368 nm).

The ionization potential of 2m(DBt2)PDBq in the thin film was measured by photoelectron spectroscopy (with the use of AC-2, manufactured by Riken Keiki, Co., Ltd.) in the air. The obtained value of the ionization potential was converted into a negative value, so that the HOMO level of 2m(DBt2)PDBq was −6.37 eV. From the data of the absorption spectrum of the thin film in FIG. 16B, the absorption edge of 2m(DBt2) PDBq, which was obtained from Tauc plot with an assumption of direct transition, was 3.09 eV. Thus, the optical energy gap of 2m(DBt2)PDBq in the solid state was estimated at 3.09 eV; from the values of the HOMO level obtained above and this energy gap, the LUMO level of 2m(DBt2)PDBq can be estimated at −3.28 eV. This reveals that 2m(DBt2)PDBq in the solid state has an energy gap as wide as 3.09 eV.

It is found from the above results that 2m(DBt2)PDBq that is the organic compound of one embodiment of the present invention is an organic compound with high heat resistance and a wide energy gap. It is also found that 2m(DBt2)PDBq can be easily synthesized by three steps as described above.

Example 2

In this example, a method of synthesizing 2-[6-(dibenzothiophen-4-yl)dibenzothiophen-4-yl]dibenzo[f,h]quinoxaline (abbreviation: 2DBtDBq-02) that is the organic compound of one embodiment of the present invention described in Embodiment 1 is described in detail.

Step 1: Synthesis of 4,4'-bidibenzothiophene

In a manner similar to that of Step 1 in Example 1,4,4'-bidibenzothiophene was synthesized.

Step 2: Synthesis of 4,4'bidibenzothiophene-6-boronic acid

In a manner similar to that of Step 2 in Example 1, 4,4'-bidibenzothiophene-6-boronic acid was synthesized.

Step 3: Synthesis of 2-[6-(dibenzothiophen-4-yl)dibenzothiophen-4-yl]dibenzo[f,h]quinoxaline (Abbreviation: 2DBtDBq-02)

Into a 200-mL three-neck flask were put 1.6 g (6.1 mmol) of 2-chlorodibenzo[f,h]quinoxaline, 2.5 g (6.1 mmol) of 4,4'-bidibenzothiophene-6-boronic acid, and 0.19 g (0.62 mmol) of tris(2-methylphosphine)phosphine, and the air in the flask was replaced with nitrogen. To this mixture were added 20 mL of toluene, 10 mL of ethanol, and 6.0 mL of an aqueous solution of potassium carbonate (2.0 mol/L). This mixture was degassed by being stirred while the pressure was reduced. To this mixture, 70 mg (0.31 mmol) of palladium(II) acetate was added. This mixture was stirred at 80° C. under a nitrogen stream for 6 hours to precipitate a solid. The precipitated solid was collected by suction filtration. The collected solid was dissolved in approximately 6.0 L of hot toluene, and this solution was suction-filtered through Celite, alumina, and Florisil. The resulting filtrate was concentrated to give a solid. The solid was recrystallized by HPLC to give a white solid. The obtained solid was washed with hot toluene to give 1.5 g of white powder, which was an objective substance, in 41% yield. Synthesis Scheme (b-3) of Step 3 is shown below.

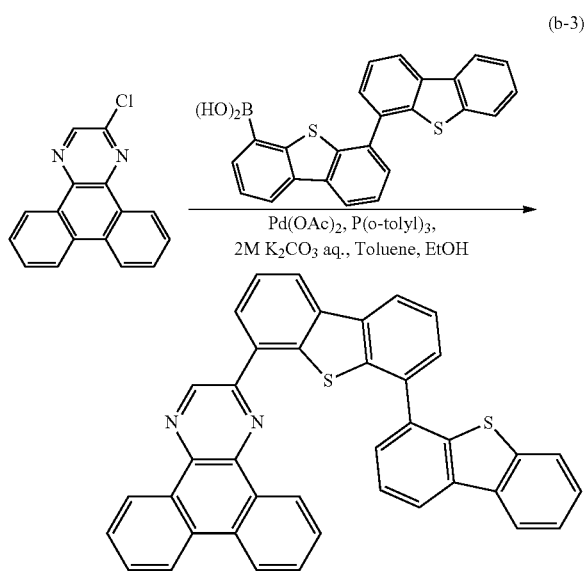

(b-3)

By a train sublimation method, 1.5 g of the obtained white powder was purified. In the sublimation purification, 2DBtDBq-02 was heated at 340° C. under a pressure of 10 Pa with an argon flow rate of 5.0 mL/min to give 1.3 g of a yellow solid of 2DBtDBq-02 at a collection rate of 87%.

The obtained substance was measured by $^1$H NMR. Measurement results are as follows. $^1$H NMR (DMSO-$d_6$, 500 MHz): δ=7.11 (t, $J_1$=7.5 Hz, 1H), 7.50 (t, $J_1$=7.5 Hz, 1H), 7.58 (t, $J_1$=7.5 Hz, 1H), 7.73 (t, $J_1$=7.5 Hz, 1H), 7.77-7.87 (m, 6H), 7.90-7.93 (m, 2H), 8.50 (d, $J_1$=8.0 Hz, 1H), 8.60 (dd, $J_1$=8.0 Hz, $J_2$=1.5 Hz, 2H), 8.70 (d, $J_1$=6.5 Hz, 1H), 8.73-8.78 (m, 3H), 9.07 (d, $J_1$=8.0 Hz, 1H), 9.16 (d, $J_1$=8.0 Hz, 1H), 9.92 (s, 1H).

Figure 17A:
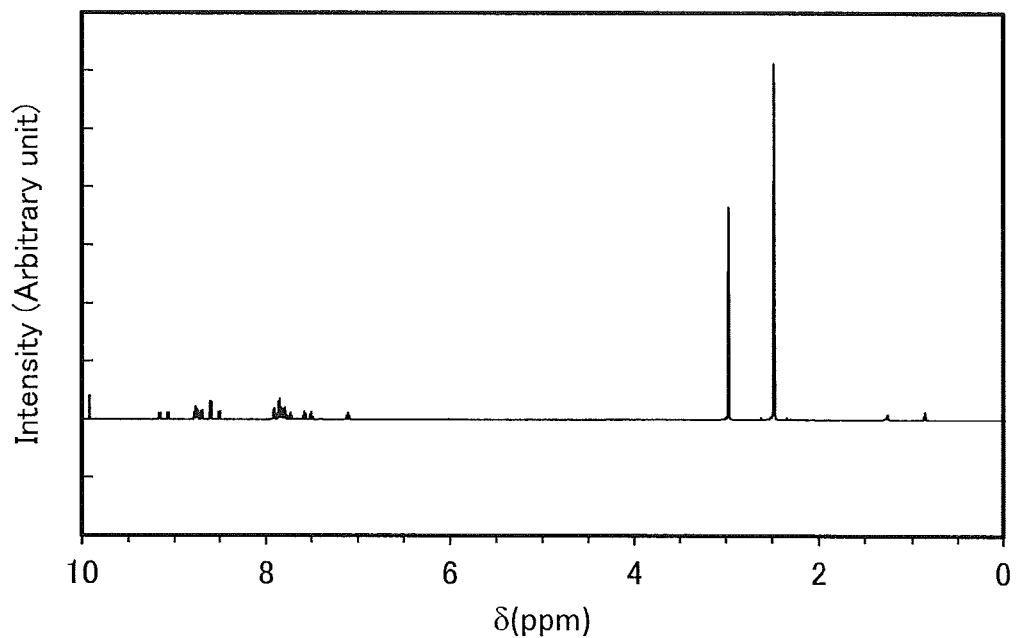
FIGS. 17A and 17B are $^1$H-NMR charts of 2DBtDBq-02.
Figure 17B:
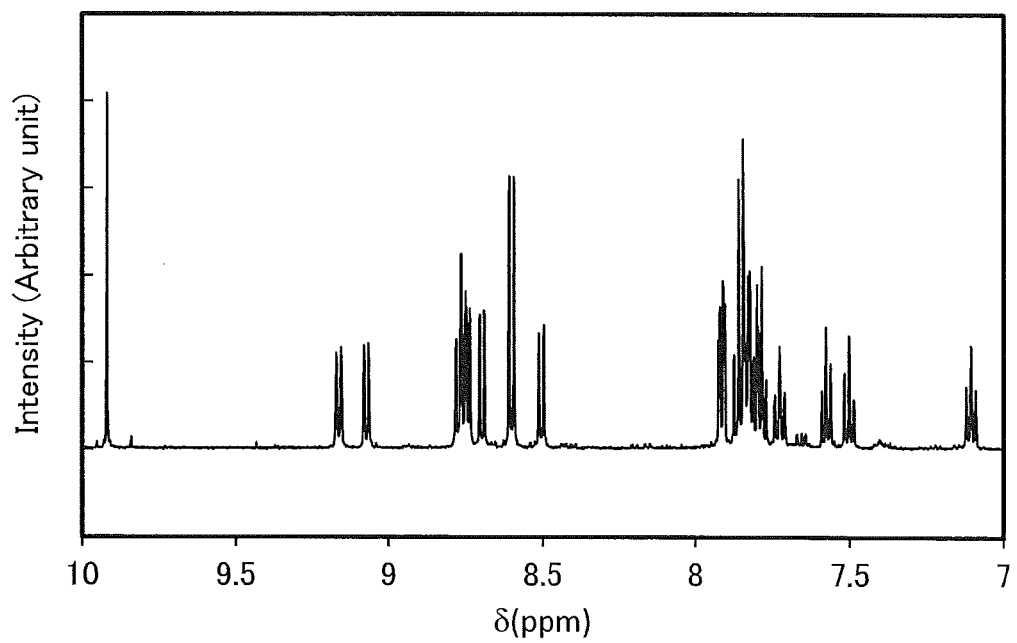

FIGS. 17A and 17B are $^1$H-NMR charts. Note that FIG. 17B is a chart where the range of from 7.00 ppm to 10.0 ppm in FIG. 17A is enlarged. The charts reveal that 2DBtDBq-02 represented by Structural Formula (118) that is a heterocyclic compound of one embodiment of the present invention was obtained.

In addition, 2DBtDBq-02 was analyzed by liquid chromatography mass spectrometry (LC/MS). The analysis by LC/MS was carried out with Acquity UPLC (manufactured by Waters Corporation), and Xevo G2 Tof MS (manufactured by Waters Corporation).

In the MS, ionization was carried out by an electrospray ionization (abbreviation: ESI) method. At this time, the capillary voltage and the sample cone voltage were set to 3.0 kV and 30 V, respectively, and detection was performed in a positive mode. A component that underwent the ionization under the above-described conditions was collided with an argon gas in a collision cell to dissociate into product ions. The energy (collision energy) for the collision with argon was 50 eV. The mass range for the measurement was m/z=100 to 1200.

Figure 18:
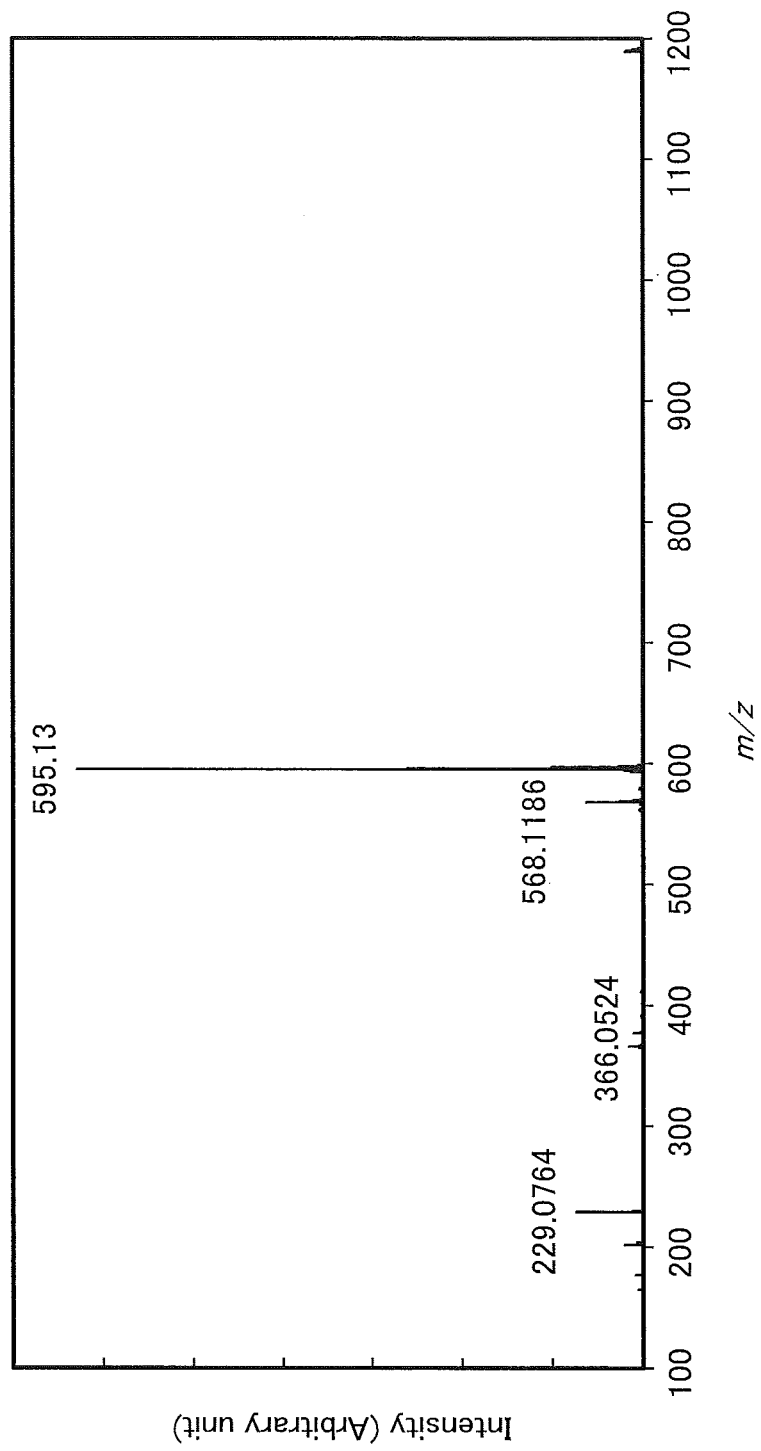
FIG. 18 shows results of LC/MS analysis of 2DBtDBq-02.

Measurement results are shown in FIG. 18. The results in FIG. 18 shows that the product ions of 2DBtDBq-02 are detected mainly around m/z=595, around m/z=366, and around m/z=229. Note that the results in FIG. 18 show characteristics derived from 2DBtDBq-02 and thus can be regarded as important data for identifying 2DBtDBq-02 contained in a mixture. It is probable that a C—C bond between dibenzo[f,h]quinoxaline and 4,4'-bidibenzothiophene is cut, electric charge remains on the dibenzo[f,h]quinoxaline side, and the data appearing around m/z=229 is thus data on a state where the C—C bond between dibenzo[f,h]quinoxaline and bidibenzothiophene of a compound represented by Structural Formula (118) is cut; thus, the data is useful. In addition, the product ion around m/z=366 can be presumed to be a product ion of a bidibenzothiophene ring; thus, it is suggested that 2DBtDBq-02, which is the heterocyclic organic compound of one embodiment of the present invention, includes a bidibenzothiophene ring.

Thermogravimetry-differential thermal analysis (TG-DTA) was performed on 2DBtDBq-02. The measurement was conducted by using a high vacuum differential type differential thermal balance (TG/DTA 2410SA, manufactured by Bruker AXS K.K.). The measurement was conducted under a nitrogen stream (flow rate: 200 mL/min) at normal pressure at a temperature rising rate of 10° C./min. It was found from the relationship between weight and temperature (thermogravimetry) that the 5% weight loss temperature was higher than or equal to 488° C. and the inciting point of 2DBtDBq-02 was 380° C. This indicates that 2DBtDBq-02 has high heat resistance.

Figure 19A:
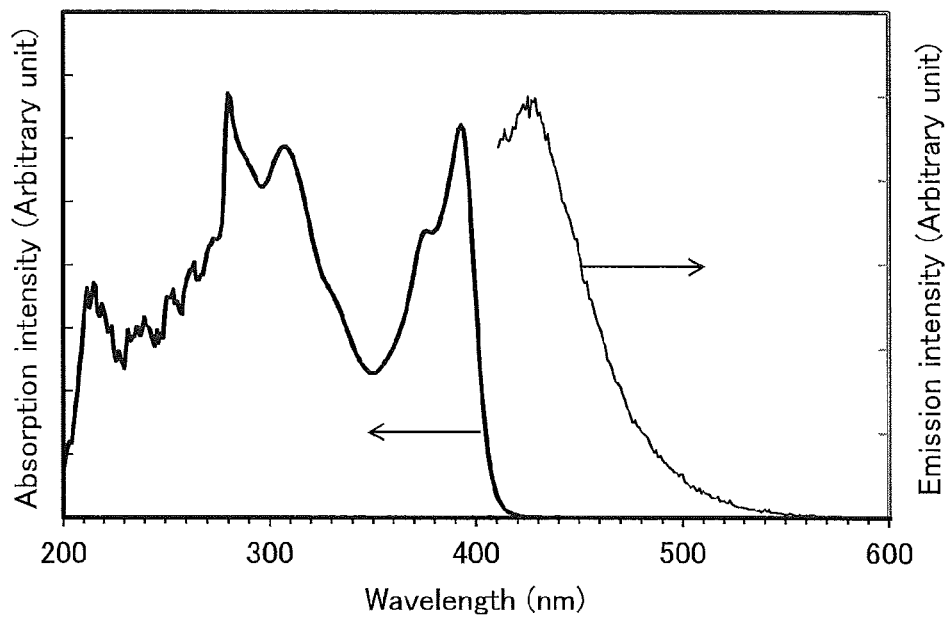
FIGS. 19A and 19B show absorption spectra and emission spectra of 2DBtDBq-02.
Figure 19B:
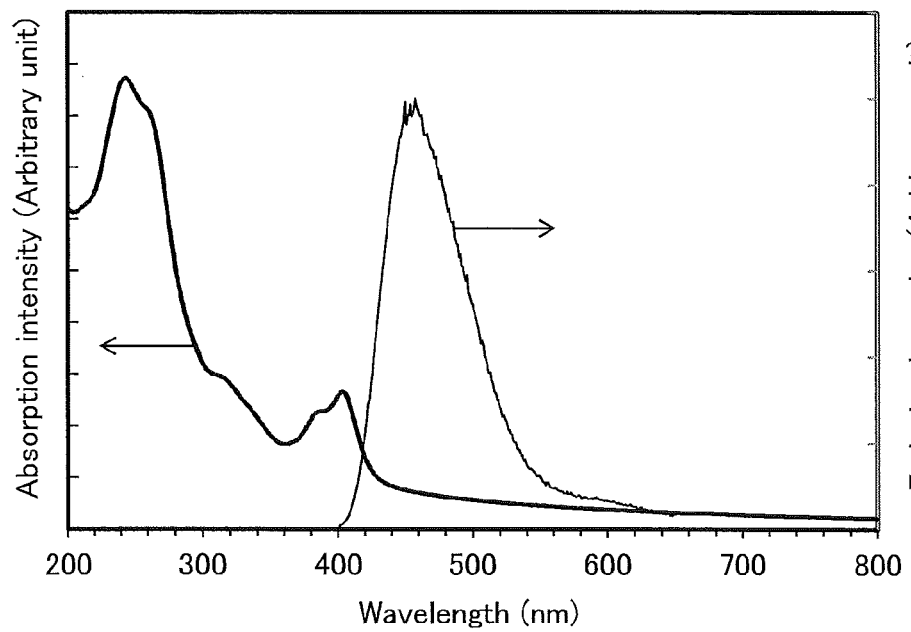

Next, ultraviolet-visible absorption spectra (hereinafter, simply referred to as "absorption spectra") and emission spectra of 2DBtDBq-02 in a toluene solution and in a solid thin film were measured. The solid thin film was formed over a quartz substrate by a vacuum evaporation method. The absorption spectra were measured with an ultraviolet-visible light spectrophotometer (V550 type manufactured by Japan Spectroscopy Corporation). The emission spectra were measured with a fluorescence spectrophotometer (FS920 manufactured by Hamamatsu Photonics Corporation). FIGS. 19A and 19B show the obtained absorption spectra and emission spectra of 2DBtDBq-02 in the toluene solution and in the solid thin film. The horizontal axis represents wavelength and the vertical axes represent absorption intensity and emission intensity.

According to FIG. 19A, the absorption peaks of 2DBtDBq-02 in the toluene solution are observed around 280 nm, 307 nm, 376 nm, and 393 nm, and the emission wavelength peak is observed at 424 nm. According to FIG. 19B, the absorption peaks of 2DBtDBq-02 in the thin film are observed around 214 nm, 243 nm, 258 nm, 315 nm, 336 nm, 386 nm, and 403 nm, and the emission wavelength peak is observed at 458 nm (excitation wavelength: 358 nm).

The ionization potential of 2DBtDBq-02 in the thin film was measured by photoelectron spectroscopy (with the use of AC-2, manufactured by Riken Keiki, Co., Ltd.) in the air. The obtained value of the ionization potential was converted into a negative value, so that the HOMO level of 2DBtDBq-02 was −6.05 eV. From the data of the absorption spectrum of the thin film in FIG. 19B, the absorption edge of 2DBtDBq-02, which was obtained from Tauc plot with an assumption of direct transition, was 2.94 eV. Thus, the optical energy gap of 2DBtDBq-02 in the solid state was estimated at 2.94 eV; from the values of the HOMO level obtained above and this energy gap, the LUMO level of 2DBtDBq-02 can be estimated at −3.11 eV. This reveals that 2DBtDBq-02 in the solid state has an energy gap as wide as 2.94 eV.

It is found from the above results that 2DBtDBq-02 that is the organic compound of one embodiment of the present invention is an organic compound with high heat resistance and a wide energy gap. It is also found that 2DBtDBq-02 can be easily synthesized by three steps as described above.

Example 3

In this example, a light-emitting element of one embodiment of the present invention (a light-emitting element 1) and a comparative light-emitting element (a comparative light-emitting element 1) are described. Structure formulae of organic compounds used for the light-emitting element 1 and the comparative light-emitting element 1 are shown below.

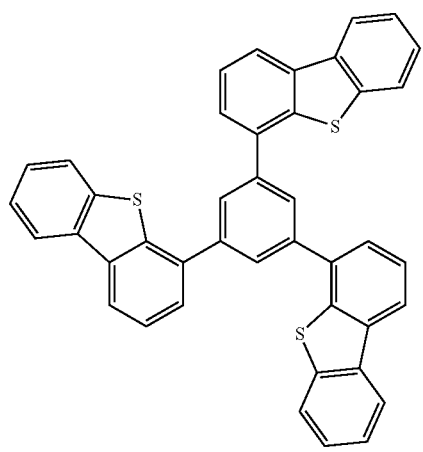

DBT3P-II (i)

-continued

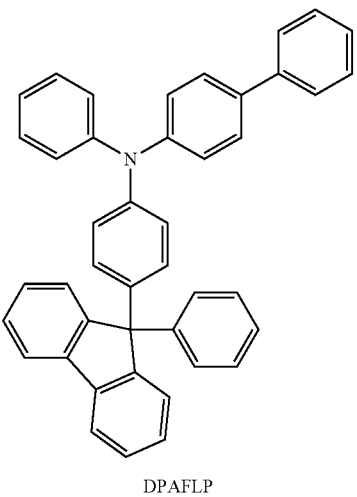

DPAFLP (ii)

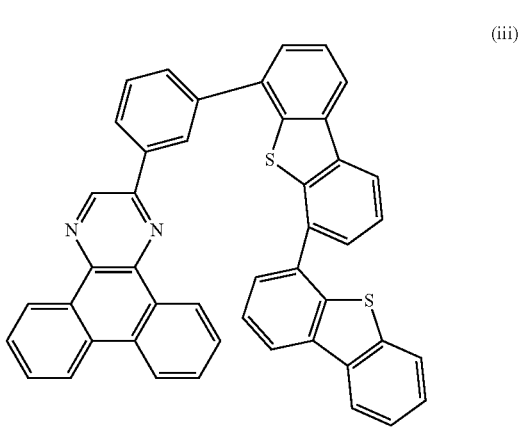

2m(DBt2)PDBq (iii)

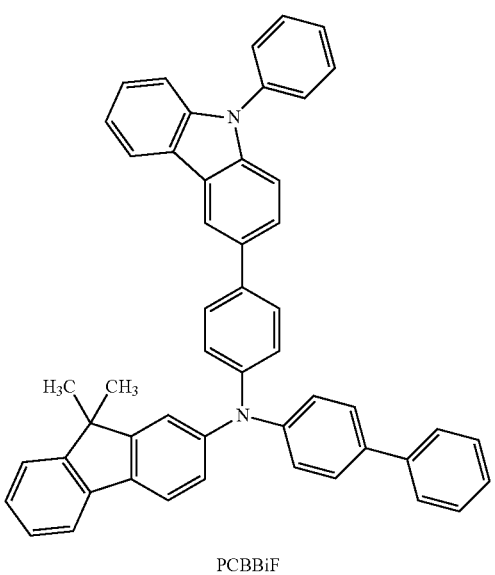

PCBBiF (iv)

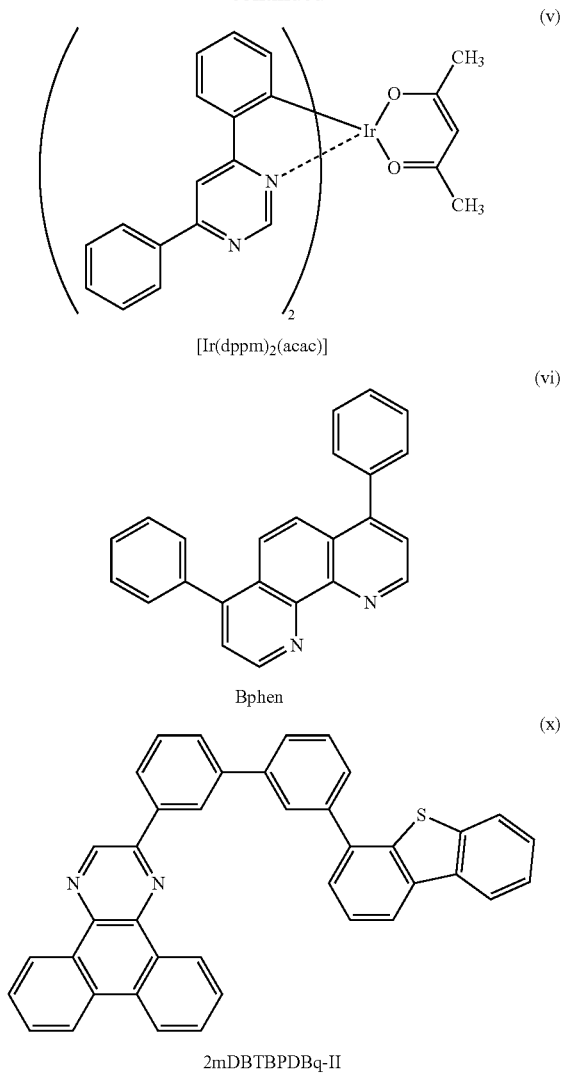

Methods for fabricating the light-emitting element 1 and the comparative light-emitting element 1 of this example are described below.

(Method for Fabricating Light-Emitting Element 1)

First, a film of indium tin oxide containing silicon oxide (ITSO) was formed over a glass substrate by a sputtering method, so that the first electrode 101 was formed. The thickness was 110 nm and the electrode area was 2 mm×2 mm. Here, the first electrode 101 functions as an anode of the light-emitting element.

Next, in pretreatment for forming the light-emitting element over the substrate, a surface of the substrate was washed with water and baked at 200° C. for one hour, and then UV ozone treatment was performed for 370 seconds.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, on the first electrode 101, 4,4',4''-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating to form the hole-injection layer 111. The thickness was set to 20 nm, and the weight ratio of DBT3P-II to molybdenum oxide was adjusted to 4:2 (=DBT3P-II:molybdenum oxide). Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) represented by Structural Formula (ii) was formed to a thickness of 20 nm over the hole-injection layer 111 to form the hole-transport layer 112.

In addition, a light-emitting layer 113 was formed over the hole-transport layer 112 in such a manner that 2-{3-[6-(dibenzothiophen-4-yl)dibenzothiophen-4-yl]phenyl}dibenzo[f,h]quinoxaline (abbreviation: 2m(DBt2)PDBq) represented by Structural Formula (iii), N-(1,1'-biphenyl-4-yl)-N-[4-(9-phenyl-9H-carbazol-3-yl)phenyl]-9,9-dimethyl-9H-fluor en-2-amine (abbreviation: PCBBiF) represented by Structural Formula (iv), and (acetylacetonato)bis(4,6-diphenylpyrimidinato)iridium(III) (abbreviation: [Ir(dppm)$_2$(acac)]) represented by Structural Formula (v) were deposited by co-evaporation so that the weight ratio of 2m(DBt2)PDBq to PCBBiF and [Ir(dppm)$_2$(acac)] was 0.7:0.3:0.05 (=2m(DBt2)PDBq:PCBBiF:[Ir(dppm)$_2$(acac)]) to a thickness of 20 nm, and then 2m(DBt2)PDBq, PCBBiF, and [Ir(dppm)$_2$(acac)] were deposited by co-evaporation so that the weight ratio of 2m(DBt2)PDBq to PCBBiF and [Ir(dppm)$_2$(acac)] was 0.8:0.2:0.05 (=2m(DBt2)PDBq:PCBBiF:[Ir(dppm)$_2$(acac)]) to a thickness of 20 nm.

Then, the electron-transport layer 114 was formed over the light-emitting layer 113 in such a manner that a 20 nm thick film of 2m(DBt2)PDBq was formed and a 10 nm thick film of bathophenanthroline (abbreviation: Bphen) represented by Structural Formula (vi) was formed.

After the formation of the electron-transport layer 114, lithium fluoride (LiF) was deposited by evaporation to a thickness of 1 nm to form the electron-injection layer 115. Finally, aluminum was deposited by evaporation to a thickness of 200 nm to form the second electrode 102 functioning as a cathode. Through the above-described steps, the light-emitting element 1 of this example was fabricated.

(Method for Fabricating Comparative Light-Emitting Element 1)

The comparative light-emitting element 1 was fabricated in the same manner as that of the light-emitting element 1 except that 2-[3'-(dibenzothiphen-4-yl)biphenyl-3-yl]dibenzo[f,h]quinoxaline (abbreviation: 2mDBTBPDBq-II) represented by Structural Formula (x) was used instead of 2m(DBt2)PDBq used for the light-emitting element 1.

In a glove box under a nitrogen atmosphere, the light-emitting element 1 and the comparative light-emitting element 1 were each sealed with a glass substrate so as not to be exposed to the air (specifically, application of a sealant onto an outer edge of the element, UV treatment, and heat treatment at 80° C. for 1 hour). After that, reliability of these light-emitting elements was measured. Note that the measurement was carried out at room temperature (in an atmosphere kept at 25° C.).

Figure 20:
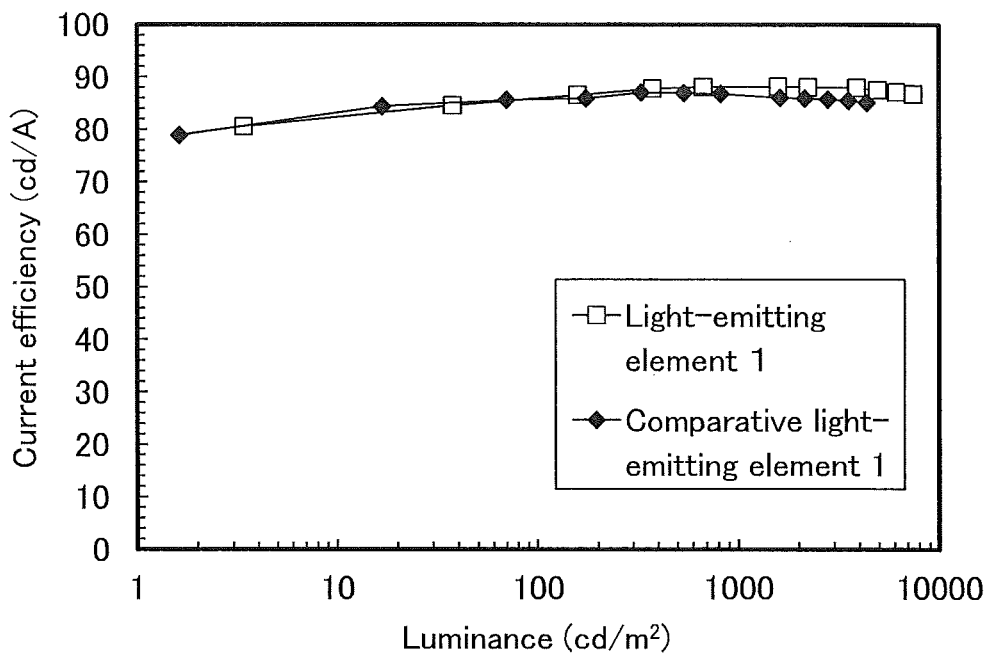
FIG. 20 shows luminance-current efficiency characteristics of a light-emitting element 1 and a comparative light-emitting element 1.
Figure 21:
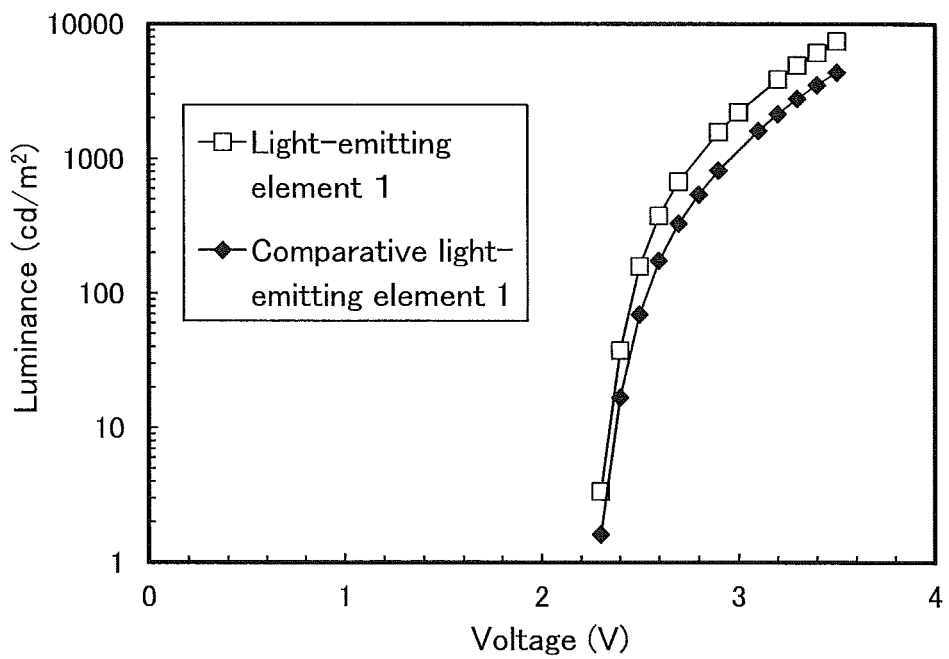
FIG. 21 shows voltage-luminance characteristics of the light-emitting element 1 and the comparative light-emitting element 1.
Figure 22:
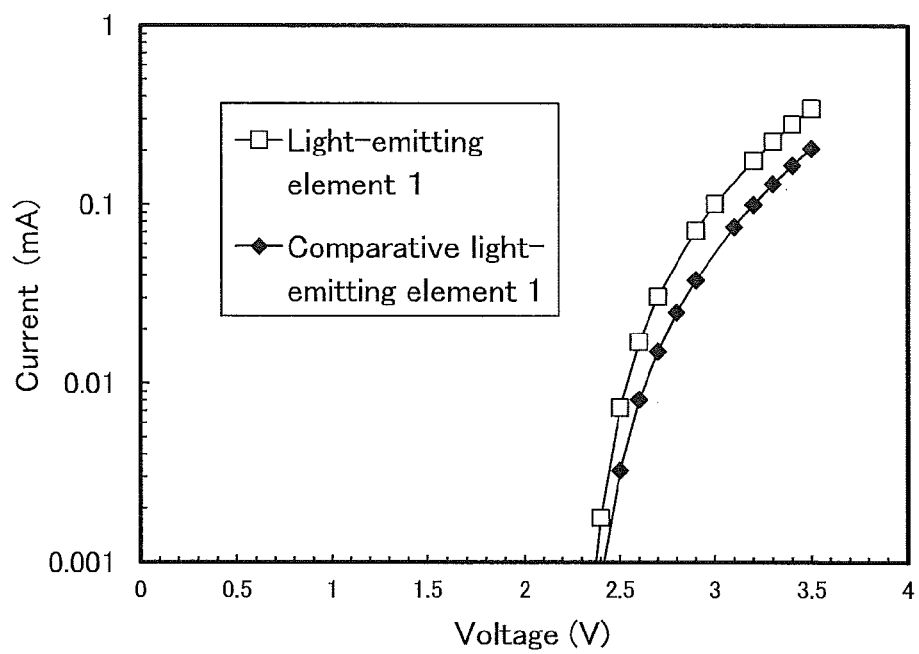
FIG. 22 shows voltage-current characteristics of the light-emitting element 1 and the comparative light-emitting element 1.
Figure 23:
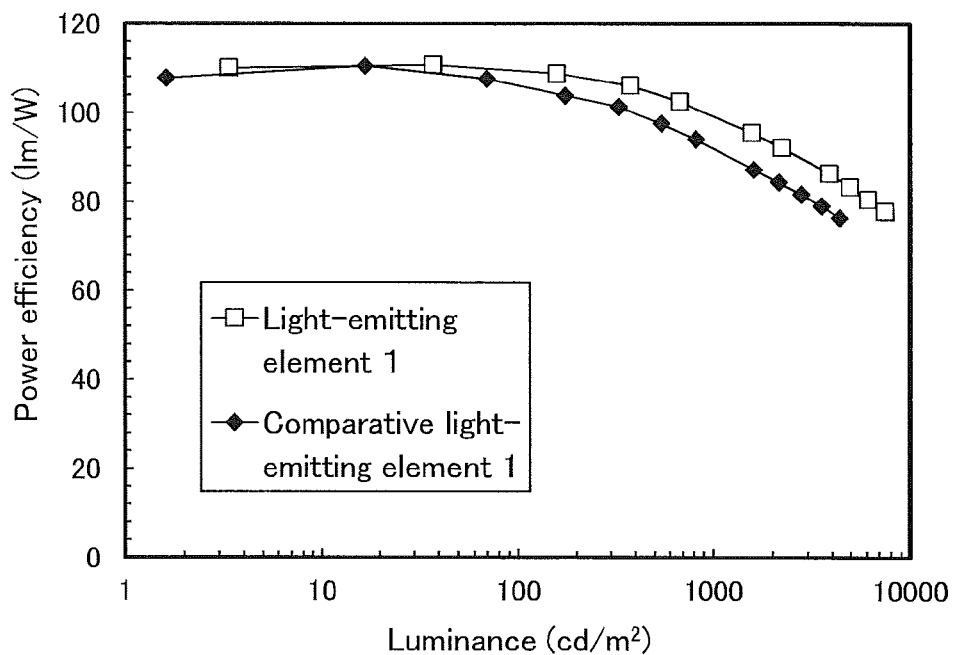
FIG. 23 shows luminance-power efficiency characteristics of the light-emitting element 1 and the comparative light-emitting element 1.
Figure 24:
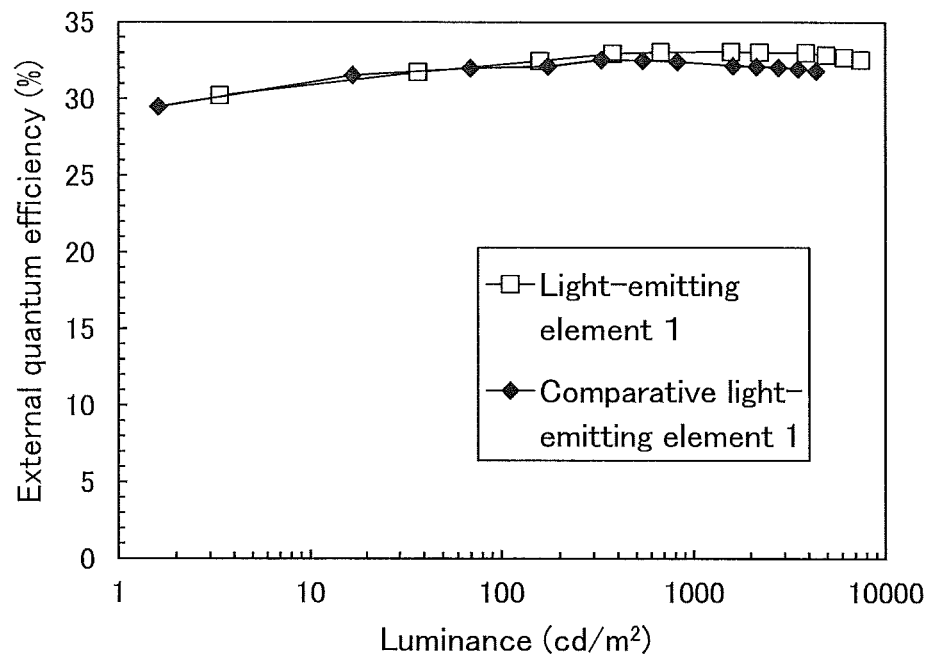
FIG. 24 shows luminance-external quantum efficiency characteristics of the light-emitting element 1 and the comparative light-emitting element 1.
Figure 25:
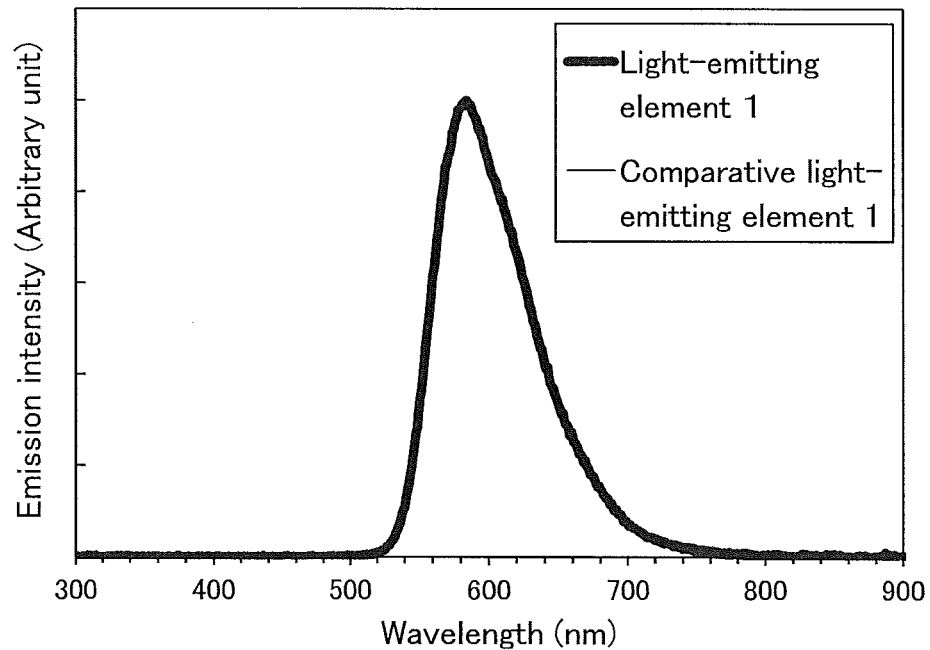
FIG. 25 shows emission spectra of the light-emitting element 1 and the comparative light-emitting element 1.

FIG. 20 shows luminance-current efficiency characteristics of the light-emitting element 1 and the comparative light-emitting element 1. FIG. 21 shows voltage-luminance characteristics of thereof. FIG. 22 shows voltage-current characteristics thereof. FIG. 23 shows luminance-power efficiency characteristics thereof. FIG. 24 shows luminance-external quantum efficiency characteristics thereof. FIG. 25 shows emission spectra thereof.

Figure 26:
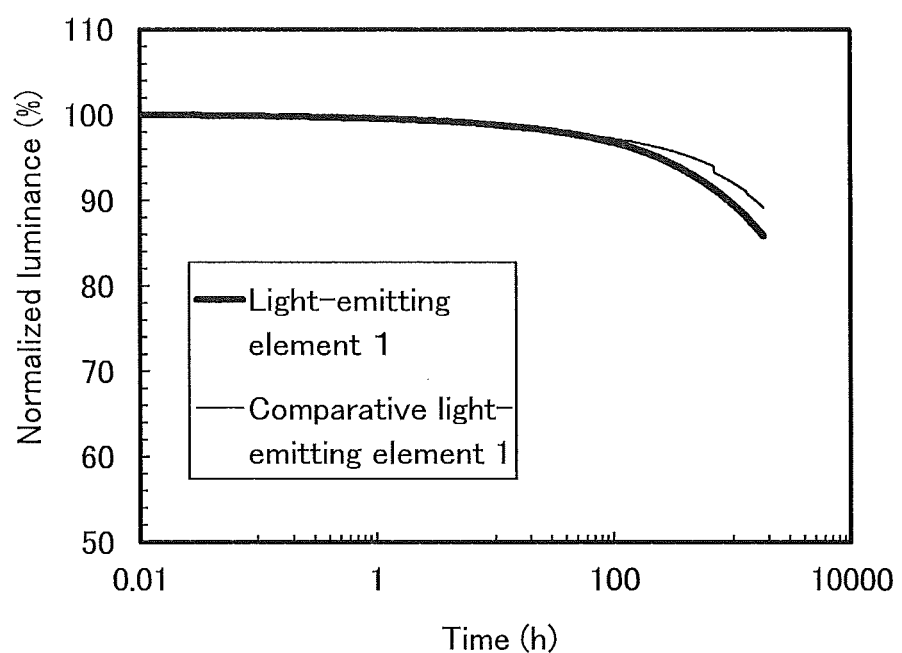
FIG. 26 shows changes in normalized luminance with time of the light-emitting element 1 and the comparative light-emitting element 1.

FIG. 26 shows changes in luminance of the light-emitting elements with driving time under the conditions where the initial luminance was 5000 cd/m2 and the current density was constant.

The results show that the light-emitting element 1 and the comparative light-emitting element 1 both have excellent characteristics. The results also show that the light-emitting element 1 has low drive voltage owing to its excellent carrier-transport property and thus has excellent power efficiency. In other words, the light-emitting element 1 of one embodiment of the present invention can have lower drive voltage, while keeping current efficiency (external quantum efficiency) and reliability, than conventional light-emitting elements.

The light-emitting element 1 contains 2m(DBt2)PDBq that is the organic compound described in Embodiment 1 and thus has high heat resistance.

In addition, 2m(DBt2)PDBq can be synthesized easily by a small number of synthesis steps, which enables the light-emitting element 1 to be fabricated at relatively low cost and to have high productivity.

It is found from the above results that the light-emitting element 1 of one embodiment of the present invention that contains 2m(DBt2)PDBq is an excellent light-emitting element that has excellent characteristics (particularly, low drive voltage and high power efficiency) and high heat resistance and is advantageous in productivity.

Example 4

In this example, a light-emitting element of one embodiment of the present invention (a light-emitting element 2) is described. Structure formulae of organic compounds used for the light-emitting element 2 are shown below.

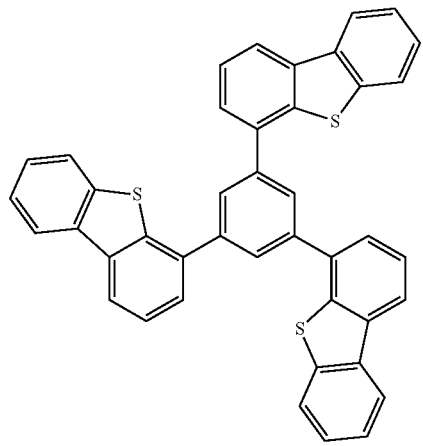

DBT3P-II (i)

-continued

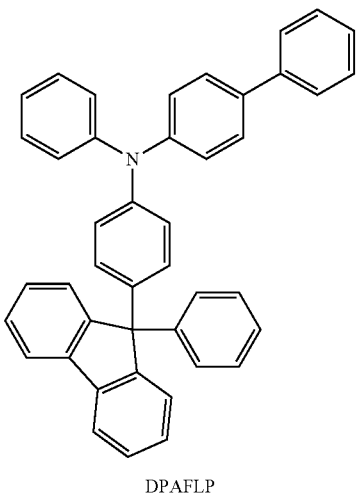

DPAFLP (ii)

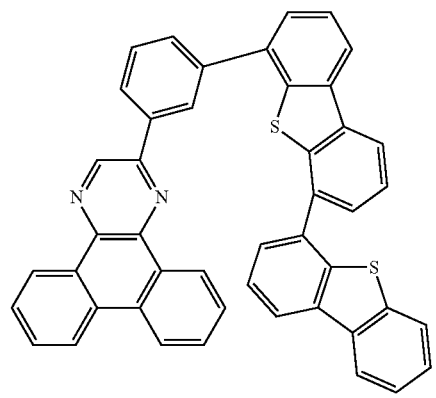

2m(DBt2)PDBq (iii)

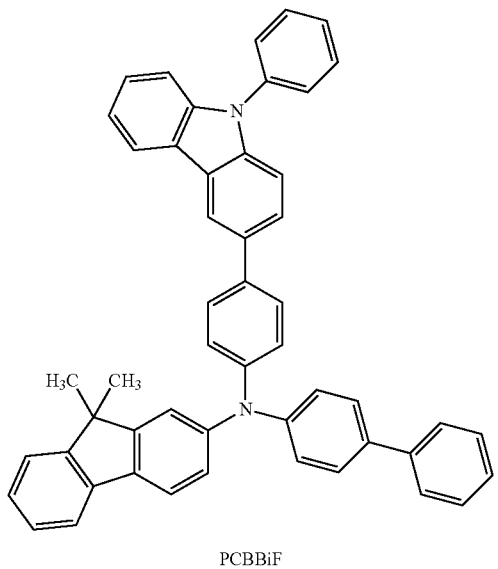

PCBBiF (iv)

-continued

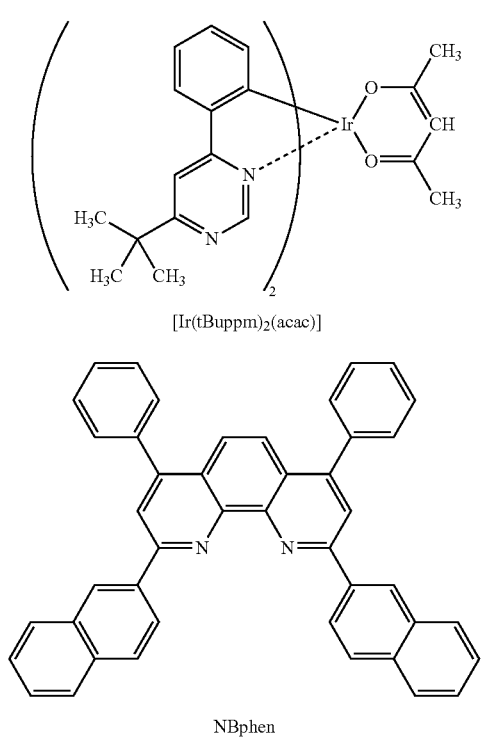

[Ir(tBuppm)₂(acac)]    (vii)

NBphen    (viii)

A method for fabricating the light-emitting element 2 of this example is described below.

(Method for Fabricating Light-Emitting Element 2)

First, a film of indium tin oxide containing silicon oxide (ITSO) was formed over a glass substrate by a sputtering method, so that the first electrode 101 was formed. The thickness was 110 nm and the electrode area was 2 mm×2 mm Here, the first electrode 101 functions as an anode of the light-emitting element.

Next, in pretreatment for forming the light-emitting element over the substrate, a surface of the substrate was washed with water and baked at 200° C. for one hour, and then UV ozone treatment was performed for 370 seconds.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, on the first electrode 101, 4,4',4"-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating to form the hole-injection layer 111. The thickness was set to 20 nm, and the weight ratio of DBT3P-II to molybdenum oxide was adjusted to 4:2 (=DBT3P-II:molybdenum oxide). Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) represented by Structural Formula (ii) was formed to a thickness of 20 nm over the hole-injection layer 111 to form the hole-transport layer 112.

In addition, the light-emitting layer 113 was formed over the hole-transport layer 112 in such a manner that 2-{3-[6-(dibenzothiophen-4-yl)dibenzothiophen-4-yl]phenyl}dibenzo[f,h]quinoxaline (abbreviation: 2m(DBt2)PDBq) represented by Structural Formula (iii), N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (iv), and (acetylacetonato)bis(6-tert-butyl-4-phenylpyrimidinato)iridium(III) (abbreviation: [Ir(tBuppm)₂(acac)] represented by Structural Formula (vii) were deposited by co-evaporation so that the weight ratio of 2m(DBt2)PDBq to PCBBiF and [Ir(tBuppm)₂(acac)] was 0.7:0.3:0.05 (=2m(DBt2)PDBq:PCBBiF:[Ir(tBuppm)₂(acac)]) to a thickness of 20 nm, and then 2m(DBt2)PDBq, PCBBiF, and [Ir(tBuppm)₂(acac)] were deposited by co-evaporation so that the weight ratio of 2m(DBt2)PDBq to PCBBiF and [Ir(tBuppm)₂(acac)] was 0.8:0.2:0.05 (=2m(DBt2)PDBq:PCBBiF:[Ir(tBuppm)₂(acac)]) to a thickness of 20 nm.

Then, the electron-transport layer 114 was formed over the light-emitting layer 113 in such a manner that a 20 nm thick film of 2m(DBt2)PDBq was formed and a 10 nm thick film of 2,9-di(2-naphthyl)-4,7-diphenyl-1,10-phenanthroline (abbreviation: NBphen) represented by Structural Formula (viii) was formed.

After the formation of the electron-transport layer 114, lithium fluoride (LiF) was deposited by evaporation to a thickness of 1 nm to form the electron-injection layer 115. Finally, aluminum was deposited by evaporation to a thickness of 200 nm to form the second electrode 102 functioning as a cathode. Through the above-described steps, the light-emitting element 2 of this example was fabricated.

In a glove box under a nitrogen atmosphere, the light-emitting element 2 was sealed with a glass substrate so as not to be exposed to the air (specifically, application of a sealant onto an outer edge of the element, UV treatment, and heat treatment at 80° C. for 1 hour). After that, reliability of these light-emitting elements was measured. Note that the measurement was carried out at room temperature (in an atmosphere kept at 25° C.).

Figure 27:
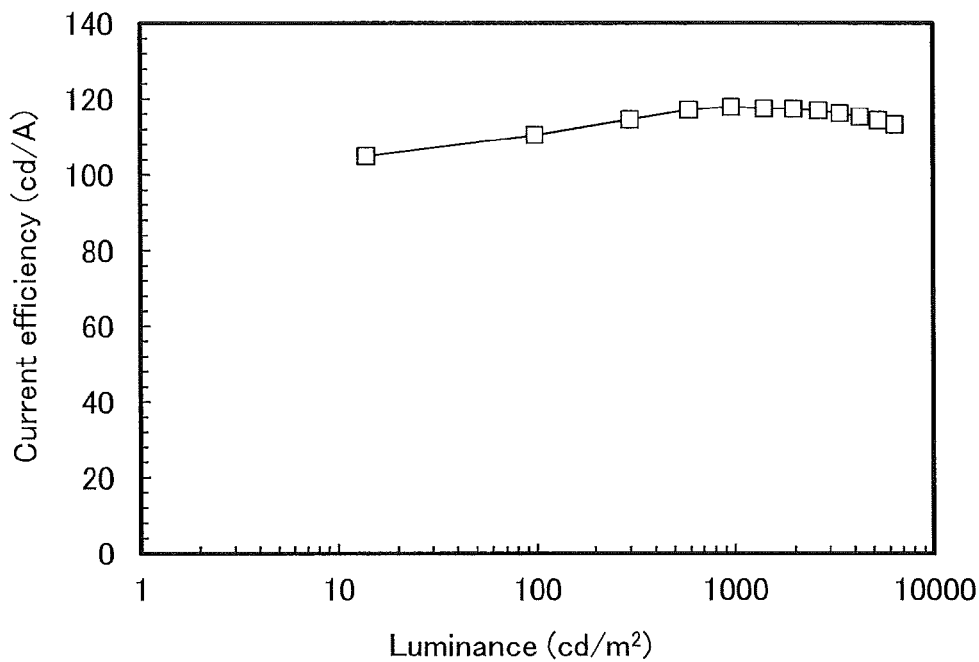
FIG. 27 shows luminance-current efficiency characteristics of a light-emitting element 2.
Figure 28:
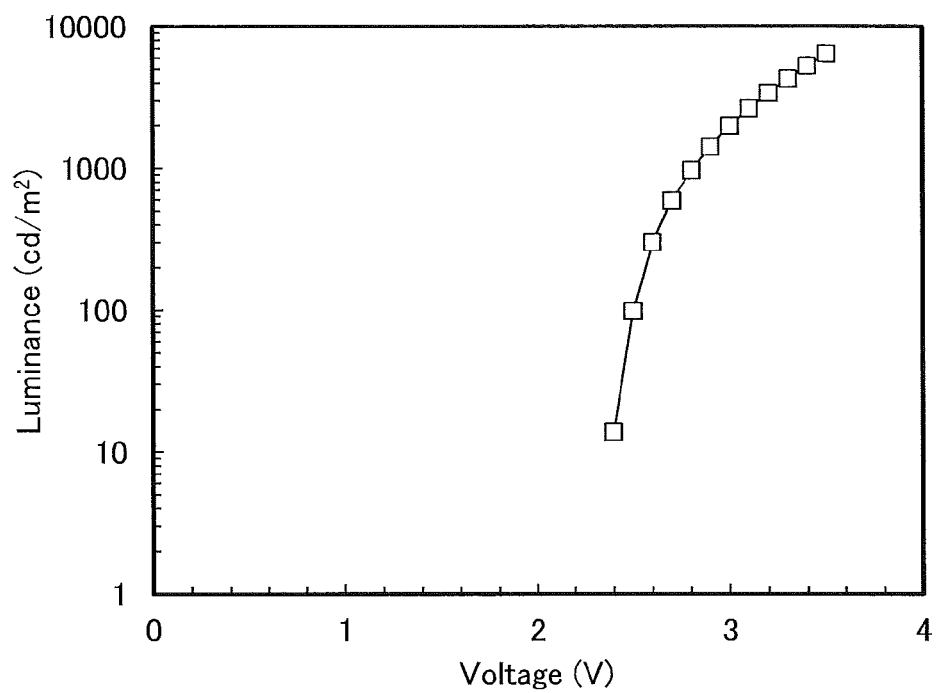
FIG. 28 shows voltage-luminance characteristics of the light-emitting element 2.
Figure 29:
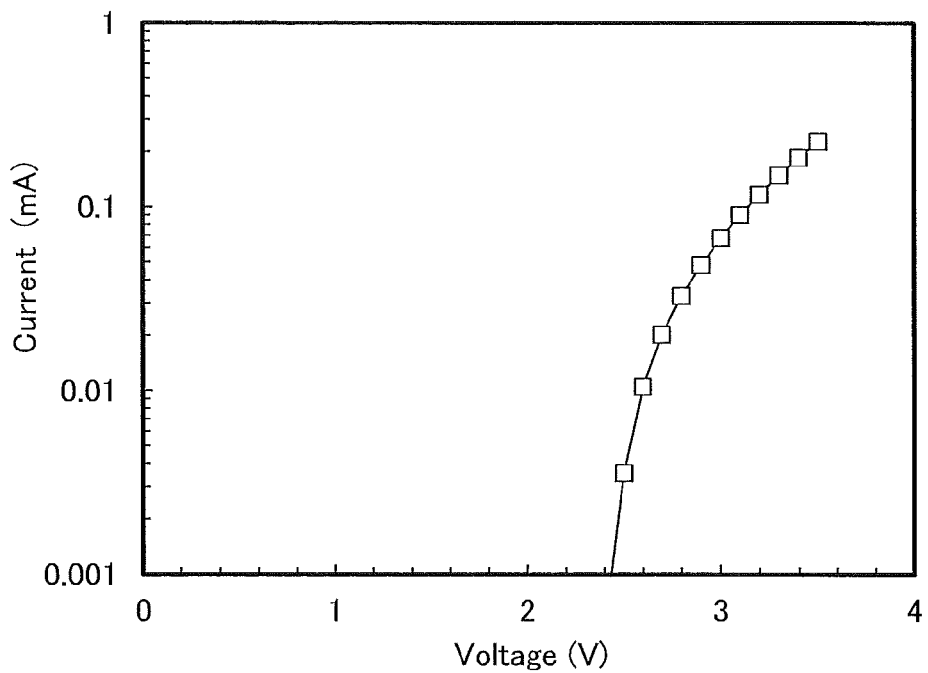
FIG. 29 shows voltage-current characteristics of the light-emitting element 2.
Figure 30:
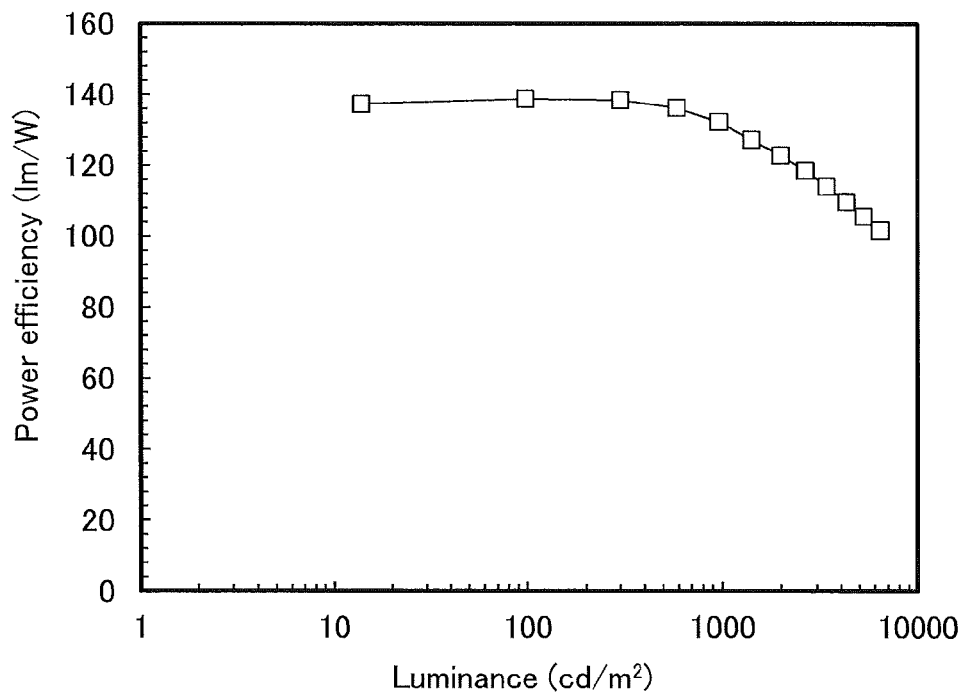
FIG. 30 shows luminance-power efficiency characteristics of the light-emitting element 2.
Figure 31:
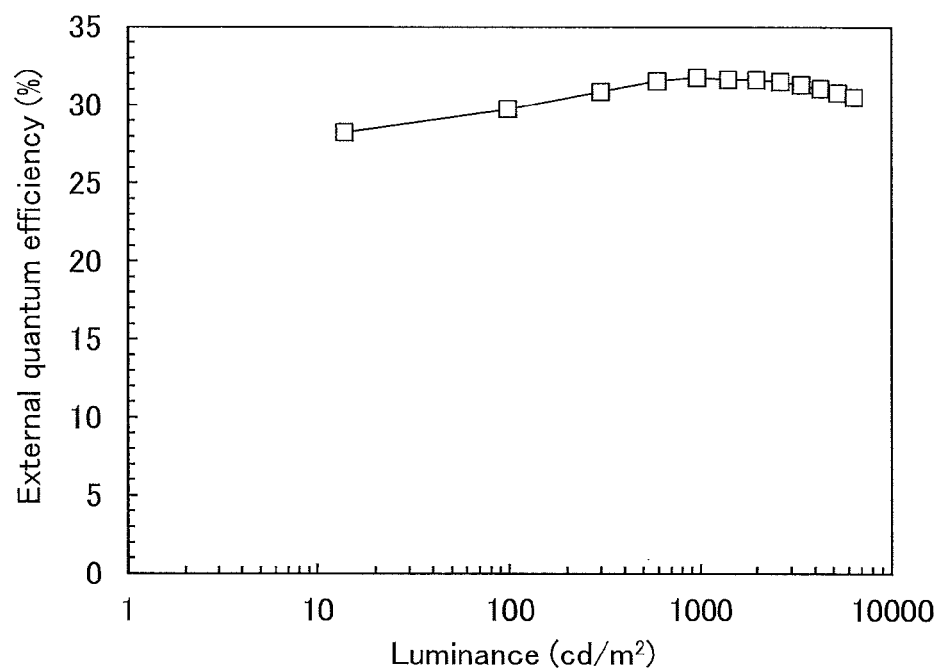
FIG. 31 shows luminance-external quantum efficiency characteristics of the light-emitting element 2.
Figure 32:
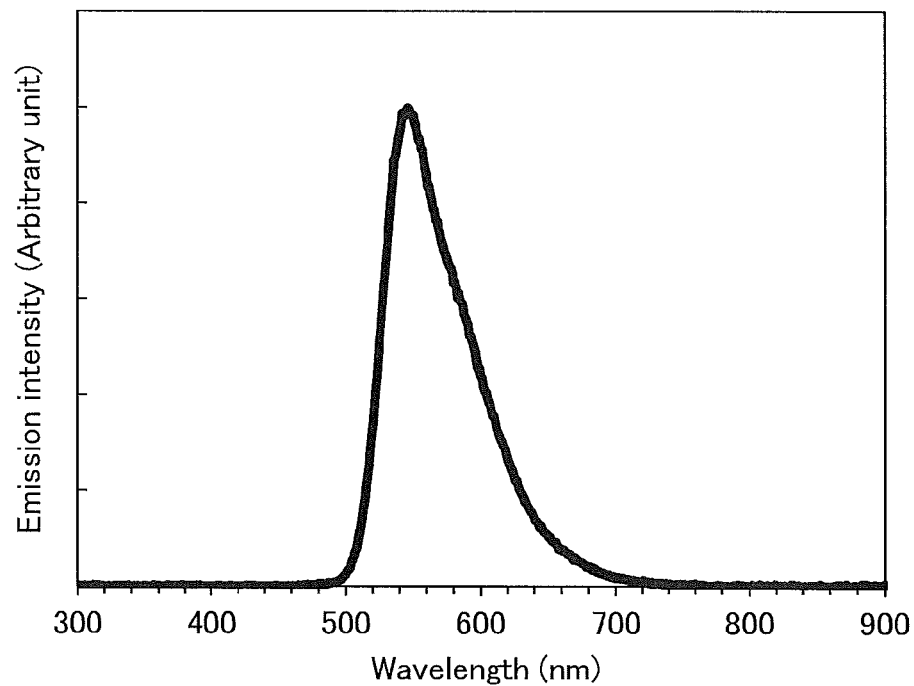
FIG. 32 shows an emission spectrum of the light-emitting element 2.

FIG. 27 shows luminance-current efficiency characteristics of the light-emitting element 2. FIG. 28 shows voltage-luminance characteristics of thereof. FIG. 29 shows voltage-current characteristics thereof. FIG. 30 shows luminance-power efficiency characteristics thereof. FIG. 31 shows luminance-external quantum efficiency characteristics thereof. FIG. 32 shows emission spectra thereof.

The results show that the light-emitting element 2 has excellent characteristics.

The light-emitting element 2 contains 2m(DBt2)PDBq that is the organic compound described in Embodiment 1 and thus has high heat resistance.

In addition, 2m(DBt2)PDBq can be synthesized easily by a small number of steps, which enables the light-emitting element 2 to be fabricated at relatively low cost.

It is found from the above results that the light-emitting element 2 of one embodiment of the present invention that contains 2m(DBt2)PDBq is an excellent light-emitting element that has excellent characteristics (particularly, low drive voltage and high power efficiency) and high heat resistance and is advantageous in productivity.

Example 5

In this example, a light-emitting element of one embodiment of the present invention (a light-emitting element 3) is described. Structure formulae of organic compounds used for the light-emitting element 3 are shown below.

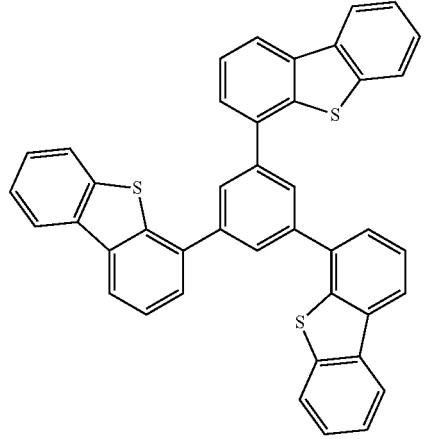
DBT3P-II (i)

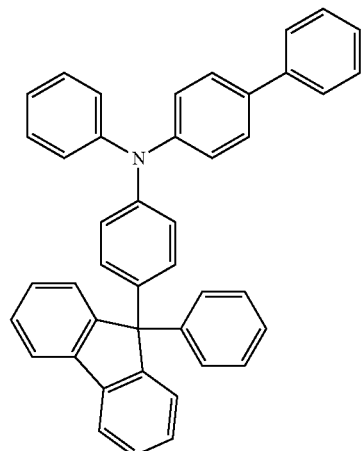
DPAFLP (ii)

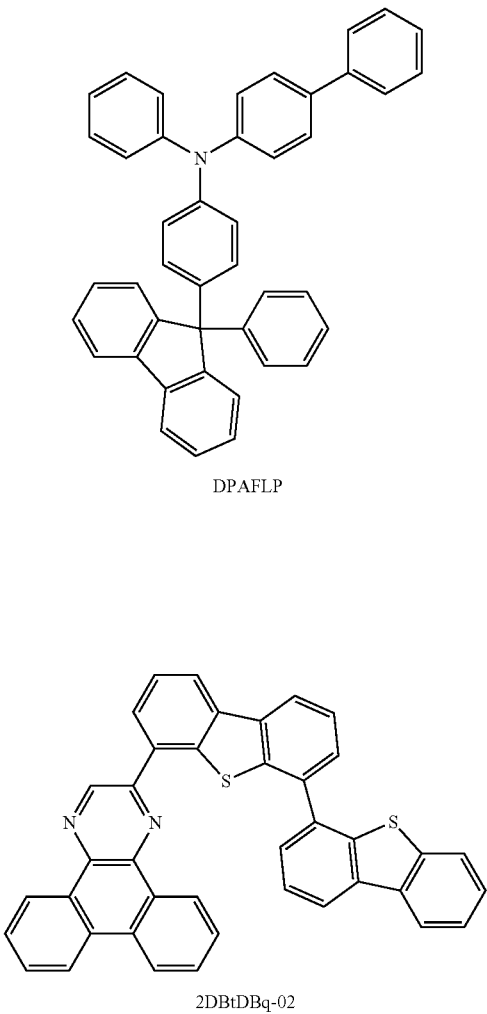
2DBtDBq-02 (ix)

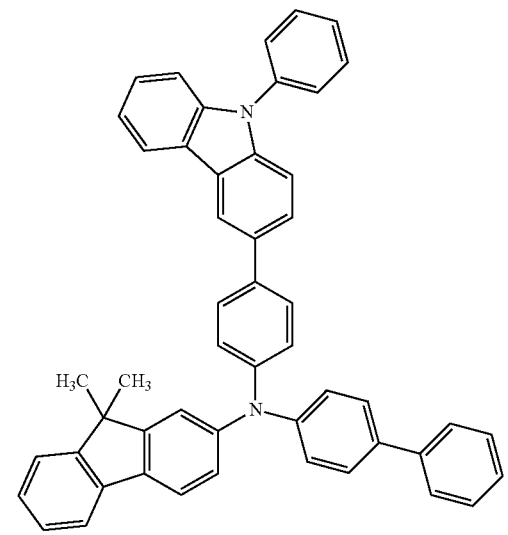
PCBBiF (iv)

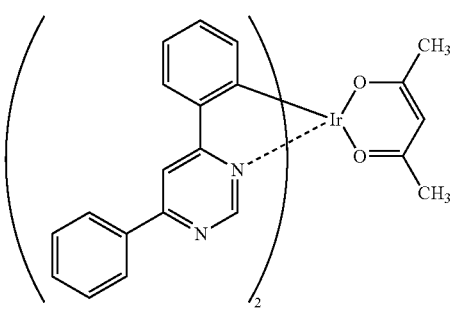
[Ir(dppm)$_2$(acac)] (v)

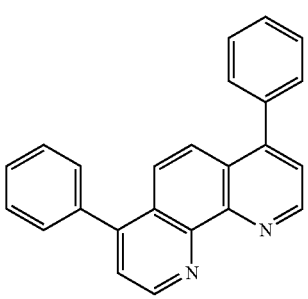
Bphen (vi)

A method for fabricating the light-emitting element 3 of this example is described below.

(Method for Fabricating Light-Emitting Element 3)

First, a film of indium tin oxide containing silicon oxide (ITSO) was formed over a glass substrate by a sputtering method, so that the first electrode 101 was formed. The thickness was 110 nm and the electrode area was 2 mm×2 mm. Here, the first electrode 101 functions as an anode of the light-emitting element.

Next, in pretreatment for forming the light-emitting element over the substrate, a surface of the substrate was washed with water and baked at 200° C. for one hour, and then UV ozone treatment was performed for 370 seconds.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, on the first electrode 101, 4,4',4''-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating to form the hole-injection layer 111. The thickness was set to 20 nm, and the weight ratio of DBT3P-II to molybdenum oxide was adjusted to 4:2 (=DBT3P-II:molybdenum oxide). Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) represented by Structural Formula (ii) was formed to a thickness of 20 nm over the hole-injection layer 111 to form the hole-transport layer 112.

In addition, the light-emitting layer 113 was formed over the hole-transport layer 112 in such a manner that 2-[6-(dibenzothiophen-4-yl)dibenzothiophen-4-yl]dibenzo[f,h]quinoxaline (abbreviation: 2DBtDBq-02) represented by Structural Formula (ix), N-(1,1'-biphenyl-4-yl)-N-[4-(9-phenyl-9H-carbazol-3-yl)phenyl]-9,9-dimethyl-9H-fluor en-2-amine (abbreviation: PCBBiF) represented by Structural Formula (iv), and (acetylacetonato)bis(4,6-diphenylpyrimidinato)iridium(III) (abbreviation: [Ir(dppm)$_2$(acac)]) represented by Structural Formula (v) were deposited by co-evaporation so that the weight ratio of 2DBtDBq-02 to PCBBiF and [Ir(dppm)$_2$(acac)] was 0.7:0.3: 0.05 (=2DBtDBq-02:PCBBiF:[Ir(dppm)$_2$(acac)]) to a thickness of 20 nm, and then 2DBtDBq-02, PCBBiF, and [Ir(dppm)$_2$(acac)] were deposited by co-evaporation so that the weight ratio of 2DBtDBq-02 to PCBBiF and [Ir(tBuppm)$_2$(acac)] was 0.8:0.2:0.05 (=2DBtDBq-02:PCBBiF: [ft(dppm)$_2$(acac)]) to a thickness of 20 nm.

Then, the electron-transport layer 114 was formed over the light-emitting layer 113 in such a manner that a 20 nm thick film of 2DBtDBq-02 was formed and a 10 nm thick film of bathophenanthroline (abbreviation: Bphen) represented by Structural Formula (vi) was formed.

After the formation of the electron-transport layer 114, lithium fluoride (LiF) was deposited by evaporation to a thickness of 1 nm to form the electron-injection layer 115. Finally, aluminum was deposited by evaporation to a thickness of 200 nm to form the second electrode 102 functioning as a cathode. Through the above-described steps, the light-emitting element 3 of this example was fabricated.

In a glove box under a nitrogen atmosphere, the light-emitting element 3 was sealed with a glass substrate so as not to be exposed to the air (specifically, application of a sealant onto an outer edge of the element, UV treatment, and heat treatment at 80° C. for 1 hour). After that, reliability of these light-emitting elements was measured. Note that the measurement was carried out at room temperature (in an atmosphere kept at 25° C.).

Figure 33:
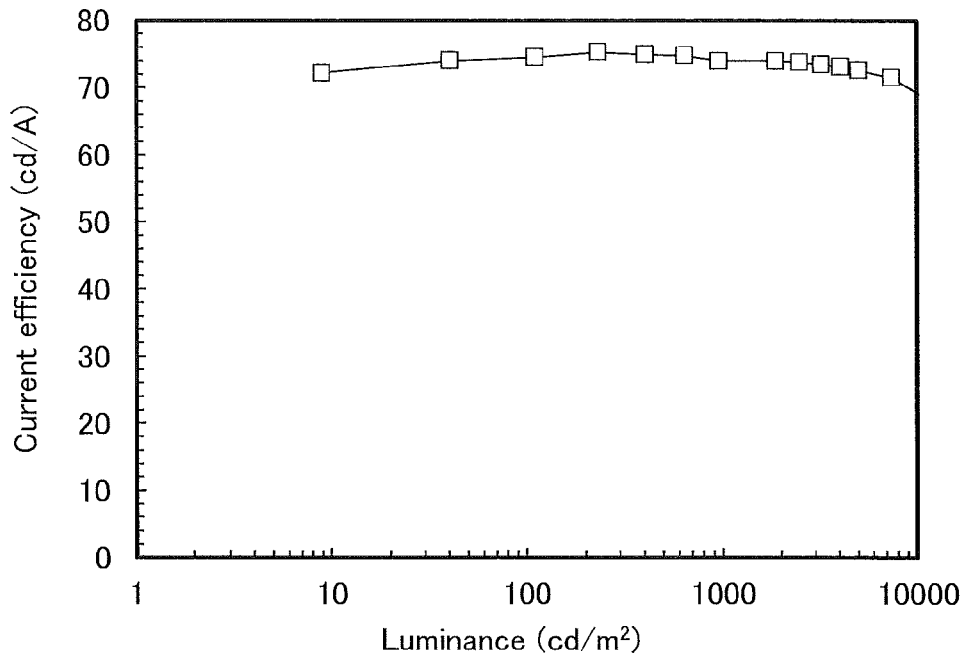
FIG. 33 shows luminance-current efficiency characteristics of the light-emitting element 2.
Figure 34:
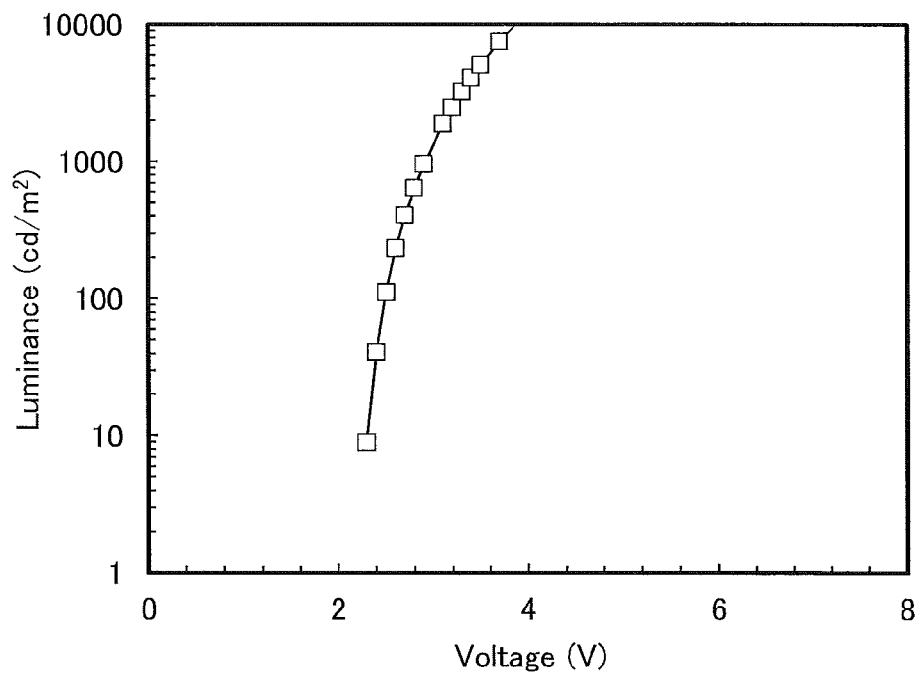
FIG. 34 shows voltage-luminance characteristics of a light-emitting element 3.
Figure 35:
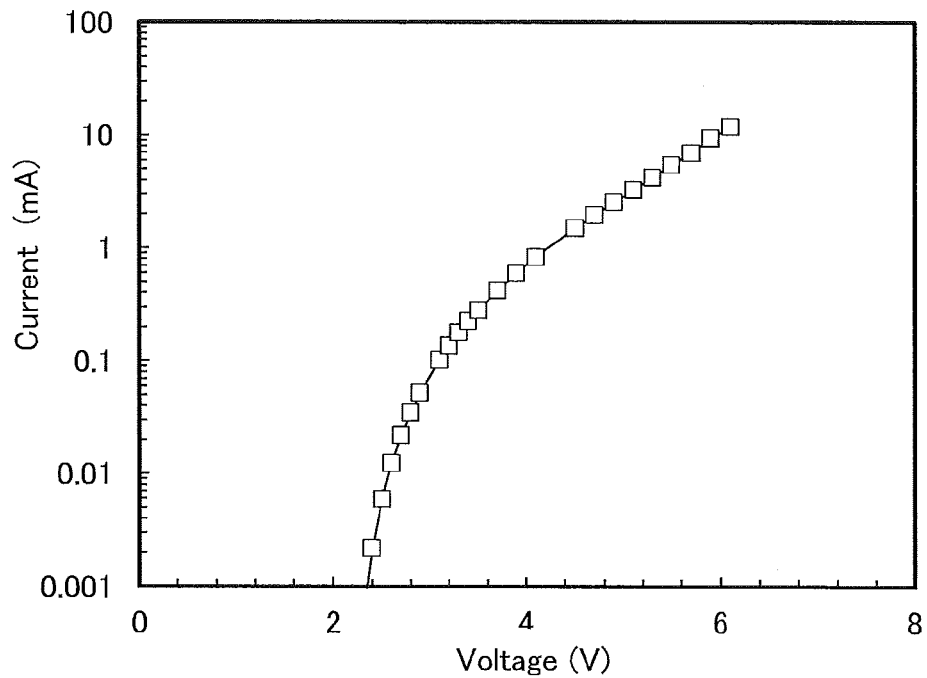
FIG. 35 shows voltage-current characteristics of the light-emitting element 3.
Figure 36:
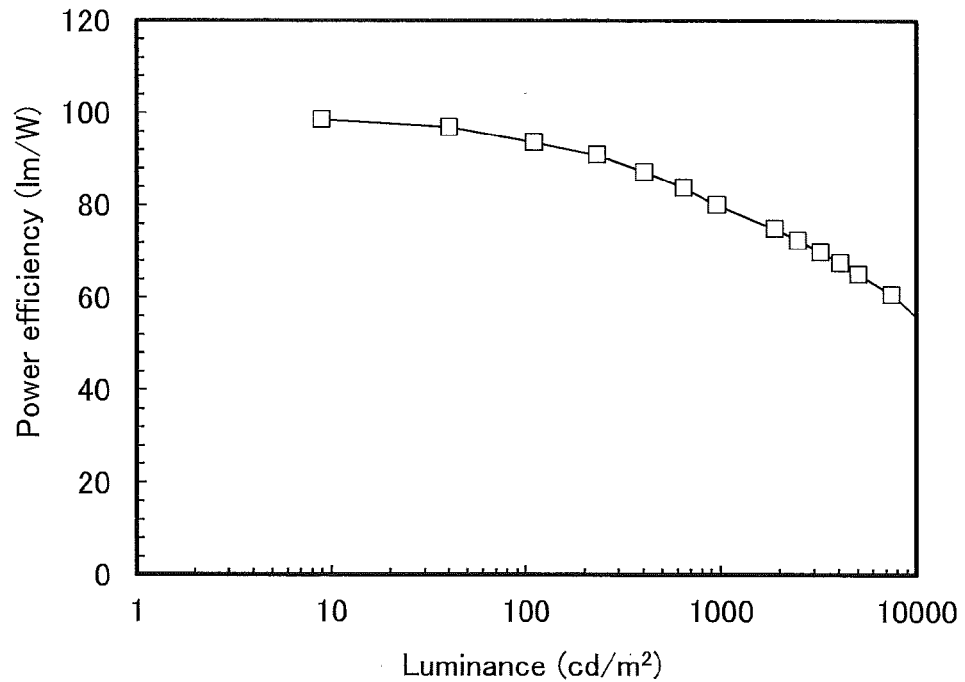
FIG. 36 shows luminance-power efficiency characteristics of the light-emitting element 3.
Figure 37:
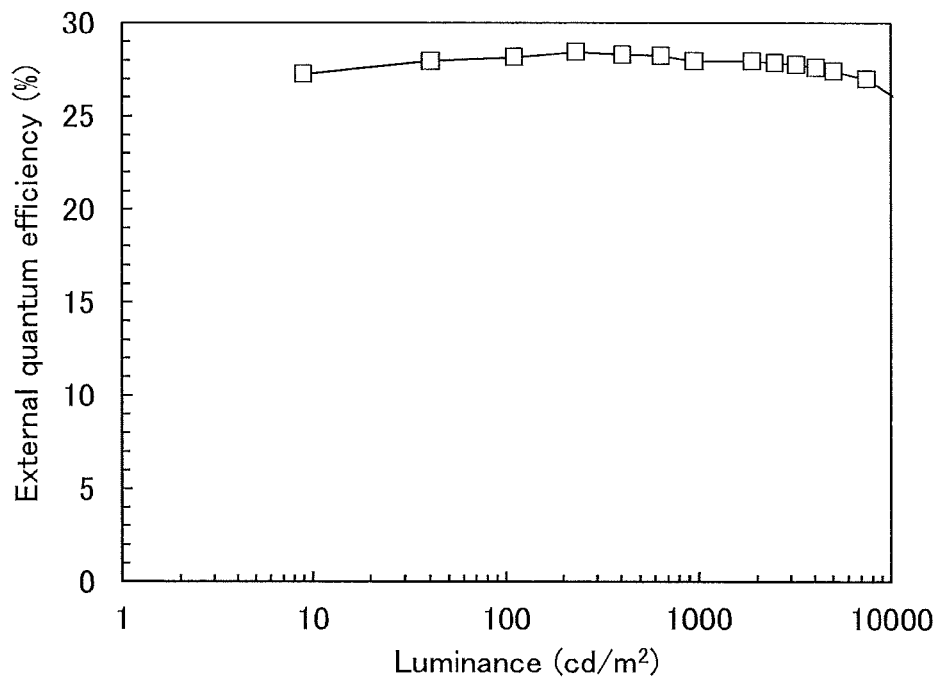
FIG. 37 shows luminance-external quantum efficiency characteristics of the light-emitting element 3.
Figure 38:
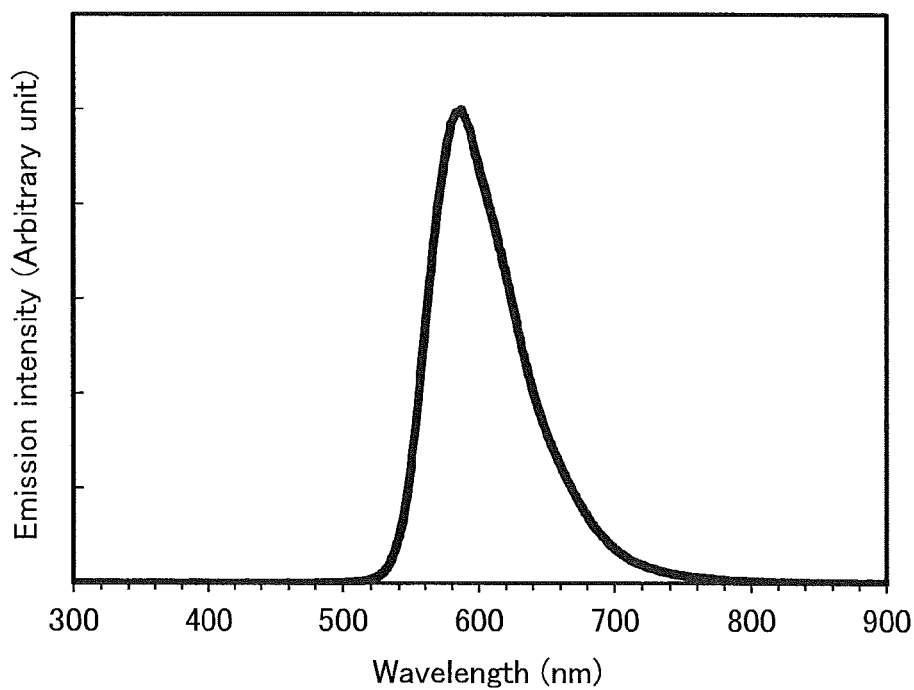
FIG. 38 shows an emission spectrum of the light-emitting element 3.

FIG. 33 shows luminance-current efficiency characteristics of the light-emitting element 3. FIG. 34 shows voltage-luminance characteristics of thereof. FIG. 35 shows voltage-current characteristics thereof. FIG. 36 shows luminance-power efficiency characteristics thereof. FIG. 37 shows luminance-external quantum efficiency characteristics thereof. FIG. 38 shows emission spectra thereof.

The results show that the light-emitting element 3 has excellent characteristics.

The light-emitting element 3 contains 2DBtDBq-02 that is the organic compound described in Embodiment 1 and thus has high heat resistance.

In addition, 2DBtDBq-02 can be synthesized easily by a small number of steps, which enables the light-emitting element 2 to be fabricated at relatively low cost.

As described above, the light-emitting element 3 of one embodiment of the present invention that contains 2DBtDBq-02 was found to be an excellent light-emitting element that has excellent characteristics (particularly, low drive voltage and high power efficiency) and high heat resistance and is advantageous in productivity.

Example 6

In this example, a method of synthesizing 2-{3-[6-(dibenzofuran-4-yl)dibenzofuran-4-yl]phenyl}dibenzo[f,h]quinoxaline (abbreviation: 2m(DBf2)PDBq) that is the organic compound of one embodiment of the present invention described in Embodiment 1 is described in detail.

Step 1: Synthesis of 4,4'-bidibenzofuran

Into a 500-mL three-neck flask was put 6.0 g (35 mmol) of dibenzofuran, and the air in the flask was replaced with nitrogen. To this flask was added 100 mL of tetrahydrofuran (abbreviation: THF), and this solution was cooled down to −80° C. Then, 22 mL (35 mmol) of n-butyllithium (a 1.6 mol/L hexane solution) was dripped into this solution with a syringe. After that, this mixture solution was stirred for 2 hours while its temperature was increased to room temperature. After the stirring, the solution was cooled down to −80° C., 4.8 g (36 mmol) of copper(II) chloride was added thereto, and the mixture was stirred for 15 hours while its temperature was returned to room temperature. After the stirring, approximately 500 mL of water was added to this solution, followed by stirring for 1 hour to precipitate a solid. The precipitated solid was collected by suction filtration. The collected solid was dissolved in approximately 200 mL of hot toluene, this mixture was stirred and suction-filtered through Celite (Catalog No. 531-16855, produced by Wako Pure Chemical Industries, Ltd.), alumina, and Florisil (Catalog No. 540-00135, produced by Wako Pure Chemical Industries, Ltd.). The obtained filtrate was recrystallized from toluene/hexane to give 3.5 g of white powder, which was an objective substance, in 60% yield. Synthesis Scheme (c-1) of Step 1 is shown below.

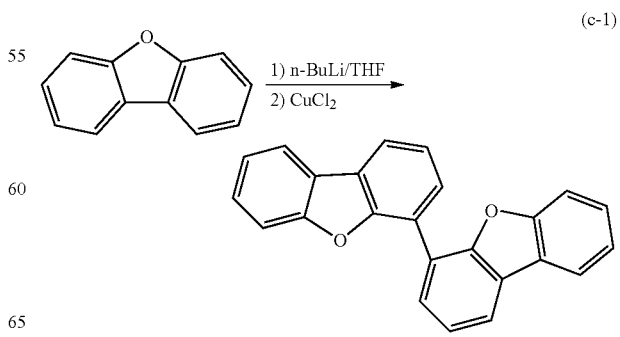

(c-1)

Step 2: Synthesis of 4-iodo-6,6'-bidibenzofuran

Into a 200-mL three-neck flask was put 3.0 g (9.0 mmol) of 4,4'-bidibenzofuran, and the air in the flask was replaced with nitrogen. To this flask was added 45 mL of THF to dissolve 4,4'-bidibenzofuran, and the mixture was cooled down to −80° C. Then, 5.6 mL (9.0 mmol) of n-butyllithium (a 1.6 mol/L hexane solution) was dripped into this solution with a syringe. After that, the mixture solution was stirred for 2 hours while its temperature was increased to room temperature. After the stirring, this solution was cooled down to −80° C. Then, a solution in which 2.5 g (10 mmol) of iodine had been dissolved in 20 mL of THF was dripped into this solution with a dripping funnel, and the mixture was stirred for 18 hours while its temperature was returned to room temperature. After the stirring, approximately 10 mL of dilute hydrochloric acid (1.0 mol/L) was added to this solution, and the mixture was stirred for 2 hours. After the stirring, an aqueous layer of the mixture was extracted with ethyl acetate, and the extracted solution and an organic layer of the mixture were combined and washed with a saturated solution of sodium hydrogen carbonate and saturated brine. The organic layer was dried with magnesium sulfate and gravity-filtered. The obtained filtrate was concentrated to give a light brown solid. The obtained solid was purified by HPLC and washed with toluene to give 2.2 g of white powder, which was an objective substance, in 53% yield. Synthesis Scheme (c-2) of Step 2 is shown below.

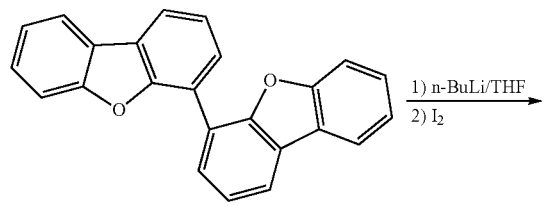

(c-2)

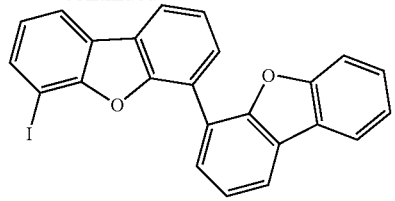

Step 3: Synthesis of 2-{3-[6-(dibenzofuran-4-yl)dibenzofuran-4-yl]phenyl}dibenzo[f,h]quinoxaline (Abbreviation: 2m(DBf2)PDBq)

Into a 200-mL three-neck flask were put 1.4 g (3.2 mmol) of 2-[3-(dibenzo[f,h]quinoxalin-2-yl)phenyl]-4,4,5,5-tetramethyl-1,3,2-dioxaborolane, 2.2 g (4.8 mmol) of 4-iodo-6,6'-bidibenzofuran, and 3.0 mL of an aqueous solution of sodium carbonate (2.0 mol/L), and the air in the flask was replaced with nitrogen. To this mixture, 16 mL of ethylene glycol dimethyl ether (abbreviation: DME) was added. This mixture was degassed by being stirred while the pressure was reduced. To this mixture was added 37 mg (0.032 mmol) of palladium(II) acetate, and the mixture was stirred at 80° C. under a nitrogen stream for 42 hours to precipitate a solid. The precipitated solid was collected by suction filtration. The collected solid was dissolved in approximately 700 mL of hot toluene, and this solution was suction-filtered through Celite, alumina, and Florisil. The obtained filtrate was concentrated to give an oily substance. The resulting oily substance was dissolved in approximately 10 mL of toluene, 50 mL of ethanol was added thereto, and the mixture was irradiated with ultrasonic waves to precipitate a solid. The precipitated solid was collected by suction filtration to give 1.2 g of white powder, which was an objective substance, in 61% yield. Synthesis Scheme (c-3) of Step 3 is shown below.

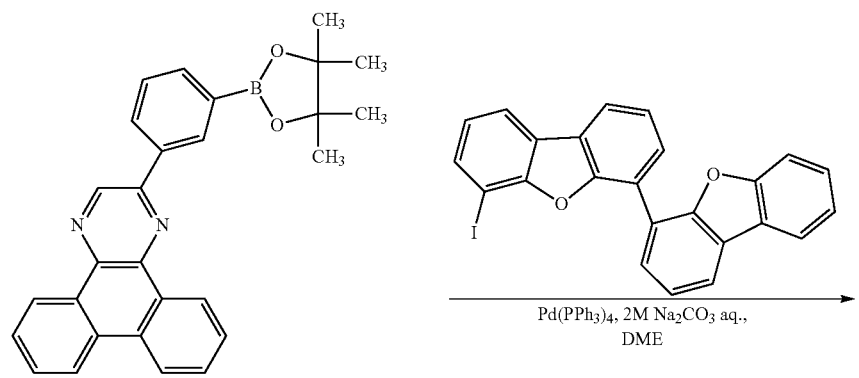

(c-3)

-continued

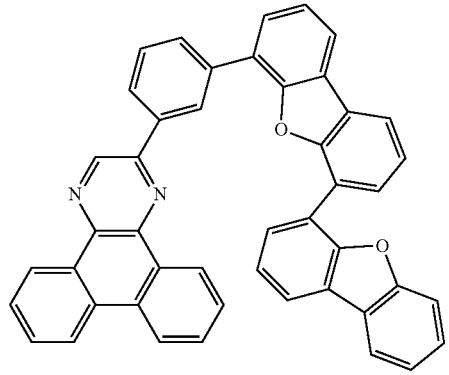

By a train sublimation method, 1.2 g of the obtained white powder was purified. In the sublimation purification, 2m(DBf2)PDBq was heated at 330° C. under a pressure of 10 Pa with an argon flow rate of 5.0 mL/min to give 0.46 g of a light yellow glassy solid of 2m(DBf2)PDBq at a collection rate of 37%.

The obtained substance was measured by $^1$H NMR. Measurement results are as follows. $^1$H NMR (CDCl$_3$, 500 MHz): δ=7.12 (t, $J_1$=2.5 Hz, 1H), 7.29-7.33 (m, 2H), 7.42 (ddd, $J_1$=8.0 Hz, $J_2$=8.0 Hz, $J_3$=1.0 Hz, 1H), 7.50 (d, $J_1$=8.0 Hz, 1H), 7.56-7.67 (m, 5H), 7.78-7.86 (m, 4H), 7.93 (dd, $J_1$=7.5 Hz, $J_2$=1.0 Hz, 1H), 8.01 (dd, $J_1$=7.5 Hz, $J_2$=1.0 Hz, 1H), 8.07-8.13 (m, 3H), 8.20 (d, $J_1$=8.0 Hz, 1H), 8.58 (d, $J_1$=8.0 Hz, 1H), 8.66 (d, $J_1$=8.0 Hz, 1H), 8.95 (st, $J_1$=1.5 Hz, 1H), 9.22 (dd, $J_1$=8.0 Hz, $J_2$=1.0 Hz, 1H), 9.25-9.27 (m, 2H).

Figure 39A:
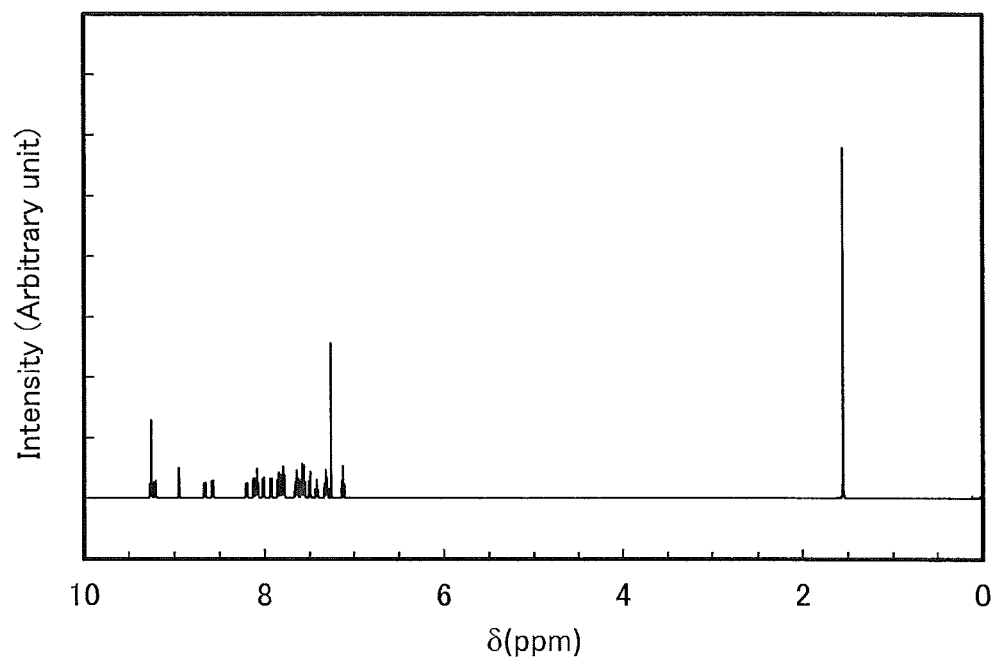
FIGS. 39A and 39B are $^1$H-NMR charts of 2m(DBf2)PDBq.
Figure 39B:
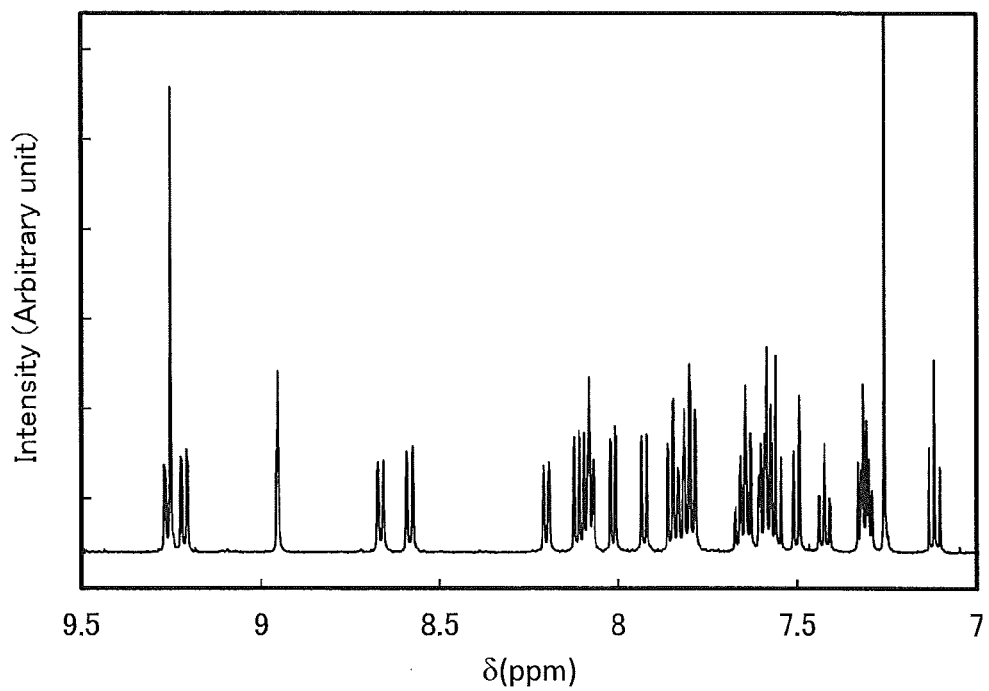

FIGS. 39A and 39B are $^1$H-NMR charts. Note that FIG. 39B is a chart where the range of from 7.00 ppm to 9.50 ppm in FIG. 39A is enlarged. The charts reveal that 2m(DBf2)PDBq represented by Structural Formula (120) that is a heterocyclic compound of one embodiment of the present invention was obtained.

In addition, 2m(DBf2)PDBq was analyzed by liquid chromatography mass spectrometry (LC/MS). The analysis by LC/MS was carried out with Acquity UPLC (manufactured by Waters Corporation), and Xevo G2 Tof MS (manufactured by Waters Corporation).

In the MS, ionization was carried out by an electrospray ionization (abbreviation: ESI) method. At this time, the capillary voltage and the sample cone voltage were set to 3.0 kV and 30 V, respectively, and detection was performed in a positive mode. A component that underwent the ionization under the above-described conditions was collided with an argon gas in a collision cell to dissociate into product ions. The energy (collision energy) for the collision with argon was 70 eV. The mass range for the measurement was m/z=100 to 1200.

Figure 40:
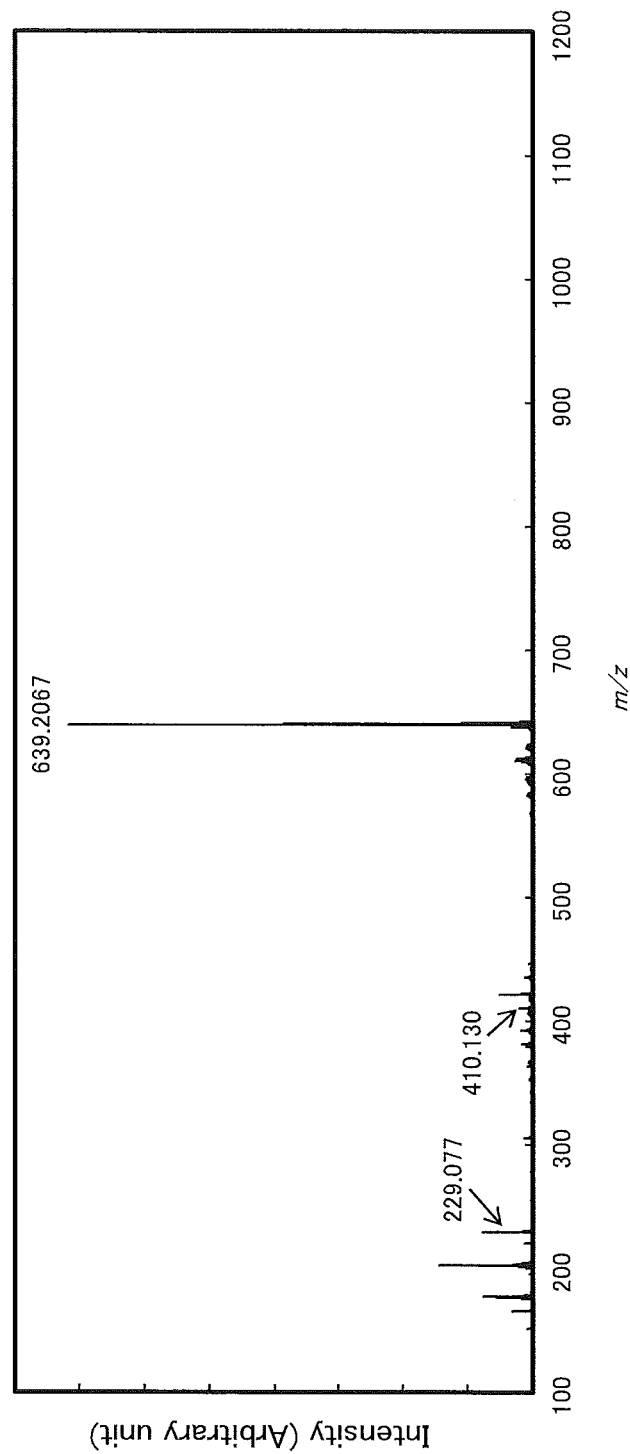
FIG. 40 shows results of LC/MS analysis of 2m(DBf2)PDBq.

Measurement results are shown in FIG. 40. The results in FIG. 40 shows that the product ions of 2m(DBf2)PDBq, which is the heterocyclic compound of one embodiment of the present invention represented by Structural Formula (120), are detected mainly around m/z=639, around m/z=410, and around m/z=229. Note that the results in FIG. 40 show characteristics derived from 2m(DBf2)PDBq and thus can be regarded as important data for identifying 2m(DBf2)PDBq contained in a mixture. It is probable that a C—C bond between dibenzo[f,h]quinoxaline and a phenylene group is cut, electric charge remains on the dibenzo[f,h]quinoxaline side, and the data appearing around m/z=229 is thus data on a state where the C—C bond between dibenzo[f,h]quinoxaline and the phenylene group the compound represented by Structural Formula (120) is cut; thus, the data is useful. In addition, the product ion around m/z=410 can be presumed to be a product ion of a bidibenzofuran ring and one benzene ring; thus, it is suggested that 2m(DBf2)PDBq, which is the heterocyclic organic compound of one embodiment of the present invention, includes a bidibenzofuran ring and a benzene ring.

Thermogravimetry-differential thermal analysis (TG-DTA) was performed on 2m(DBf2)PDBq. The measurement was conducted by using a high vacuum differential type differential thermal balance (TG/DTA 2410SA, manufactured by Broker AXS K.K.). The measurement was conducted under a nitrogen stream (flow rate: 200 mL/min) at normal pressure at a temperature rising rate of 10° C./min. It was found from the relationship between weight and temperature (thermogravimetry) that the 5% weight loss temperature was 480° C. This indicates that 2m(DBf2)PDBq has high heat resistance.

Figure 41A:
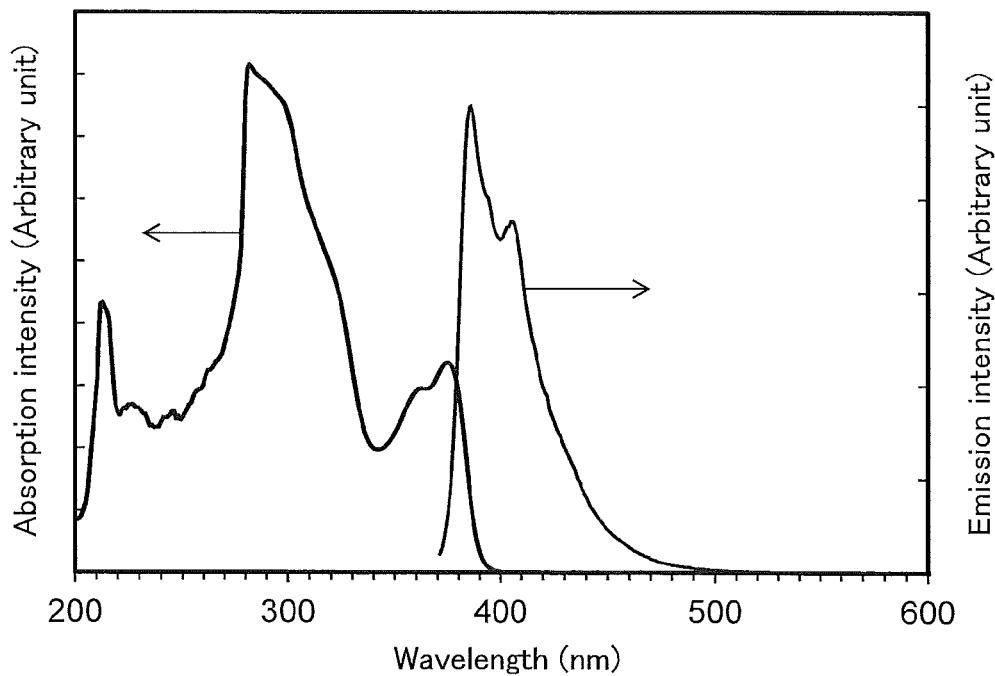
FIGS. 41A and 41B show absorption spectra and emission spectra of 2m(DBf2)PDBq in a toluene solution and a solid thin film.
Figure 41B:
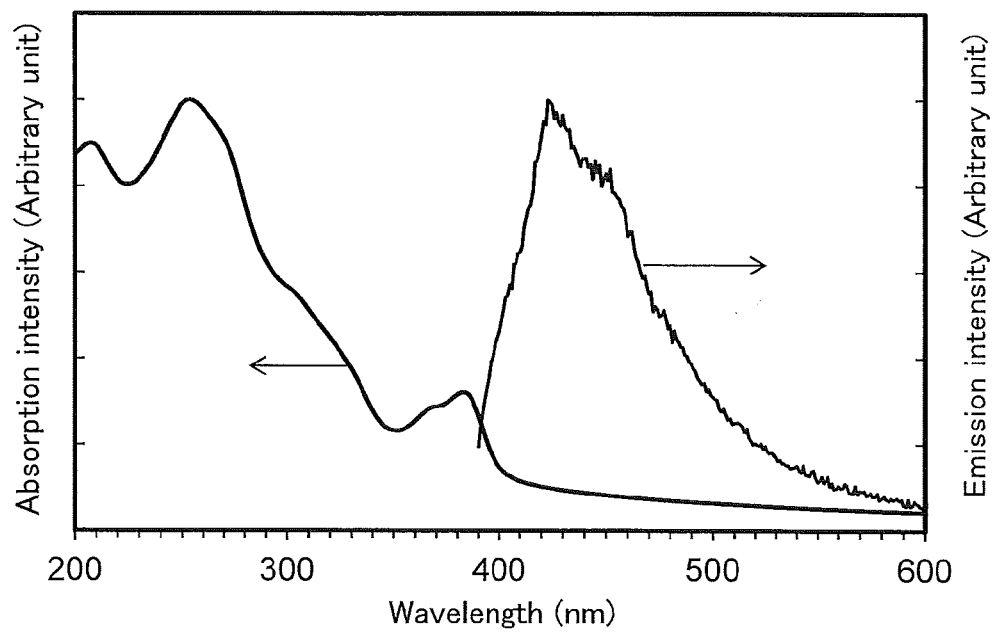

Next, ultraviolet-visible absorption spectra (hereinafter, simply referred to as "absorption spectra") and emission spectra of 2m(DBf2)PDBq in a toluene solution and a solid thin film were measured. The solid thin film was formed over a quartz substrate by a vacuum evaporation method. The absorption spectra were measured with an ultraviolet-visible light spectrophotometer (V550 type manufactured by Japan Spectroscopy Corporation). The emission spectra were measured with a fluorescence spectrophotometer (FS920 manufactured by Hamamatsu Photonics Corporation). FIGS. 41A and 41B show the measured absorption spectra and emission spectra of 2m(DBf2)PDBq in the toluene solution and in the solid thin film.

According to FIG. 41A, the absorption peaks of 2m(DBf2) PDBq in the toluene solution are observed around 282 nm, 362 nm, and 375 nm, and the emission wavelength peaks are observed at 386 nm and 405 nm According to FIG. 41B, the absorption peaks of 2m(DBf2)PDBq in the thin film are observed around 208 nm, 253 nm, 273 nm, 303 nm, 330 nm, 368 nm, and 383 nm, and the emission wavelength peak is observed at 386 nm (excitation wavelength: 374 nm).

The ionization potential of 2m(DBf2)PDBq in the thin film was measured by photoelectron spectroscopy (with the use of AC-2, manufactured by Riken Keiki, Co., Ltd.) in the air. The obtained value of the ionization potential was converted into a negative value, so that the HOMO level of 2m(DBf2)PDBq was −6.30 eV. From the data of the absorption spectrum of the thin film in FIG. 41B, the absorption edge of 2m(DBf2) PDBq, which was obtained from Tauc plot with an assumption of direct transition, was 3.11 eV. Thus, the optical energy gap of 2m(DBf2)PDBq in the solid state was estimated at 3.11 eV; from the values of the HOMO level obtained above and this energy gap, the LUMO level of 2m(DBf2)PDBq can be estimated at −3.19 eV. This reveals that 2m(DBf2)PDBq in the solid state has an energy gap as wide as 3.09 eV.

Example 7

In this example, light-emitting elements of embodiments of the present invention (i.e., a light-emitting element 4 and a light-emitting element 5) are described. Structure formulae of organic compounds used for the light-emitting elements 4 and 5 are shown below.

-continued (xi)

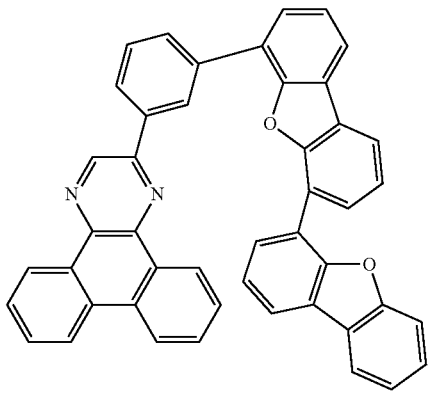

2m(DBf2)PDBq (i)

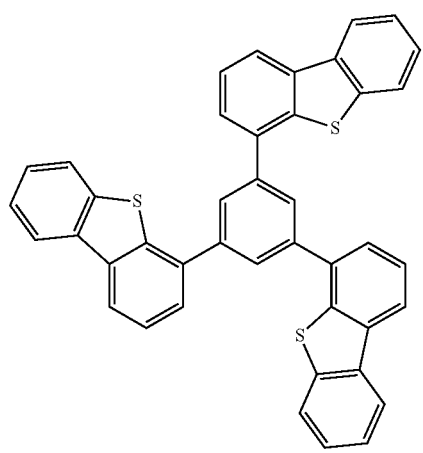

DBT3P-II (iv)

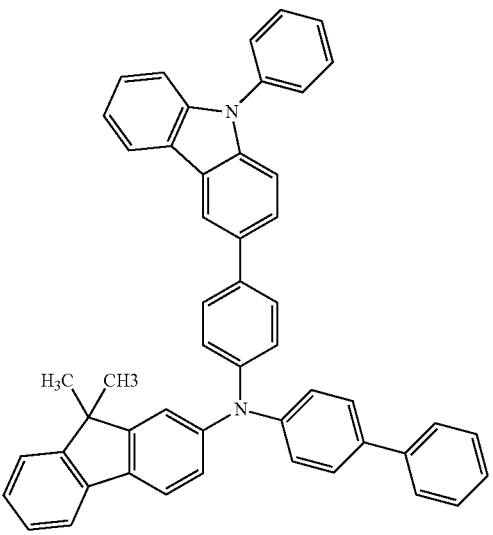

PCBBiF (ii)

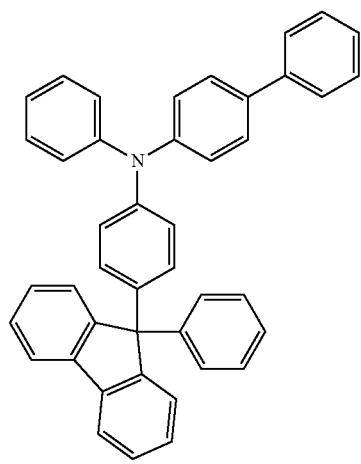

BPAFLP (v)

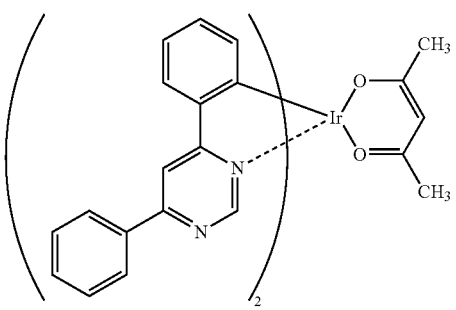

[Ir(dppm)₂(acac)]

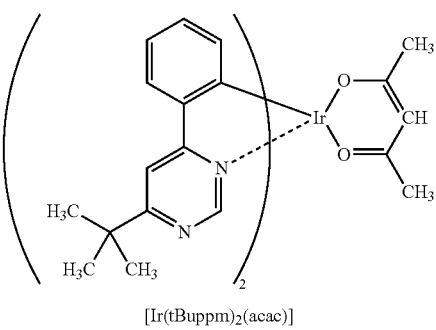

[Ir(tBuppm)₂(acac)]    (vii)

Bphen    (vi)

Methods for fabricating the light-emitting elements 4 and 5 of this example are described below.

(Method for Fabricating Light-Emitting Element 4)

First, a film of indium tin oxide containing silicon oxide (ITSO) was formed over a glass substrate by a sputtering method, so that the first electrode 101 was formed. The thickness was 110 nm and the electrode area was 2 mm×2 mm Here, the first electrode 101 functions as an anode of the light-emitting element.

Next, in pretreatment for forming the light-emitting element over the substrate, a surface of the substrate was washed with water and baked at 200° C. for one hour, and then UV ozone treatment was performed for 370 seconds.

After that, the substrate was transferred into a vacuum evaporation apparatus where the pressure had been reduced to approximately 10⁻⁴ Pa, and was subjected to vacuum baking at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus so that the surface on which the first electrode 101 was formed faced downward. The pressure in the vacuum evaporation apparatus was reduced to about 10⁻⁴ Pa. After that, on the first electrode 101, 4,4',4''-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating to form the hole-injection layer 111. The thickness was set to 20 nm, and the weight ratio of DBT3P-II to molybdenum oxide was adjusted to 4:2 (=DBT3P-II:molybdenum oxide). Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) which is represented by Structural Formula (ii) was formed to a thickness of 20 nm over the hole-injection layer 111 to form the hole-transport layer 112.

In addition, the light-emitting layer 113 was formed over the hole-transport layer 112 in such a manner that 2-{3-[6-(dibenzofuran-4-yl)dibenzofuran-4-yl]phenyl}dibenzo[f,h]quinoxaline (abbreviation: 2m(DBf2)PDBq) represented by Structural Formula (xi), N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (iv), and (acetylacetonato)bis(4,6-diphenylpyrimidinato)iridium(III) (abbreviation: [Ir(dppm)₂(acac)]) represented by Structural Formula (v) were deposited by co-evaporation so that the weight ratio of 2m(DBf2)PDBq to PCBBiF and [Ir(dppm)₂(acac)] was 0.7:0.3:0.05 (=2m(DBf2)PDBq:PCBBiF:[Ir(dppm)₂(acac)]) to a thickness of 20 nm, and then 2m(DBf2)PDBq, PCBBiF, and [Ir(dppm)₂(acac)] were deposited by co-evaporation so that the weight ratio of 2m(DBf2)PDBq to PCBBiF and [Ir(dppm)₂(acac)] was 0.8:0.2:0.05 (=2m(DBf2)PDBq:PCBBiF:[Ir(dppm)₂(acac)]) to a thickness of 20 nm.

Then, the electron-transport layer 114 was formed over the light-emitting layer 113 in such a manner that a 20 nm thick film of 2m(DBf2)PDBq was formed and a 10 nm thick film of bathophenanthroline (abbreviation: Bphen) represented by Structural Formula (vi) was formed.

After the formation of the electron-transport layer 114, lithium fluoride (LiF) was deposited by evaporation to a thickness of 1 nm to form the electron-injection layer 115. Finally, aluminum was deposited by evaporation to a thickness of 200 nm to form the second electrode 102 functioning as a cathode. Through the above-described steps, the light-emitting element 4 of this example was fabricated.

(Method of Fabricating Light-Emitting Element 5)

The light-emitting element 5 was fabricated in the same manner as that of the light-emitting element 4 except that (acetylacetonato)bis(6-tert-butyl-4-phenylpyrimidinato)iridium(III) (abbreviation: [Ir(tBuppm)₂(acac)]) represented by Structural Formula (vii) was used instead of [Ir(dppm)₂(acac)] used for the light-emitting element 4.

In a glove box under a nitrogen atmosphere, the light-emitting elements 4 and 5 were each sealed with a glass substrate so as not to be exposed to the air (specifically, application of a sealant onto an outer edge of the element, UV treatment, and heat treatment at 80° C. for 1 hour). After that, reliability of these light-emitting elements was measured. Note that the measurement was carried out at room temperature (in an atmosphere kept at 25° C.).

Figure 42:
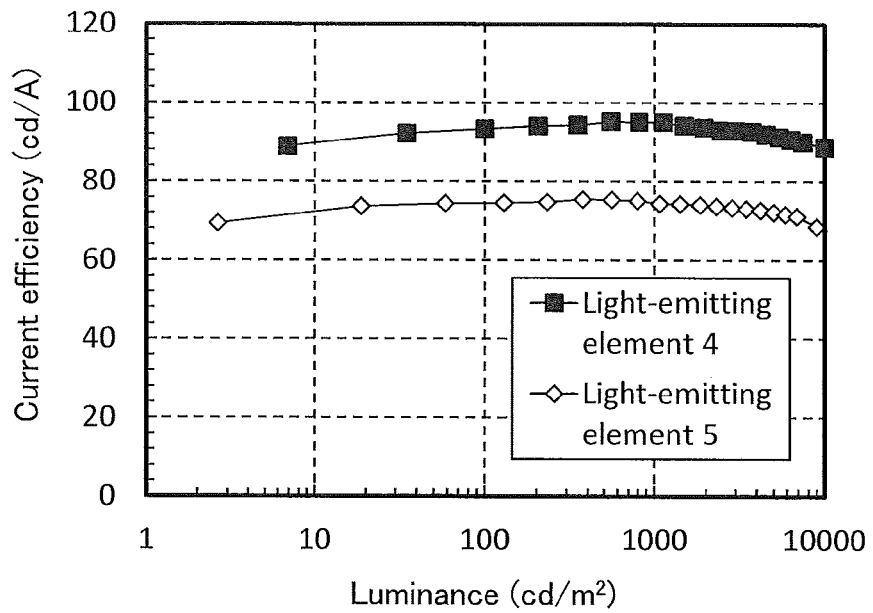
FIG. 42 shows current efficiency-luminance characteristics of a light-emitting element 4 and a light-emitting element 5.
Figure 43:
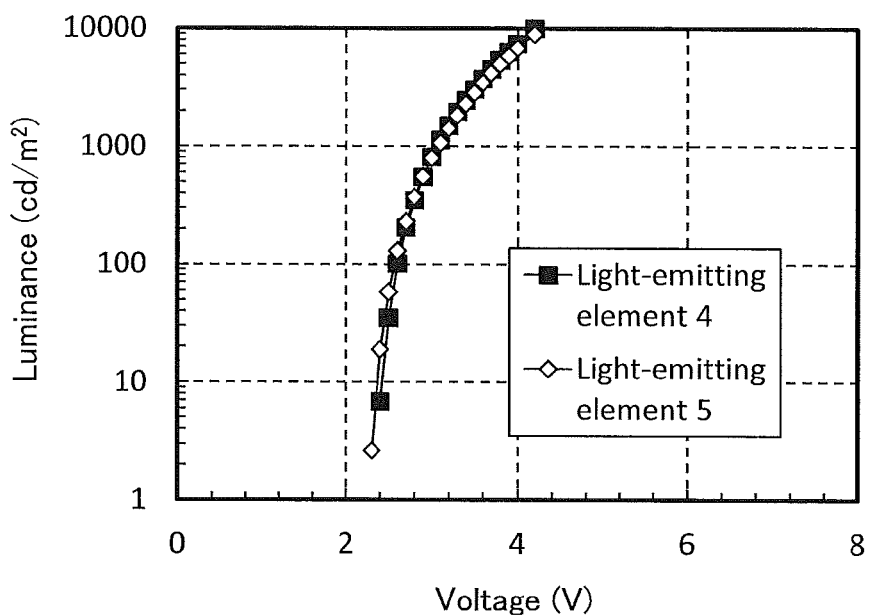
FIG. 43 shows voltage-luminance characteristics of the light-emitting element 4 and the light-emitting element 5.
Figure 44:
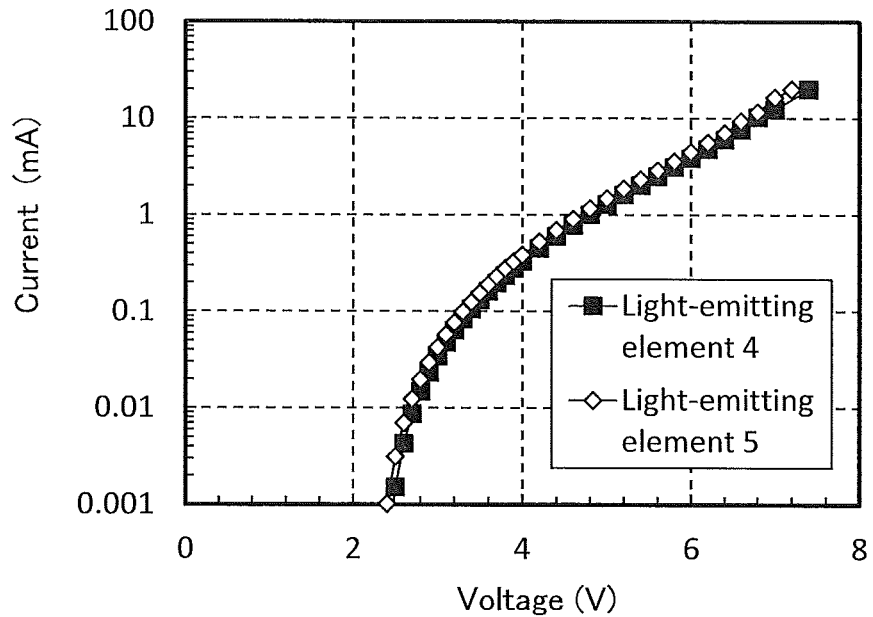
FIG. 44 shows voltage-current characteristics of the light-emitting element 4 and the light-emitting element 5.
Figure 45:
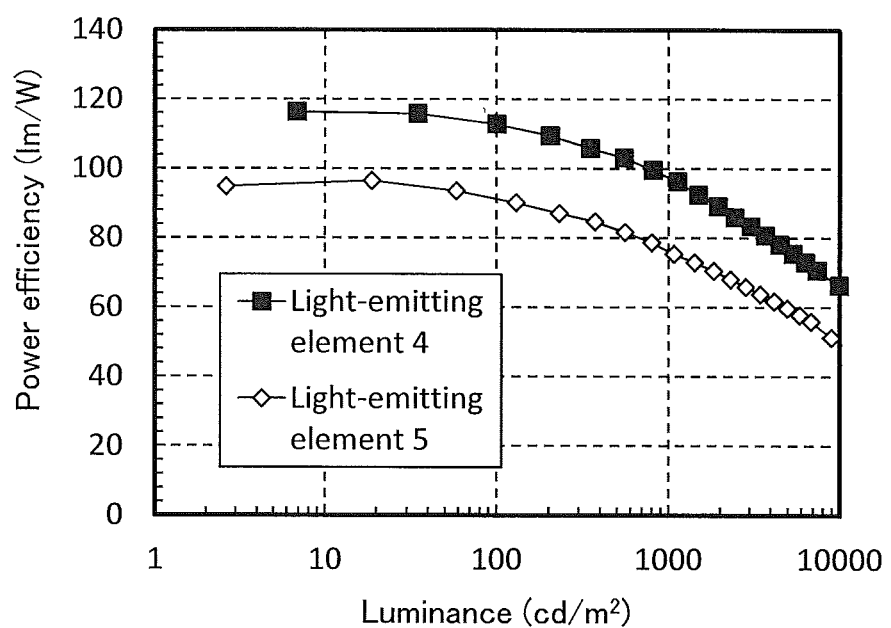
FIG. 45 shows luminance-power efficiency characteristics of the light-emitting element 4 and the light-emitting element 5.
Figure 46:
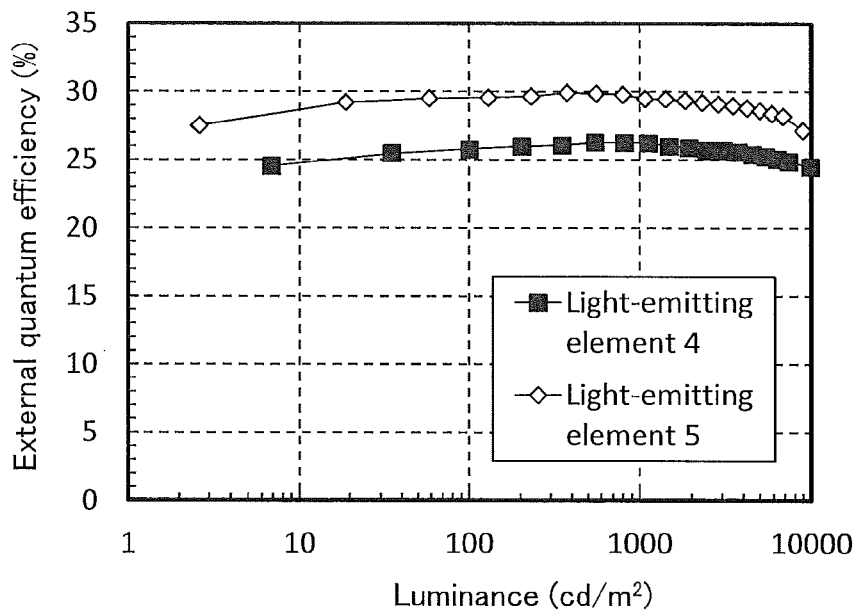
FIG. 46 shows luminance-external quantum efficiency characteristics of the light-emitting element 4 and the light-emitting element 5.
Figure 47:
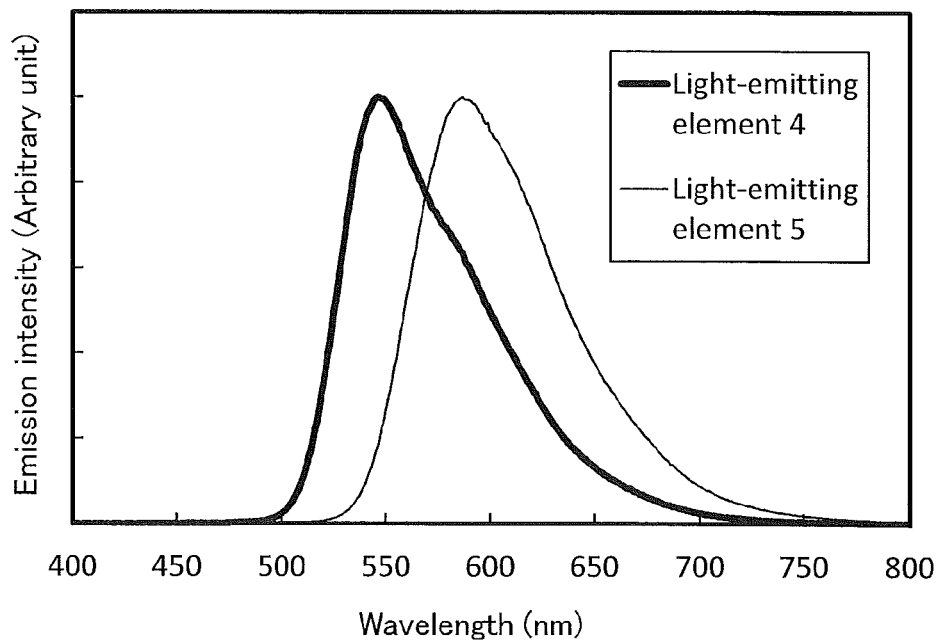
FIG. 47 shows emission spectra of the light-emitting element 4 and the light-emitting element 5.

FIG. 42 shows luminance-current efficiency characteristics of the light-emitting elements 4 and 5. FIG. 43 shows voltage-luminance characteristics of thereof. FIG. 44 shows voltage-current characteristics thereof. FIG. 45 shows luminance-power efficiency characteristics thereof. FIG. 46 shows luminance-external quantum efficiency characteristics thereof. FIG. 47 shows emission spectra thereof.

The results show that the light-emitting elements 4 and 5 have excellent characteristics. In other words, the light-emitting elements 4 and 5 of embodiments of the present invention can have lower drive voltage while keeping efficiency (i.e., current efficiency and external quantum efficiency) and reliability as compared to a conventional light-emitting element.

The light-emitting elements 4 and 5 contain 2m(DBf2)PDBq that is the organic compound described in Embodiment 1 and thus have high heat resistance.

In addition, 2m(DBf2)PDBq can be synthesized easily by a small number of steps, which enables the light-emitting elements 4 and 5 to be fabricated at relatively low cost and to have high productivity.

It is found from the above results that the light-emitting elements 4 and 5 of embodiments of the present invention that contain 2m(DBf2)PDBq are excellent light-emitting elements that have excellent characteristics (particularly, low drive voltage and high power efficiency) and high heat resistance and are advantageous in productivity.

This application is based on Japanese Patent Application serial No. 2013-189491 filed with the Japan Patent Office on Sep. 12, 2013, the entire contents of which are hereby incorporated by reference.

What is claimed is:

1. An organic compound represented by General Formula (G1):

$$A-(Ar)_n-B \quad (G1)$$

wherein A represents a substituted or unsubstituted dibenzoquinoxaline skeleton,
wherein B represents a substituted or unsubstituted 4,4'-bidibenzofuran skeleton or 4,4'-bidibenzothiophene skeleton,
wherein Ar represents an arylene group having 6 to 13 carbon atoms,
wherein n is an integer of 0 to 2,
wherein the substituted or unsubstituted dibenzoquinoxaline skeleton is bonded to the arylene group having 6 to 13 carbon atoms at 2 position, and
wherein the substituted or unsubstituted 4,4'-bidibenzofuran skeleton or 4,4'-bidibenzothiophene skeleton is bonded to the arylene group having 6 to 13 carbon atoms at 6 position.

2. The organic compound according to claim 1, wherein Ar represents any one of a substituted or unsubstituted phenylene group, a substituted or unsubstituted naphthalenediyl group, a substituted or unsubstituted biphenyldiyl group, and a substituted or unsubstituted fluorenediyl group.

3. A light-emitting element comprising the organic compound according to claim 1.

4. A light-emitting device comprising:
the light-emitting element according to claim 3; and
a unit for controlling the light-emitting element.

5. A display device comprising:
the light-emitting element according to claim 3 in a display portion; and
a unit for controlling the light-emitting element.

6. A lighting device comprising:
the light-emitting element according to claim 3 in a lighting portion; and
a unit for controlling the light-emitting element.

7. An organic compound represented by General Formula (G2):

(G2)

wherein Ar represents an arylene group having 6 to 13 carbon atoms,
wherein n is an integer of 0 to 2,
wherein $R^1$ to $R^{22}$ separately represent hydrogen or an alkyl group having 1 to 6 carbon atoms, and
wherein X represents an oxygen atom or a sulfur atom.

8. The organic compound according to claim 7, wherein n is 0.

9. The organic compound according to claim 7, wherein $R^1$ to $R^{22}$ are hydrogen.

10. A light-emitting element comprising the organic compound according to claim 7.

11. A light-emitting device comprising:
the light-emitting element according to claim 10; and
a unit for controlling the light-emitting element.

12. A display device comprising:
the light-emitting element according to claim 10 in a display portion; and
a unit for controlling the light-emitting element.

13. A lighting device comprising:
the light-emitting element according to claim 10 in a lighting portion; and
a unit for controlling the light-emitting element.

14. An organic compound represented by General Formula (g1) and General Formula (g2):

(g1)

(g2)

wherein $R^1$ to $R^{22}$ separately represent hydrogen or an alkyl group having 1 to 6 carbon atoms,
wherein X represents an oxygen atom or a sulfur atom,
wherein one of $R^{30}$ to $R^{34}$ represents a group represented by General Formula (g2) and is bonded at a position represented by *, and
wherein the others of $R^{30}$ to $R^{34}$ separately represent hydrogen or an alkyl group having 1 to 6 carbon atoms.

15. The organic compound according to claim 14, wherein the organic compound is represented by General Formula (G3):

(G3)
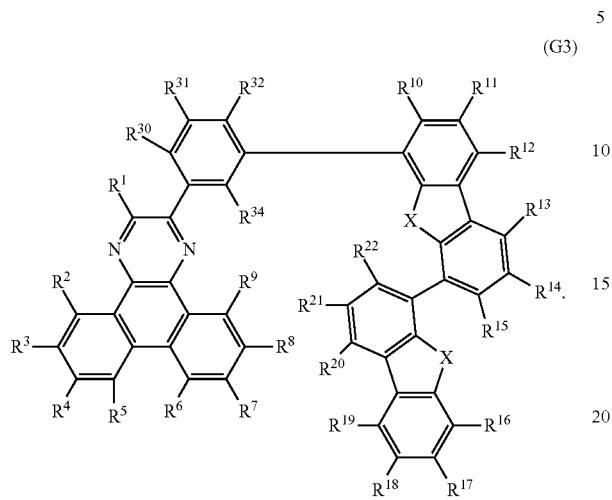

16. The organic compound according to claim 14, wherein $R^1$ to $R^{22}$ and $R^{30}$ to $R^{34}$ are hydrogen.

17. A light-emitting element comprising the organic compound according to claim 14.

18. A light-emitting device comprising:
the light-emitting element according to claim 17; and
a unit for controlling the light-emitting element.

19. A display device comprising:
the light-emitting element according to claim 17 in a display portion; and
a unit for controlling the light-emitting element.

20. A lighting device comprising:
the light-emitting element according to claim 17 in a lighting portion; and
a unit for controlling the light-emitting element.

21. The organic compound according to claim 1, wherein the organic compound is represented by formulae (100) to (117), (100)
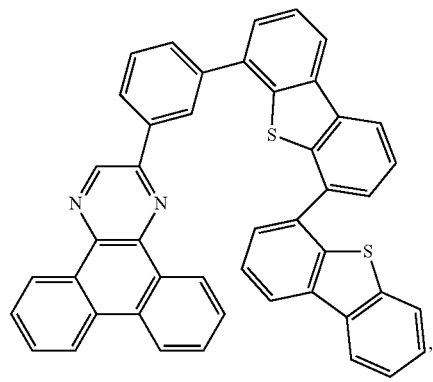

-continued (101)
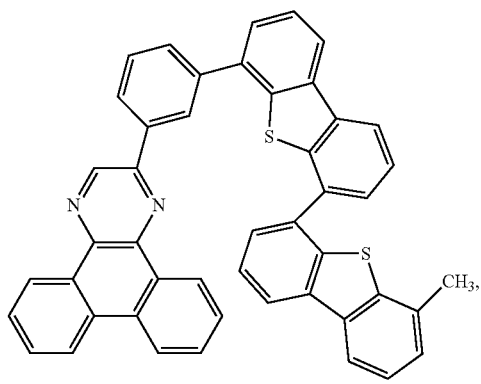

(102)
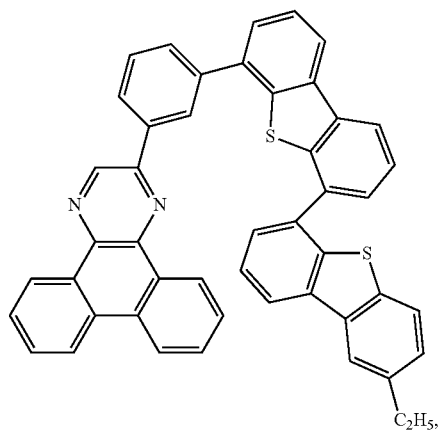

(103)
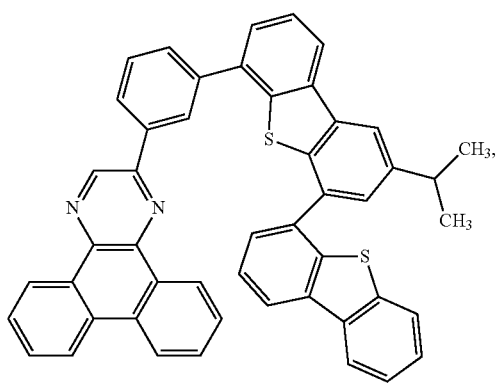

(104)
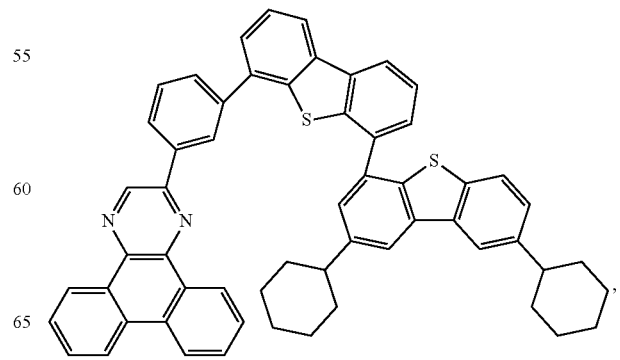

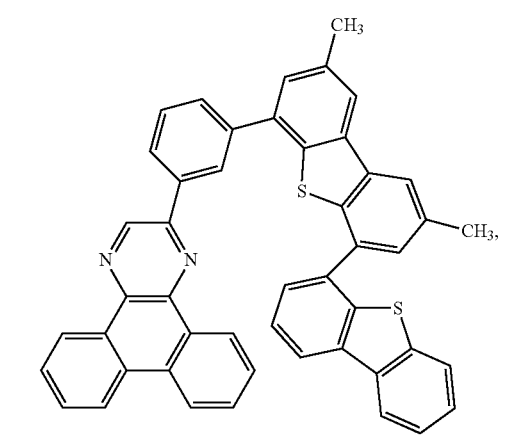
(105)
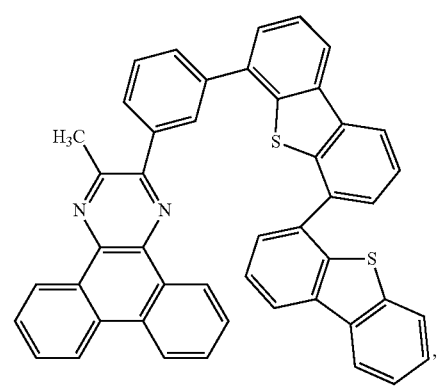
(106)
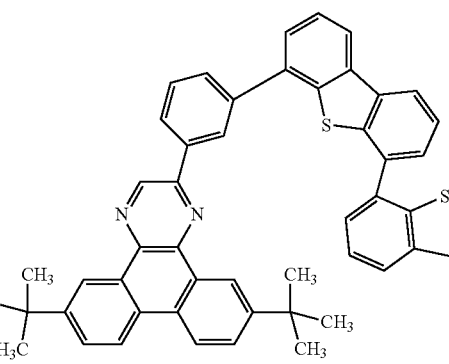
(107)
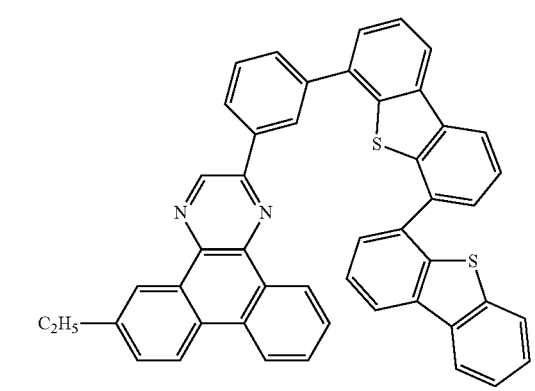
(108)
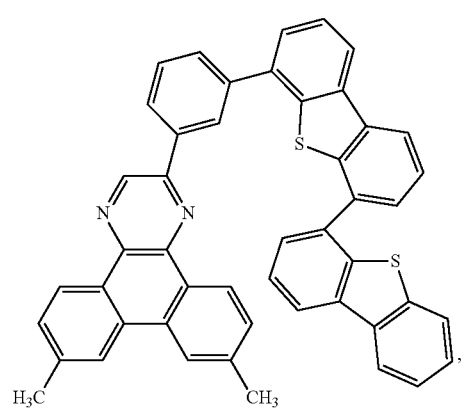
(109)
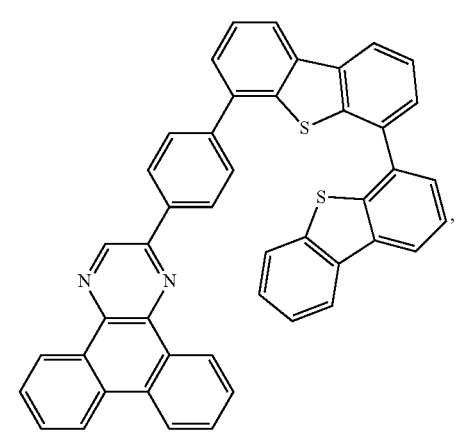
(110)
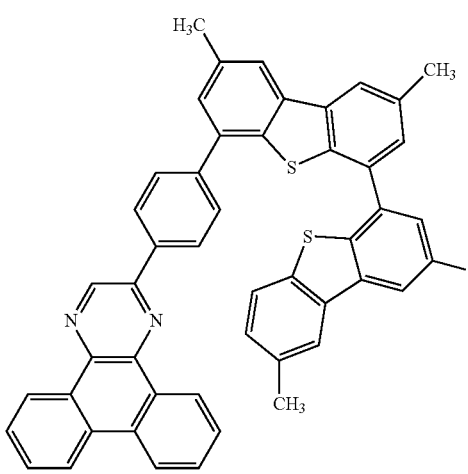
(111)

-continued
(112)
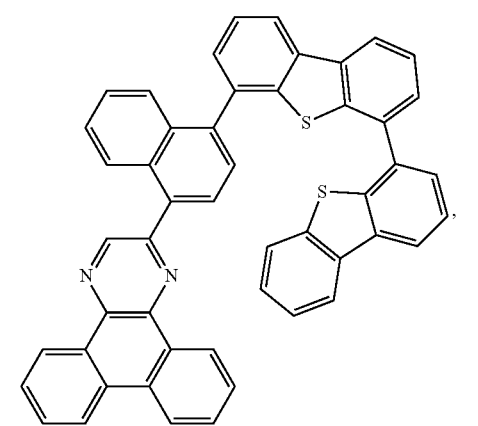
(113)
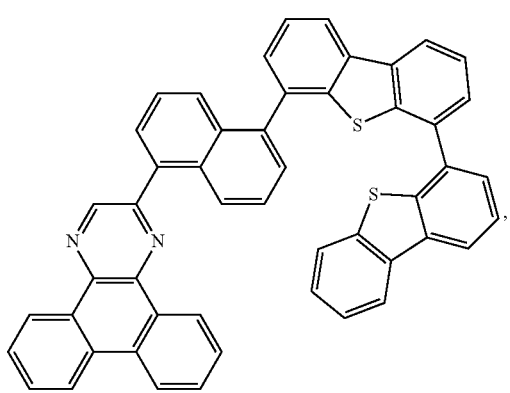
(114)
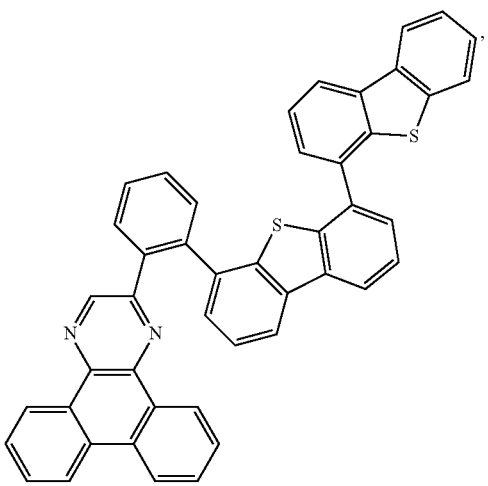
-continued
(115)
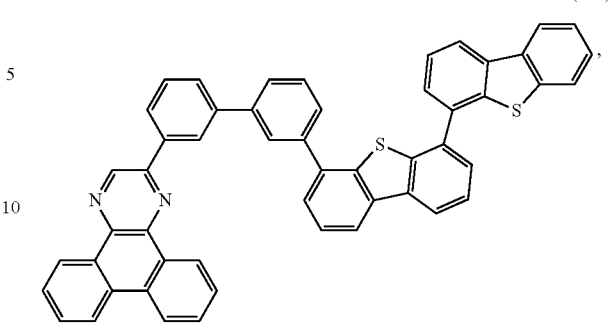
(116)
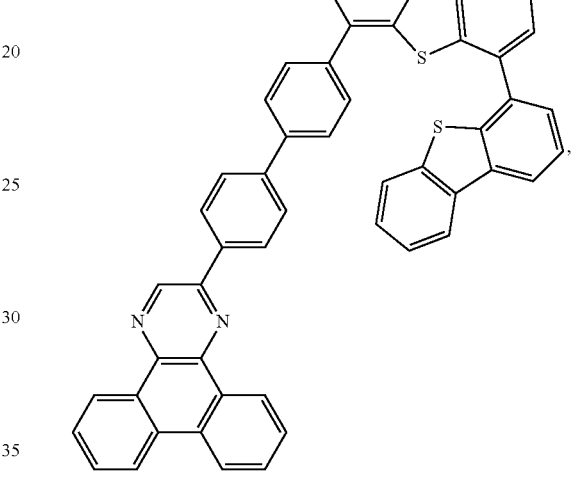
(117)
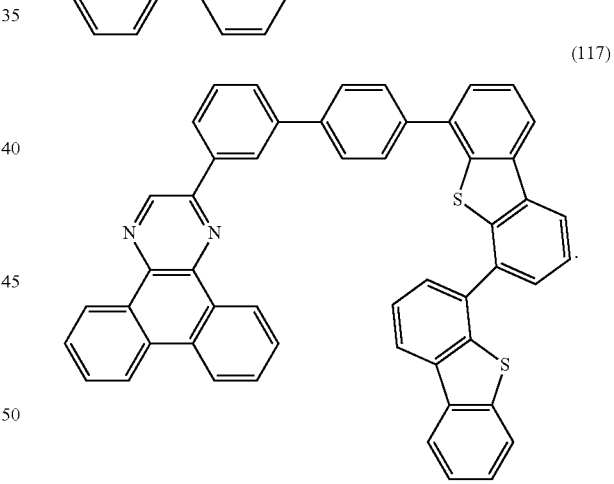
* * * * *